US008723146B2

(12) United States Patent
Dahm et al.

(10) Patent No.: US 8,723,146 B2
(45) Date of Patent: *May 13, 2014

(54) MICRO-CHANNEL-COOLED HIGH HEAT LOAD LIGHT EMITTING DEVICE

(71) Applicant: Fusion UV Systems, Gaithersburg, MD (US)

(72) Inventors: Jonathan S. Dahm, Key Largo, FL (US); Mark Jongewaard, Westminster, CO (US); Geoff Campbell, Broomfield, CO (US)

(73) Assignee: Heraeus Noblelight Fusion UV Inc., Gaithersburg, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/734,253

(22) Filed: Jan. 4, 2013

(65) Prior Publication Data

US 2013/0187063 A1    Jul. 25, 2013

Related U.S. Application Data

(63) Continuation of application No. 13/014,069, filed on Jan. 26, 2011, now Pat. No. 8,378,322.

(60) Provisional application No. 61/336,979, filed on Jan. 27, 2010, provisional application No. 61/341,594, filed on Apr. 1, 2010, provisional application No. 61/456,426, filed on Nov. 5, 2010.

(51) Int. Cl.
*F21V 29/00* (2006.01)
*F21V 7/08* (2006.01)
*H05B 33/00* (2006.01)

(52) U.S. Cl.
USPC ........ 250/494.1; 362/218; 362/230; 362/235; 250/504 R

(58) Field of Classification Search
USPC ......... 250/493.1, 494.1, 496.1, 503.1, 504 R; 362/218, 227, 230, 235
See application file for complete search history.

(56) References Cited

U.S. PATENT DOCUMENTS

| 8,104,911 | B2* | 1/2012 | Hillman et al. | 362/97.3 |
| 8,378,322 | B2* | 2/2013 | Dahm et al. | 250/496.1 |
| 2002/0175984 | A1* | 11/2002 | Ylitalo et al. | 347/102 |
| 2004/0120162 | A1* | 6/2004 | Tsimerman et al. | 362/573 |
| 2005/0152146 | A1* | 7/2005 | Owen et al. | 362/294 |
| 2005/0231918 | A1* | 10/2005 | Goldmann | 361/704 |
| 2006/0050251 | A1* | 3/2006 | Um | 353/102 |
| 2007/0076381 | A1* | 4/2007 | Han et al. | 361/749 |

(Continued)

*Primary Examiner* — Jack Berman
*Assistant Examiner* — David E Smith
(74) *Attorney, Agent, or Firm* — Lowenstein Sandler LLP

(57) ABSTRACT

Micro-channel-cooled UV curing systems and components thereof are provided. According to one embodiment, a lamp head module includes an optical macro-reflector, an array of LEDs and a micro-channel cooler assembly. The array is positioned within the reflector and has a high fill factor and a high aspect ratio. The array provides a high irradiance output beam pattern having a peak irradiance of greater than 25 W/cm$^2$ at a work piece surface at least 1 mm away from an outer surface of a window of the reflector. The micro-channel cooler assembly maintains a substantially isothermal state among p-n junctions of the LEDs at less than or equal to 80° Celsius. The micro-channel cooler assembly also provides a common anode substrate for the array. A thermally efficient electrical connection is formed between the array and the common anode substrate by mounting the array to the micro-channel cooler assembly.

47 Claims, 29 Drawing Sheets

(56) References Cited

U.S. PATENT DOCUMENTS

| | | | |
|---|---|---|---|
| 2007/0146639 A1* | 6/2007 | Conner | 353/20 |
| 2007/0154823 A1* | 7/2007 | Marson et al. | 430/30 |
| 2008/0180900 A1* | 7/2008 | Domitrovits et al. | 361/684 |
| 2009/0040465 A1* | 2/2009 | Conner et al. | 353/20 |
| 2009/0266523 A1* | 10/2009 | Sauer et al. | 165/104.33 |
| 2009/0296345 A1* | 12/2009 | Nguyen et al. | 361/689 |
| 2009/0316104 A1* | 12/2009 | Yang | 349/187 |
| 2010/0176404 A1* | 7/2010 | Wang et al. | 257/88 |
| 2010/0195306 A1* | 8/2010 | Helbing et al. | 362/84 |
| 2011/0140608 A1* | 6/2011 | Marson | 315/127 |

* cited by examiner

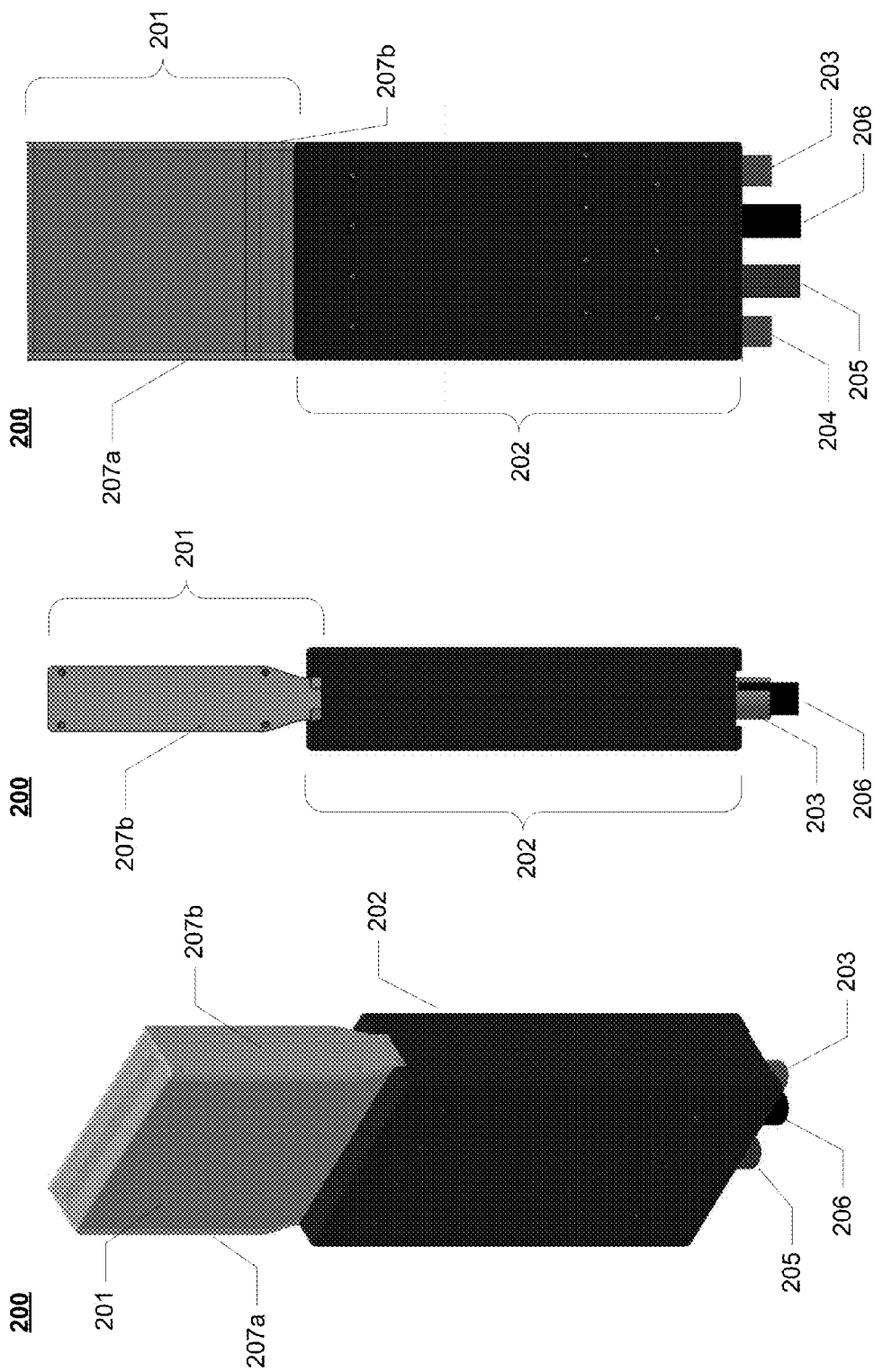

MICRO-CHANNEL-COOLED HIGH HEAT LOAD LIGHT EMITTING DEVICE

CROSS-REFERENCE TO RELATED APPLICATIONS

This application claims the benefit of priority to U.S. Utility patent application Ser. No. 13/014,069, filed on Jan. 26, 2011, now U.S. Pat. No. 8,378,322; U.S. Provisional Patent Application No. 61/336,979, filed on Jan. 27, 2010; U.S. Provisional Patent Application No. 61/341,594, filed on Apr. 1, 2010; and U.S. Provisional Patent Application No. 61/456, 426, filed on Nov. 5, 2010, all of which are hereby incorporated by reference in their entirety for all purposes.

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever. Copyright© 2010-2011, Fusion UV Systems, Inc.

BACKGROUND

1. Field

Embodiments of the present invention generally relate to light emitting diodes (LEDs) on low thermal resistance substrates. In particular, embodiments of the present invention relate to high power density, high fill-factor, micro-channel-cooled ultraviolet (UV) LED lamp head modules that provide high brightness, high irradiance and high energy density.

2. Description of the Related Art

Today's UV LEDs remain relatively inefficient (typically, operating at about 15% efficiency when operated at high current densities). These inefficiencies result in the production of large quantities of waste heat and therefore requiring at least air cooling and often liquid cooling (e.g., heat exchangers and/or chillers) to remove the unwanted waste heat, which is a by-product of the electrical to optical conversion process within the p-n junction of the semiconductor device. If the heat is not removed in a very effective and efficient manner, the LED devices may suffer loss of efficiency, decrease in light output and even catastrophic failure.

Liquid-cooled UV LED lamps (or light engines) are currently being used in a variety of curing applications; however, existing systems have several limitations. For example, while industry literature acknowledges the desirability of high brightness/high irradiance arrays, currently available UV LED lamps provide sub-optimal performance. Existing UV LED lamps generally tend to electrically connect the LEDs within their LED arrays in strings of series-connected LEDs and then parallel these strings together (often with integrated resistors). One drawback to this series-parallel methodology is that the heat sinks usually have to be of a non-electrically conductive nature and/or there needs to be a dielectric layer underneath the LED(s), either of which is traditionally patterned with electrically conductive circuit traces. These traces are expensive and incompatible with thermally efficient ultra-high current operation because of the contact thermal resistance of the layers involved and/or the bulk thermal resistance of the dielectric layer and/or the inherently high electrical resistivity of traces. The heat sinks are also often of expensive ceramic materials such as BeO, SiC, AlN, or alumina. Another disadvantage to the series-parallel LED array model is that a single failure of an LED can lead to the failure of the whole string of seriesed LED(s). This dark area created by a failure in any given chain of LEDs is usually detrimental to the process where the light photo-chemically interacts at the work piece surface.

A specific example of a prior art UV LED array is illustrated in FIGS. 1A and 1B. In this example, which is taken from US Pub. No 2010/0052002 (hereafter "Owen"), an alleged "dense" LED array 100 is depicted for applications purported to require "high optical power density". The array 100 is constructed by forming micro-reflectors 154 within a substrate 152 and mounting an LED 156 within each micro-reflector 154. The LEDs 56 are electrically connected to a power source (not shown) through a lead line 158 to a wire bond pad on substrate 152. The micro-reflectors 154 each include a reflective layer 162 to reflect light produced by the associated LED 156. Notably, despite being characterized as a "dense" LED array, LED array 100 is in reality a very low fill-factor, low brightness, low heat flux array in that the individual LEDs 156 are spaced quite some distance apart having a center-to-center spacing of about 800 microns. At best, it would appear the LEDs account for approximately between 10 to 20% of the surface area of LED array 100 and certainly less than 50%. Such low fill-factor LED arrays can create an uneven irradiance pattern which can lead to uneven curing and visually perceptible anomalies, such as aliasing and pixelation. Additionally, the micro-reflectors 154 fail to capture and control a substantial amount of light by virtue of their low angular extent. Consequently, array 100 produces a low irradiance beam that rapidly loses irradiance as a function of the distance from the reflector 154. It is to be further noted that even optimally configured reflectors would not make up for the low brightness of LED array 100 as the ultimate projected light beam onto the work piece can never be brighter than the source (in this case LED array 100). This is due to the well-known conservation of brightness theorem. Furthermore, Owen also teaches away from the use of macro-reflectors due to their size and the perceived need to have a reflector associated with each individual LED 156.

The aforementioned limitations aside, the relatively large channel liquid cooling technology employed in prior-art cooling designs is not capable of removing waste heat from the LEDs in a manner that would be effective in keeping junction temperatures adequately low when the current per square millimeter exceeds approximately 1.5 amps.

Oxygen inhibition is the competition between ambient oxygen reacting with the cured material at a comparable rate as the chemical cross-linking induced by the UV light and photoinitiator (PhI) interaction. Higher irradiance is known to create thorough cures more rapidly and higher irradiance is known to at least partially address oxygen inhibition issues. Ultra high irradiance is now thought to perhaps overcome oxygen inhibition issues in certain process configurations perhaps even without a nitrogen cover gas. However, to produce ultra high irradiance to overcome oxygen inhibition, the heat flux removal rate needed to keep junction temperatures adequately low in such a high fill-factor LED array environment operating at extremely high current densities and is simply not attainable with currently employed UV LED array architectures and UV LED array cooling technologies.

SUMMARY

Micro-channel-cooled UV curing systems and components thereof are described that are configured for photochemical curing of materials and other high-brightness/high-irradiance applications. According to one embodiment, a lamp head module includes an optical macro-reflector, an array of light emitting diodes (LEDs) and a micro-channel cooler assembly. The optical macro-reflector includes a window having an outer surface. The array is positioned within the optical reflector and has a high fill factor and a high aspect ratio. The array is operable to provide a high irradiance output beam pattern having a peak irradiance of greater than 25 W/cm² at a work piece surface at least 1 mm away from the outer surface of the window of the optical reflector. The micro-channel cooler assembly is operable to maintain a substantially isothermal state among p-n junctions of the LEDs in the array at a temperature of less than or equal to 80° Celsius. The micro-channel cooler assembly also provides a common anode substrate for the array. A thermally efficient electrical connection is formed between the array and the common anode substrate by mounting the array to the micro-channel cooler assembly.

In the aforementioned embodiment, the array may be directly mounted to the micro-channel cooler assembly.

In various of the aforementioned embodiments, the micro-channel cooler assembly may maintain a substantially isothermal state among the p-n junctions at a temperature of substantially less than or equal to 45° Celsius.

In the context of various of the aforementioned embodiments, the LEDs may be electrically paralleled.

In some instances of the aforementioned embodiments, at least one of the LEDs may be an ultraviolet emitting LED.

In various of the aforementioned embodiments, an aspect ratio of a width to a length of the array is substantially between approximately 1:2 to 1:100.

In various of the aforementioned embodiments, an aspect ratio of the width to the length of the array is approximately 1:68.

In the context of various of the aforementioned embodiments, the peak irradiance may be greater than or equal to 100 W/cm² and the work piece surface is at least 2 mm away from the outer surface of the window of the optical reflector.

In various of the aforementioned embodiments, no significant number of the LEDs is connected in series.

In some instances of the aforementioned embodiments, coolant flow through the micro-channel cooler across and underneath the array is configured to be in a direction substantially parallel to a shortest dimension of the array and may additionally be substantially balanced.

In various of the aforementioned embodiments, the lamp head module may include a flex-circuit, operable to individually address the LEDs or groups of the LEDs, bonded to the micro-channel cooler.

In the context of various of the aforementioned embodiments, the micro-channel cooler may be clamped between one or more cathode connectors and one or more anode bus bodies to facilitate factory replaceability.

In various of the aforementioned embodiments, the lamp head module may include integrated LED drivers.

In some instances of the aforementioned embodiments, the optical macro-reflector may be field replaceable.

Other embodiments of the present invention provide an ultraviolet (UV) light emitting diode (LED) curing system including multiple end-to-end serially connected UV LED lamp head modules each including an optical macro-reflector, an LED array and a micro-channel cooler assembly. The optical macro-reflector includes a window having an outer surface. The LED array is positioned within the optical reflector and has a high fill factor and a high aspect ratio. The LED array is operable to provide a substantially uniform high irradiance output beam pattern having an irradiance of greater than 25 W/cm² at a work piece surface at least 1 mm away from the outer surface of the window of the optical reflector. The micro-channel cooler assembly is operable to maintain a substantially isothermal state among p-n junctions of the LEDs in the LED array at a temperature of less than or equal to 80° Celsius. The micro-channel cooler assembly also provides a common anode substrate for the LED array. A thermally efficient electrical connection is formed between the LED array and the common anode substrate by directly mounting the LED array to the micro-channel cooler assembly.

Other features of embodiments of the present invention will be apparent from the accompanying drawings and from the detailed description that follows.

BRIEF DESCRIPTION OF THE DRAWINGS

Embodiments of the present invention are illustrated by way of example, and not by way of limitation, in the figures of the accompanying drawings and in which like reference numerals refer to similar elements and in which:

FIG. 2A is an isometric view of a UV LED lamp head module in accordance with an embodiment of the present invention.

FIG. 2B is a front view of the UV LED lamp head module of FIG. 2A.

FIG. 2C is a side view of the UV LED lamp head module of FIG. 2A.

FIG. 3A is a top-level isometric cut-away view of the UV LED lamp head module of FIG. 2A.

DETAILED DESCRIPTION

Figure 1A:
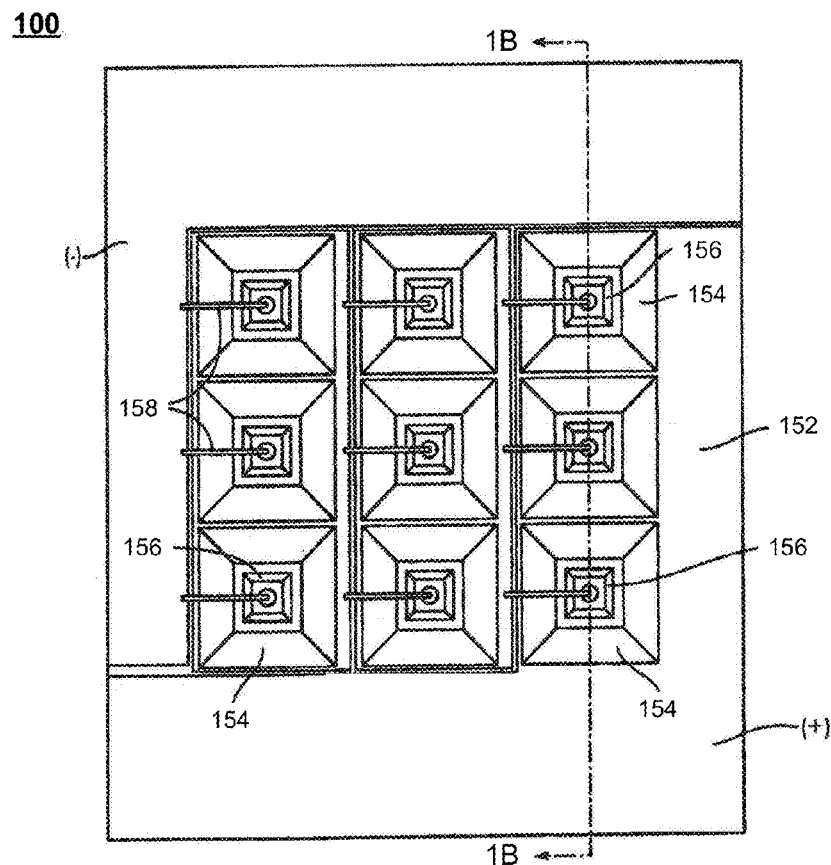
FIG. 1A is a top view of a portion of a prior art LED array.
Figure 1B:
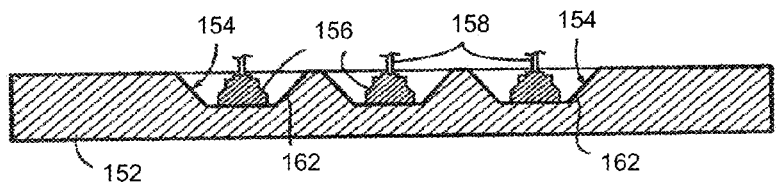
FIG. 1B is a view of the LED array of FIG. 1A taken along section line 1B-1B.

Micro-channel-cooled UV curing systems and components thereof are described that are configured for photochemical curing of materials and other applications requiring high fill-factor, high current density and high-brightness attributes (which ultimately leads to the attribute of high-irradiance). According to one embodiment of the present invention, LEDs of a high fill factor LED array of an ultra high irradiance UV curing system are placed substantially in electrical parallel (a/k/a massively parallel) on a common anode substrate to achieve a very thermally efficient manner of connection (e.g., with no thermally impeding dielectric layer between the base of the LEDs and the substrate as is typically required in a series configuration or a series/parallel configuration).

According to embodiments of the present invention, in order to accommodate the heat flux/thermal demands of a high fill-factor, high current density and high-brightness UV LED lamp head module, practical means to achieve isothermal common anode substrate behavior, even when the common anode substrate has a very high aspect ratio, are also provided. According to one embodiment, an LED array is directly bonded to a micro-channel cooler and the coolant flows across and underneath the LED array in a direction substantially parallel to the shortest dimension of the LED array. In one embodiment, coolant flow through micro-channels running beneath the LEDs is approximately equal (e.g., balanced) so that the p-n junctions of the LEDs of the LED array are substantially isothermal. In one embodiment, the high aspect ratio common anode substrate is substantially isothermal from side to side and end to end. This may be achieved through the use of a preferably substantially copper micro-channel cooler having micro-channels that direct the coolant flow under the LED array in a substantially lateral direction to the longitudinal axis of the LED array, while maintaining a tight flow balance range between each channel. In one embodiment, this flow balance is achieved by designing the primary coolant inlet and exit coolant fluid channels that run parallel to the longitudinal axis of the LED array to reach a level of pressure drop that is nearly homogeneous along their length.

In various embodiments, a flex-circuit, bonded to a micro-channel cooler, is used to individually address LEDs or groups of LEDs of an LED array so that the LEDs may be binned for forward voltage (Vf), wavelength, size, optical power, etc., thereby substantially lowering the demands on the LED manufacturer(s) to supply LED groups in just one or a few bins. This also allows the UV LED lamps of embodiments of the present invention to use multiple bins of LEDs This ability to use multiple bins of LEDs enhances the ability to manufacture UV LED lamps that do not require binning in and of themselves.

In some embodiments, a monolithic micro-channel cooler is employed that is factory replaceable, or otherwise known as a consumable part. As described further below, while the LEDs and flex-circuit may be bonded to the top surface of the micro-channel cooler, and therefore essentially considered to be permanently affixed, the micro-channel cooler assembly is uniquely clamped (e.g., with screws providing the clamping force) between various geometrically configured cathode micro-bus bars and/or connectors (e.g., rectangular, claw and the like) and various geometrically configured preferably monolithic anode bus body (e.g., rectangular, plate and the like), thereby facilitating replaceability.

According to various embodiments of the present invention, the UV LED lamp head module may include integrated LED drivers. In this manner, off the shelf AC/DC power supplies designed for high volume "server farms" may be used and a 12V power cable can be run to the UV LED lamp head module (e.g., UV LED lamp head module 200) rather than remotely performing DC/DC and running a larger diameter (smaller gage) 5V power cable to the UV LED lamp head module. In embodiments in which integrated high power density LED drivers are utilized, they can be mounted to the main lamp body with an intervening thermal conduction compound or monolithic interface material in order to transfer and/or dissipate the waste heat from the driver assemblies into the body where the waste heat is carried off by the same coolant flow that cools the LED array.

In some embodiments, factory and/or field replaceable macro-reflectors are employed, which may be customized for particular applications by providing different performance characteristics (e.g., high-irradiance, highly focused; short working distances to focused, long working distances; applications requiring large depth of focus while maintaining high-irradiance; and very wide-angle, more uniform irradiance applications).

In the following description, numerous specific details are set forth in order to provide a thorough understanding of embodiments of the present invention. It will be apparent, however, to one skilled in the art that embodiments of the present invention may be practiced without some of these specific details.

Notably, while embodiments of the present invention may be described in the context of UV LED systems, embodiments of the present invention are not so limited. For example, visible and IR applications are contemplated and would benefit from the architectural improvements described herein. Also, varying wavelengths can be used within the same light emitting device lamp to mimic the output of mercury lamps by using UV A, B or C light emitting devices and visible and/or IR light emitting devices. The high fill-factor characteristic of embodiments of the present invention also enables inter-disbursement of the various wavelengths while avoiding pixelation effects on the work piece surface which would likely result in deleterious process effects. Further, in accordance with various embodiments, the wavelength mixing within the macro-non-imaging-optical reflectors result in a uniform (non-pixelated) output beam from both a power density and wavelength mixing standpoint.

For sake of brevity, embodiments of the present invention may be described in the context of LEDs having the anode side on the bottom, those of ordinary skill in the art will recognize that the anode side could be on the top surface and/or both anode and cathode contacts could be on the top or the bottom. As such, references to anodic/cathodic structures herein could be or could be reversed (or could be electrically neutral) depending upon the particular implementation. Similarly, flip chip no wire bond LEDs, conductive substrate and non-conductive substrate LED chips (such as those with the EPI layer on sapphire, aluminum nitride, silicon or zinc oxide), arrays and/or packaged devices may be considered. The EPI layer could be selected from the group of nitrides, oxides, silicon, carbides, phosphides, arsenides, etc.).

Terminology

Brief definitions of terms used throughout this application are given below.

The phrase "average irradiance" generally refers to the irradiance value across a width of an output beam pattern projected on a work piece wherein the irradiance value falls to essentially zero on each side of the output beam pattern. In embodiments of the present invention, at 2 mm from the window, a UV LED lamp head module produces average irradiance of approximately 32 W/cm$^2$ (range 40-80 W/cm$^2$). In embodiments of the present invention, at 53 mm from the window, a UV LED lamp head module produces average irradiance of approximately 6 W/cm$^2$ (range 8-15 W/cm$^2$).

The terms "connected," "coupled," "mounted" and related terms are used in an operational sense and are not necessarily limited to a direct connection, coupling or mounting.

The phrase "diffusion bonding" generally refers to a method of joining metals similar to welding, but relies only on the surface diffusing into one another as a means of "welding." For example a diffusion bonding process may bond layers of usually substantially similar materials by clamping them together, sometimes with an oxidation inhibiting plating such as nickel, and subjecting the layers to extremely high temperatures of around 1,000 degrees C. (range 500-5,000 degrees C.), and thereby molecularly intermixing the surfaces and forming a substantially monolithic material wherein the grains are intermixed and often the bond-line is substantially indistinguishable from the bulk material, and the properties of the diffusion bonded materials do not differ substantially from bulk non-diffusion bonded materials in terms of thermal conductivity and strength. Diffusion bonding could have some similarities to sintering. Thin layers of silver plating on the order of microns may also be employed to facilitate the ease of bonding of the layers. This later process may have some similarities to soldering.

The phrase "directly mounted" generally refers to a mounting in which no substantial intervening and/or thermally impeding layer is introduced the two things being attached or affixed. In one embodiment, an LED array is mounted to a common anode substrate provided by a surface of a microchannel cooler with a thin solder layer. This is an example of what is intended to be encompassed by the phrase "directly mounted." So, the LED array would be considered to be directly mounted to the common anode substrate. Examples of thermally impeding layers would include bulk substrate material, foil, thin-film (dielectric or conducting), or other material (other than a thin solder layer) introduced between the two things being attached or affixed.

The phrase "high irradiance" generally refers to an irradiance of greater than 4 W/cm$^2$. According to embodiments of the present invention, peak irradiance levels achievable are approximately ten times the levels of current state-of-the-art UV LED curing systems while maintaining both high efficiency and long life of the LEDs. As described further below, in accordance with various embodiments, the irradiance on the work piece is substantially devoid of deleterious pixelation and/or gaps found in current UV LED curing systems. Meanwhile, it is to be noted most UV LED lamp manufacturers measure peak irradiance at the window, whereas in various embodiments described herein it is measured at the work piece surface. Measurements at the window are essentially meaningless as the work piece is not typically located at the window.

The phrase "high fill-factor LED array" generally refers to an LED array in which the LEDs are closely spaced and exceed 50% (often exceeding 90%) of the surface area of the LED array. In one embodiment of the present invention, LEDs within LED arrays are spaced less than 20 microns edge-to-edge and in some instances 10 microns edge-to-edge, with a range of edge-to-edge distances from 1-100 microns (zero micron spacing could be considered for a completely monolithic LED). Both inorganic as well as substantially organic LEDs are contemplated.

The phrases "in one embodiment," "according to one embodiment," and the like generally mean the particular feature, structure, or characteristic following the phrase is included in at least one embodiment of the present invention, and may be included in more than one embodiment of the present invention. Importantly, such phases do not necessarily refer to the same embodiment.

The term "irradiance" generally refers to the radiant power arriving at a surface per unit area (e.g., watts or milliwatts per square centimeter (W/cm$^2$ or mW/cm$^2$).

The phrase "light emitting device" generally refers to one or more light emitting diodes (LEDs) (emitting substantially incoherent light) and/or laser diodes (emitting substantially coherent light) whether they be edge emitters or surface emitters. In various embodiments of the present invention, light emitting devices may be packaged or bare dies. A packaged die refers to a device that not only consists of the bare die, but usually also consists of a substrate to which the die is mounted (usually soldered) to facilitate the traces for electrical in and out current paths, as well as thermal paths, and usually a means for attaching a lens and/or reflectors, an example of which would be the Lexeon Rebel available from Philips, USA. According to one embodiment, bare light emitting device dies (i.e., dies excised directly from wafers that have epitaxial grown p-n junctions) are bonded (usually soldered) directly (without an additional significantly thermally impeding layer) to at least one diffusion bonded layer of a high thermal conductivity material (selected from the group of copper, Glidcop, BeO, AlN, Al$_2$O$_3$, Al, Au, Ag, graphite, diamond and the like), which is in itself, in various embodiments of the present invention, usually a layer of a multi-layer laminate forming a monolithic diffusion bonded micro-channel cooler structure. The laminate does not necessarily have to be diffusion bonded as the bonding process could be selected from soldering, brazing, gluing, etc.

The phrase "light emitting diode" or the acronym "LED" generally refer to a semiconductor device containing a p-n junction (the junction between a p-type semiconductor and an n-type semiconductor) designed to emit specific narrow band wavelengths within the electromagnetic spectrum via a process known as electroluminescence. In one embodiment, an LED emits incoherent light.

The phrase "low fill-factor LED array" generally refers to an LED array in which the LEDs are sparsely arranged and do not exceed approximately 50% of the surface area of the LED array.

The phrase "low irradiance" generally refers to an irradiance of around 20 W/cm² or less. UV LED systems rated at less than 4 W/cm² are not typically sufficient for most curing applications other than pinning (e.g., ink setting).

The term "macro-reflector" generally refers to a reflector having a height of greater than or equal to 5 mm. In some embodiments, macro-reflectors may range from 5 mm to over 100 mm.

If the specification states a component or feature "may", "can", "could", or "might" be included or have a characteristic, that particular component or feature is not required to be included or have the characteristic.

The phrase "peak irradiance" generally refers to the maximum irradiance value across a width of an output beam pattern projected on a work piece. In embodiments of the present invention, at 2 mm from the window, a UV LED lamp head module can achieve a peak irradiance of approximately 84 W/cm² (range 50-100 W/cm²). In embodiments of the present invention, at 53 mm from the window, a UV LED lamp head module can achieve a peak irradiance of approximately 24 W/cm² (range 10-50 W/cm²).

The phrases "radiant energy density," "total output power density" or "energy density" generally refer to the energy arriving at a surface per unit area (e.g., joules or millijoules per square centimeter (J/cm² or mJ/cm²)).

The term "responsive" includes completely or partially responsive.

The phrase "total output power" generally refers to the aggregate power in W/cm of output beam pattern length. According to one embodiment, at 2 mm from the window, total output power of approximately 20.5 W per cm of output beam pattern length is produced by each UV LED lamp head module. According to one embodiment, at 53 mm from the window, total output power of approximately 21.7 W per cm of output beam pattern length is produced by each UV LED lamp head module.

The phrase "ultra high irradiance" generally refers to an irradiance of greater than 50 W/cm² at a work piece. In one embodiment, a UV LED lamp head module can achieve peak irradiance of greater than 100 W/cm² at short working distances (e.g., ~2 mm). In view of rapidly advancing power output and efficiency of LEDs, it is reasonable to expect peak irradiances achievable to improve by more than an order of magnitude in the coming decades. As such, some of today's high irradiance applications will be accomplished with air-cooled LED arrays and others will take advantage of or be enabled by these higher irradiances for faster, harder or more complete cures and/or use less photoinitiator. Also unique in the context of various embodiments of the present invention is the ability to provide both ultra high peak irradiance, ultra high average irradiance, ultra high total irradiance (dose) and concentration of the dose (as compared to the prior art) that is delivered to the work piece.

The phrase "UV curing process" generally refers to a process in which a photoinitiator (PhI) will absorb UV light first, causing it to go in to an excited state. From the excited state, PhI will decompose into free radicals, which then starts a photo polymerization. However, there is always some amount of oxygen (1-2 mM) in the UV curable formulation. Therefore, the initial free radicals from PhI photo-decomposition will react with oxygen first, instead of reacting with the monomer's double bond of (typically an acrylate), because the reaction rate of PhI free radical with oxygen is about 105 to 106 faster than that of the acylate double bonds. Furthermore, at very early stages of UV curing, oxygen in air will also diffuse into the cured film and also react with the PhI, which results in major oxygen inhibition. Only after the oxygen in UV curable film is consumed can photo-initiated polymerization take place. Therefore, in order to overcome oxygen inhibition, a large amount of free radicals are required at surface of the cured film within a very short period of time; i.e. a high intensity UV light source is required. The absorption of the UV light intensity for a particular formulation depends on the UV light wavelength. Mathematically, the absorbed UV light intensity (Ia) is given by Ia=I0×[PhI], where I0 is a UV light intensity from UV light source and [PhI] is photoinitiator concentration. At the same [PhI] levels, increasing I0 will increase Ia and thereby reduce oxygen inhibition. Stated another way, by using a high I0 light source less [PhI] can be used, which is typically the most expensive portion of the formulation. The absorption of UV light follows the well-known Lambert-Beer Law: A (absorption)=$\epsilon$ cd, where $\epsilon$ is the PhI extinction or absorption coefficient, c is the concentration of PhI and d is the thickness of the sample (film to be cured). As seen from the below table, the efficiency of PhI light absorption varies greatly with wavelength. In this case, at 254 nm, the efficiency of absorbing light is 20 times higher than that at 405 nm. Therefore, if the UV LED light intensity at 400 nm can be provided at 100 times typical curing powers at shorter wavelengths (~100 W/cm²), the photoinitiator's efficiency difference in absorption of light can reduce oxygen inhibition.

1.95×104 at 254 nm,
1.8×104 at 302 nm,
1.5×104 at 313 nm,
2.3×103 at 365 nm,
8.99×102 at 405 nm;

FIGS. 2A-C provide isometric, front and side views, respectively, of an ultra-high brightness UV LED lamp head module 200 in accordance with an embodiment of the present invention. According to one embodiment, ultra-high brightness UV LED lamp head module 200 produces ultra-high irradiance. Ultra-high brightness UV LED lamp head module 200 may be used to, among other things, photo polymerize, or cure inks, coatings, adhesives and the like. Depending upon the application, a UV curing system (LED UV emitting system) (not shown) may be formed comprising one or more UV LED lamp head modules 200 and other components, including, but not limited to, LED drivers (internal or external to the UV LED lamp head module 200), one or more cooling systems, one or more main AC/DC power supply systems (e.g., available from Lineage USA or Power-One, USA, which are approximately 90% (or more) efficient and weighing about 1 kg.), one or more control modules, one or more cables and one or more connectors (not shown).

According to one embodiment, the high brightness of UV LED lamp head module 200 allows a range of possible optical properties of the output beam (not shown) including: narrow width (e.g., ~0.65 cm (range 0.1 to 2 cm)) with high power density (e.g., ~20.5 W per cm of output beam pattern length (range 10-30 W)), wider widths (e.g., ~3.65 cm (range 3 to 10 cm) with greater depth of focus, or short or long working distances (with or without greater depth of focus), or even very wide angle/large area beam output patterns (with or without greater depth of focus). Output beam patterns with homogenous irradiance across the width of the beam (as well as the length of the beam) pattern may be considered.

As discussed further below, according to embodiments of the present invention, the high brightness results from a high fill-factor (in excess of 50%, and often in excess of 90%) LED array (not shown) and the LED array being operated at high electrical power densities, which results in a high irradiance output beam. The high electrical power densities result in high thermal densities (due to electrical to optical conversion loses) that are effectively managed via various novel methodologies that are described in detail below.

Ultimately, the UV LED lamp head module 200 is intended to replace not only the current state-of-the-art UV LED lamps, but also the current state-of-the-art mercury lamps, due to the uniquely high irradiance and flexible optical output beam properties that a high brightness source allows. UV LED lamp head module 200 is also considered to be a "green technology" as it contains no mercury, and is also electrically very efficient. This efficiency is partly derived from the inherent efficiency of LEDs compared to mercury containing lamps, but also derived in part from cooling methodologies, which are described below, that provide for very low thermal resistance between the LED junctions and the cooling fluid (introduced into the UV LED lamp head module 200 via inlet cooling tube 203 and evacuated from the UV LED lamp head module 200 via outlet cooling tube 204), thereby creating low junction temperatures that are needed for highly efficient operation of LED devices.

In this depiction, a housing 202 and a reflector 201 of the UV LED lamp head module 200 are illustrated. According to various embodiments, the housing 202 of the UV LED lamp head module 200 is approximately 80 mm in length×38 mm in width×125 mm in height. The length of the novel easily swappable and field-replaceable reflector 201 that is chosen for a given application would be substantially in the range of tens to hundreds of millimeters in length, but such reflectors are typically about 100 mm in length, and provide working distances in the range of 0-1000 mm, but typically 2 mm to 53 mm.

According to embodiments of the present invention, UV LED lamp head module 200 is designed to be used stand alone or serially in combination with one or more other UV LED lamp head modules. As described further below, multiple UV LED lamp head modules 200 are easily configured serially in length from one head (module) (e.g., 80 mm), to perhaps 100 heads (modules), for example, with a length of 8,000 mm. Multiple UV LED lamp head modules 200 could also be configured serially in width. According to one embodiment, a unique feature of a length-wise serial combination of UV LED lamp head modules 200 is that the output beam does not contain a substantially discernable loss of irradiance at each interface point at which the heads (modules) are butted up against each other serially end-to-end to make a long output beam pattern at the work piece surface even in short working distance (e.g., ~2 mm) applications.

As described in further detail below, in one embodiment, reflector 201 is factory swappable and preferably also field replaceable. The reflector 201 may be machined from aluminum and polished, cast, extruded metallic or polymer, etc., or injection molded. The reflector 201 could have silver coatings and could have a dielectric stack of coatings. The reflector 201 could have a single layer protective dielectric coating using deposition processes (e.g., ALD, CVD, sputtering, evaporation, sol-gel). The reflector 201 could be mechanically or electrolytically polished. It is contemplated that multiple UV LED lamp head modules 200 may often need to be placed end-to-end in long length applications, like wide-format printing. In these cases, it is desirable that the projected and/or focused beam created by the reflector 201 has nearly uniform irradiance along the entire beam path, especially in the areas between the end-to-end configured UV LED lamp head modules 200 and/or LED arrays, so that the coatings, inks, adhesives, etc. of the work piece are uniformly cured. It should be noted that due to the high irradiances provided by embodiments of the present invention coating and inks, etc. may have substantially less photoinitiator in them or essentially no photoinitiator and cure in a similar matter to E-beam in that electromagnetic energy is supplied in a sufficient dose to cure the material without the aid of any appreciable photoinitiator.

In various embodiments, the irradiance of the UV LED lamp head module 200 can be in excess of 100 W/cm2 in short working distance (e.g., ~2 mm) applications, such as inkjet printing, to in excess of 25 W/cm2 in long working distance (e.g., 50 mm+) applications, such as clear coat curing. According to one embodiment, the beam widths can vary, to meet a variety of applications and operating conditions, from around 1 mm wide to 100 mm wide or more, and the length, as stated previously can be as short as the width of one head (module) (e.g., 80 mm) to as long as 100 heads (modules) (e.g., 8,000 mm) or more. It should be noted that the length of the beam could be shorter than the length of the UV LED lamp head module 200 if focusing reflectors or optics were so employed to affect this beam shape. External refractive or defractive optics are also contemplated. Depending upon the particular implementation, the length of the UV LED lamp head module 200 could range from tens to hundreds of millimeters in length. The LEDs could range from approximately 0.3 $mm^2$ to 4 $mm^2$ or more and they could be rectangular, oriented in single long rows, multiple long rows or monolithic.

According to embodiments of the present invention, the efficiency of the LED array 330 is usually well in excess of 10-20%, and the overall system efficiency (including heat exchanger or chiller, pump, and power supply losses, is usually well in excess of 5-10%).

Returning briefly to the inlet cooling tube 203 and the outlet cooling tube 204, these may constructed of, for example, extruded polyurethane, vinyl, PVC (available from Hudson Extrusions, USA) and the like and could be ~5/16 inch ID and ~7/16 inch OD. In one embodiment, the tubes 203 and 204 are of a polyurethane with high tensile strength and low moisture absorption. Tube fittings available from Swagelok, USA may be employed or fittings from John Guest, USA. Depending upon the usage environment, it may be preferable to use more than one inlet cooling tube 203 and outlet cooling tube 204, such as perhaps ~4 smaller inlet lines and ~4 smaller outlet lines (not shown). This may make for a less cumbersome unit with smaller bend radiuses and may allow slightly more evenly distributed coolant flow through the micro-channel cooler (not shown); however, the deep main inlet and outlet channels (not shown) within the UV LED lamp head module 200 essentially eliminate pressure gradients at the point of entrance to and exit from the preferable micro-channel cooler channels (not shown). In one embodiment, coolant enters the UV LED lamp head module 200 via inlet cooling tube 203 at between 1-100 PSI and preferably between approximately 15-20 PSI at a temperature of between about 5-50 degrees Celsius (C) and preferably at about 20 degrees C. and exits via outlet cooling tube 204 at a temperature of between about 10-100 degrees C. and preferably at approximately 24 degrees C.

According to one embodiment, waste heat from various internal components (e.g., LED driver PCBs and LED array) of the UV curing system may be dissipated into the lamp body (not shown) and carried away by coolant flow to a heat exchanger and/or a chiller. An exemplary chiller is available from Whaley, USA. In one embodiment, the chiller utilizes a highly efficient scroll compressor (available from Emmerson, USA). Depending upon the usage model, the chiller may be of the "split" variety in which the reservoir, pump, evaporator and controls are located inside a building housing the UV curing system, and the rest of the components, such as scroll compressor, fan, condenser, etc. are located outside the building (e.g., on the roof or on the side of the building). It should be noted that many or all of the chiller or heat exchanger components may be operated in series or parallel or a combination of both for one or more UV LED lamp head modules 200 and/or supply components. By way of example, one large chiller could be employed for multiple UV curing systems that may have one or more pumps and or reservoirs. An exemplary heat exchanger element for water to air is available from Lytron, USA. Any cooling solution could use a bypass arrangement so that differing pressure or flow rates could go through the evaporator and the micro-channel-cooler simultaneously.

According to one embodiment, the cooling liquid (coolant) comprises water. The coolant may also contain one or more bio-fouling inhibitors, anti-fungicides, corrosion inhibitors, anti-freezing materials (e.g., glycol) and/or nano particles (e.g., alumina, diamond, ceramic, metal (e.g., nano copper), polymer, or some combination) for enhanced heat transfer, and the coolant system could contain membrane contractors, oxygen getters and micron filters. Nano particles, such as titania, excited by UV lamp energy for the dual purpose of enhancing thermal conductivity and/or heat transfer and due to the resulting Photo-Fenton process the elimination of biological materials, such as funguses and the like. Membrane contractors effectively reduce $CO_2$ in the water and help to maintain optimal pH for optimal corrosion resistance of copper micro-channel surfaces.

In one embodiment, a sliding vane pump (available from Fluidotech, Italy) may be employed. It has a flow rate of greater than ~4 GPM and pressure as high as ~60 PSI. This flow rate is well-suited for the micro-channel cooler architecture described in connection with various embodiments of the present invention (e.g., serial connection of 4 or more 80 mm UV LED lamp head modules 200). The pump also is very quiet, compact, long lasting, and efficient, as it only consumes ~0.25 KW. In various embodiments, redundant coolant pumps may be employed to reduce opportunities for a single point of failure. Average flow rate may be approximately 0.75 GPM (range 0.1 to 10 GPM) per lamp head.

Figure 3A:
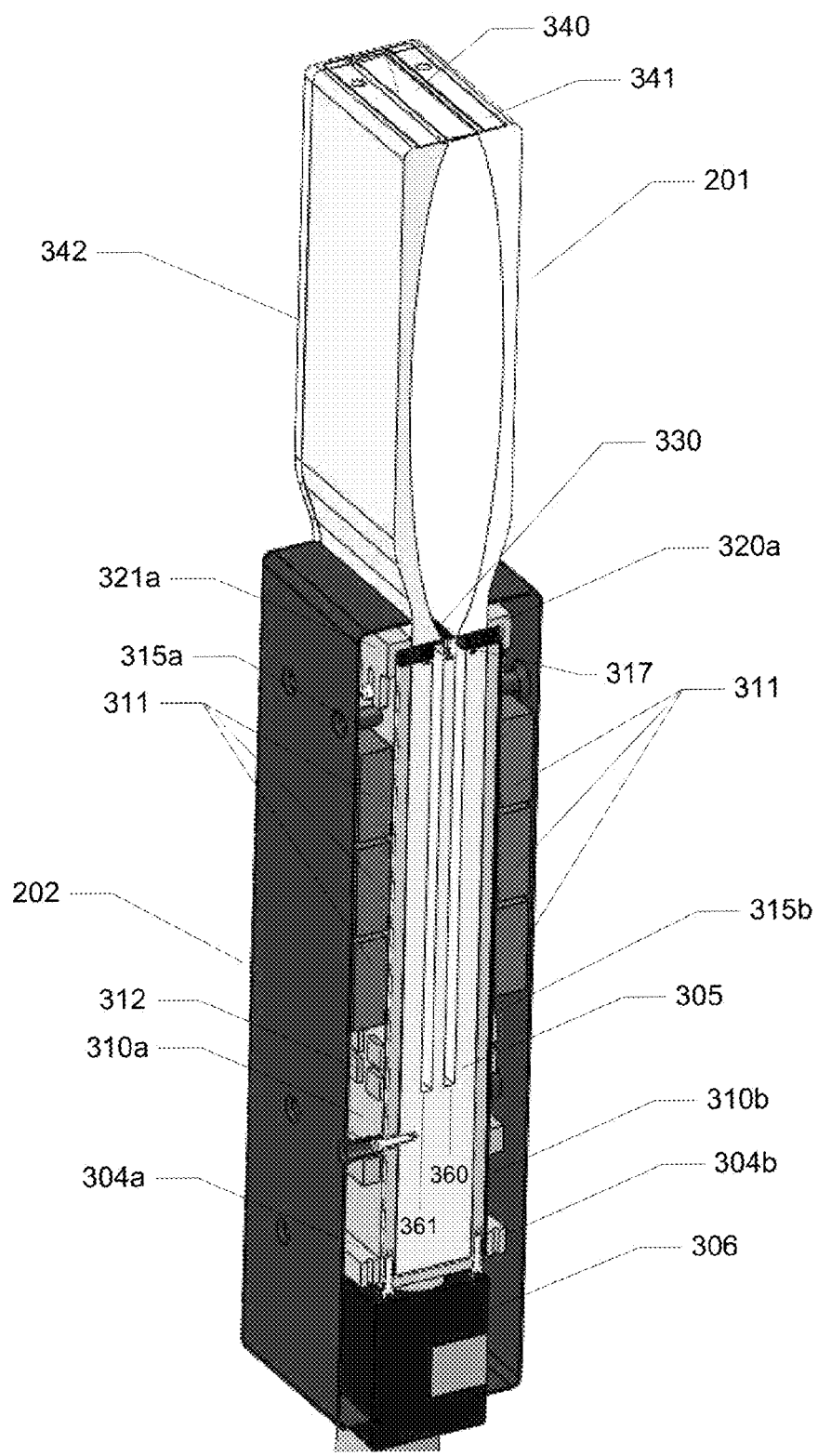
FIG. 3A is a top-level isometric cut-away view of the UV LED lamp head module of FIGS. 2A-C.
Figure 3B:
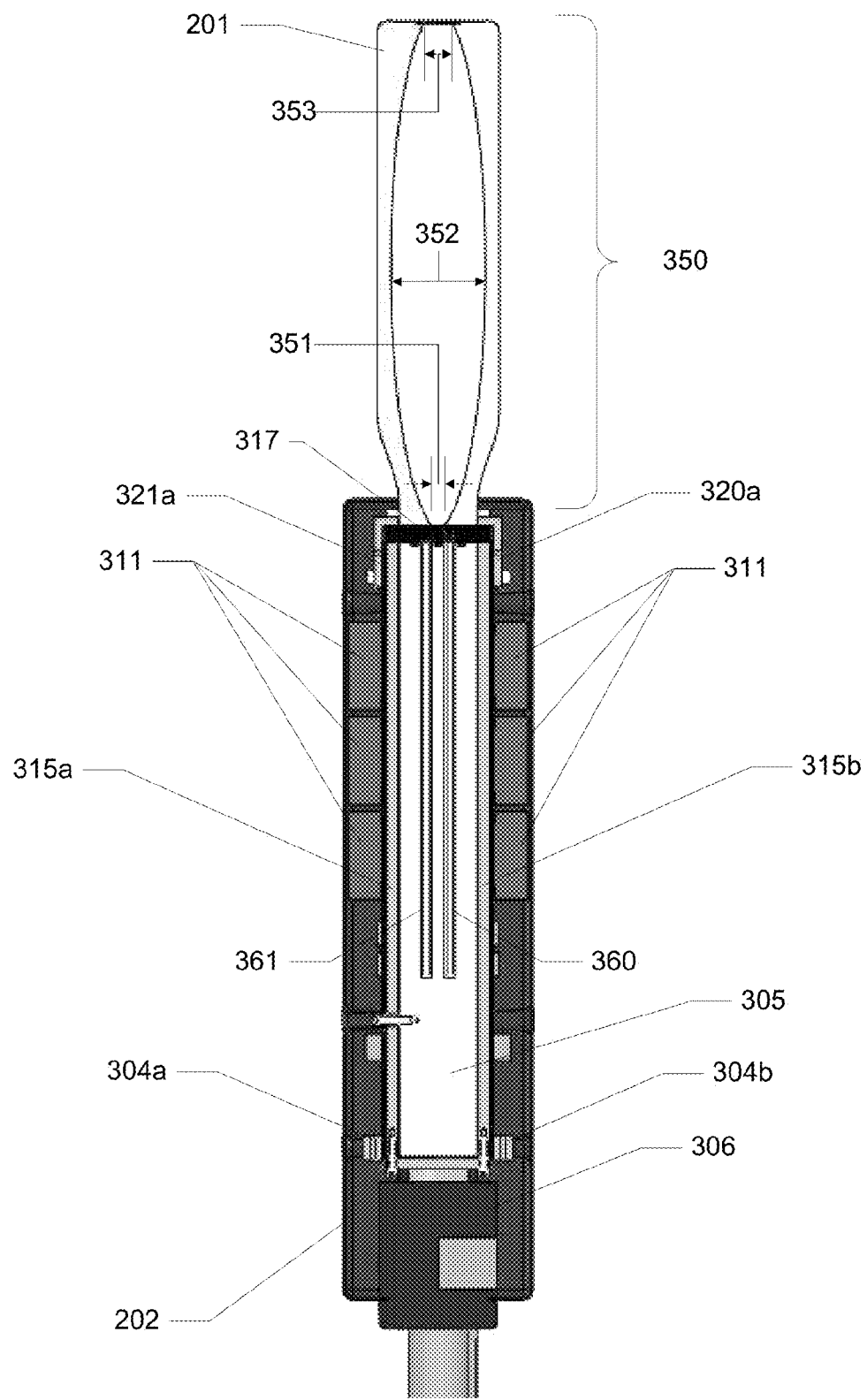
FIG. 3B is a top-level front cut-away view of the UV LED lamp head module of FIG. 2A.

FIGS. 3A-B provide cut-away views of the UV LED lamp head module 200 of FIG. 2A. From these views, it can be seen that an optical reflector layer 350 comprising reflector 201 is mounted to a body 305 enclosed within housing 202. According to one embodiment, body 305 is constructed from copper or a dielectric polymer material (e.g., PEEK; Torlon; LCP; acrylic; polycarbonate; PPS potentially filled with fillers, such as graphite, ceramic, metals, carbon, carbon nanotubes, graphene, nano-sized or micron-sized flakes, tubes, fibers, etc.). Some of these filled resins are available from Cool Polymers of North Kingstown, R.I. The lamp body 305 may be machined with 5-axis milling or injection molded. Alternatively, body 305 may be injection molded and optionally secondarily milled or drilled. As described further below, various components may be mounted directly or indirectly to the body 305, including, but not limited to, the housing 202, the reflector 201, an LED array 330, the micro-channel cooler (preferably forming part of the common anode substrate for the LED array 330), cathode claws 321 and anode bus body 315a-b, and one or more LED driver printed circuit boards (PCBs) 310, which are preferably metal core PCBs (MCPCBs) and the anode bus body 315a-b may serve as the metal core of the MCPCBs (a/k/a common anode back plane).

In the present non-limiting example, body 305 has formed therein a main inlet lamp body lamp body cooling fluid channel 360 and a main outlet lamp body cooling fluid channel 361 both of which run the length of body 305. The main inlet lamp body cooling fluid channel 360 is in fluid communication with the inlet cooling tube 203 via a first coolant inlet (not shown) formed in the base of the body 305. The main outlet lamp body cooling fluid channel 361 is in fluid communication with the outlet cooling tube 204 via a second coolant inlet (not shown) formed in the base of the body 305. The channels 360 and 361 are sized such that coolant flows substantially uniformly through a micro-channel cooler (not shown) disposed there between. In one embodiment, the first and second coolant inlets may be on opposite ends of the base of the body 305, across from each other, staggered, or some combination thereof to facilitate equal and uniform flow of coolant from the main inlet lamp body cooling fluid channel 360 to the main outlet lamp body cooling fluid channel 361 through the micro-channel cooler. In alternative embodiments, multiple inlet lamp body cooling fluid channels and multiple outlet lamp body cooling fluid channels may be used.

In one embodiment, flow balance through the micro-channel cooler is achieved by designing the primary coolant inlet and exit manifold channels that run parallel to the longitudinal axis of the LED array 330 to reach a level of pressure drop that is nearly homogeneous along their length by extending the channel depth to a point that the coolant pressure differential near the top of the channel (nearest the micro-channel cooler (not shown)) has reached a point of near homeostasis along the entire length of the channel by spreading out from the inlet port, or converging to the exit port by way of a very deep channel. In other words, the exceedingly deep channels 360 and 361 give the coolant sufficient time, hydraulic resistance and surface drag to spread out along the length of the micro-channel cooler and achieve a small pressure differential near the top of each channel therein resulting in balanced flow through each micro-channel under the LED array 330.

According to one embodiment, sub-assembly components of the LED driver PCBs 310, include, but are not limited to, LED driver controller ICs (not shown, which could also be part of a DC/DC converter system), FETs 312, gates (not shown), inductors 311, capacitors (not shown), resistors (not shown) and cathode bus bars 304a-b. As indicated above, in one embodiment, the LED driver PCBs 310 are multi-layer metal foil (e.g., copper)/dielectric layers on a metal (core) substrate (e.g., MCPCB) (available from Cofan, Canada) and are coupled (e.g., affixed via screws) to the body 305 with an intervening thermal conduction compound in order to dissipate the waste heat from the driver assemblies into the body 305 where it is carried off by the coolant flow through the main inlet lamp body cooling fluid channel 360 and the main outlet lamp body cooling fluid channel 361. In the present example, the channels 360 and 361 extend deep enough in the body 305 to provide cooling to the area substantially under the FETs 312 and inductors 311, where a significant amount of waste heat is generated. Vias may be used to electrically connect the multi-layer metal foil layers.

In one embodiment, LED driver assembly PCBs 310a-b, containing surface mount electrical components and other semiconductor components are at least 90% efficient. Exemplary high current capable and efficient LED driver ICs (not shown) are available from National Semiconductor USA (e.g., part LM 3434 or LM 3433 or a substantially equivalent). Linear and Maxim, USA also make similar parts. LED driver ICs (not shown) are semiconductor junction p-n containing devices, preferably silicon based, that allow the buck conversion of a higher voltage/lower current input to be converted to a lower voltage and higher current amenable to the high current LED driving conditions desired in various embodiments of the present invention. PWM may be employed.

Individual LEDs or groups of LEDs of the LED array 330 are driven by corresponding segments of LED driver PCBs 310a-b. For example, 4 groups of 17 LEDs per side of the UV LED lamp head module 200 driven at approximately 3 A (range 0.5 to 30 A) per LED and approximately 4.5-5V (range 2-10V). In such an embodiment, the LED array 330 comprises 68 LEDs in 2 rows of LEDs (136 total), with opposite LED groups electrically driven and/or controlled by corresponding LED driver ICs at around 3 A per LED resulting in an approximately 2 kW input per UV LED lamp head module 200. Another non-limiting example would be 16 LEDs in 15 groups×2, which may be driven at approximately 4 V and 40 A per group (range 1-10V and 1-500 A) and have an input of only approximately 12 V into the LED driver PCBs 310a-b.

In some embodiments, due to the high efficiency of the surface mount electrical components and other semiconductor components, custom metal core PCBs (MCPCBs) can be constructed such that they may be affixed, preferably with screws or other means, to the sides of the body 305, and be conduction cooled through the interface material and into the thermally conductive body 305. The waste heat ultimately being removed by the convective transport of the coolant flow through the body 305. For example, two LED driver PCBs 310a-b, one on each side of the body 305, may be constructed on a 2.5 mm (range 0.1-10 mm) thick copper core board that has approximately 4-12 mil thermally conductive dielectric material layers (available from Thermagon USA and/or Cofan, Canada). In one embodiment, highly thermally conductive dielectric layers are interposed between copper metal layers (e.g., 1-4 oz copper foil layers) of the LED driver PCBs 310a-b, which are affixed to body 305. Each LED driver PCB 310a-b (e.g., ×2) may have 4 electrically isolated cathodic segments corresponding to the locations of the 4 groups of LEDs isolated by flex-circuit sections (4 of which are shown in the cut-away exploded view of FIG. 6—two of which are driven by opposing LED driver PCBs 310a-b). In one embodiment, the LED driver PCBs 310a-b and the flex-circuit sections are arranged orthogonal to each other. Another non-limiting example is that each side of the body 305 has one LED driver PCB 310a-b affixed to each side with 4 separate LED driver controller ICs located on each PCB (8 LED driver controller ICs total, that in sum can be driven up to around 2 kW or more per (e.g., 80 mm long) UV LED lamp head module 200). Again, by affixing the LED driver PCBs 310 to the sides of the body 305, the waste heat from the LED driver PCBs 310a-b may be dissipated into the body 305 and carried away by the coolant flow to the heat exchanger or chiller. In one embodiment, a thermally conductive grease or other compound may be placed between the LED driver PCBs 310a-b and the body 305. In alternative embodiments, the LED driver PCBs 310a-b could be attached to the body 305 in a non-thermally efficient manner and be convectively cooled via fans.

According to one embodiment, a common anode substrate layer 317 is clamped between cathode claws 320a-d and 321a-d and anode bus body 315a-b. A monolithic U-shaped common anode is formed by anode bus body 315a-b (which are substantially parallel to each other) and the common anode substrate layer 317 (which is substantially orthogonal to the anode bus body 315a-b). In another embodiment, the common anode substrate 317 and the anode bus body 315a-b may form a monolithic rectangular or square shaped common anode.

In one embodiment, one surface of cathode claws 320a-d and 321a-d is substantially parallel to the cathode portion of the common anode substrate 371 and another surface is substantially parallel to a top surface of the LED driver PCBs 310a-b, thereby allowing the to make electrical contact between these two layers. Further details regarding the assembly forming the common anode substrate layer 317, including mounting mechanisms for affixing the cathode claws 320a-d 321a-d, the anode bus body 315a-b, are provided below.

In the present example, reflector 201 is a large (macro: e.g., ten's of millimeters in height), modular, non-imaging reflector structure having a mid-portion 352 significantly wider than either entrance 351 or exit apertures 353. Such a structure is well suited to printing applications where short stand-off distances (e.g., 2 mm) from the work piece to the reflector 201, and high irradiance (e.g., greater than ~50 W/cm2) are beneficial for high process speed, cure hardness and cure completeness (tack free).

In one embodiment, reflector 201 captures and controls approximately 90% or more (range 50-99%) of the light emitted by the LED array 330 and each half of the elongate reflector 201 is an ellipse having a focal point on the opposite side of the centerline of the projected optical pattern on the work piece, with the result of increasing the peak irradiance over a traditional shared focal point (along the projected beam centerline) design approach. Compound ellipses or other compound parabolic shapes may also be considered. In one embodiment, reflector 201 is designed to have a high angular extent of approximately 80 degrees (range of 45-90 degrees).

Embodiments of the present invention seek to produce a high-quality cure (e.g., 100% or nearly so) by producing both high peak irradiance and high total output power (e.g., approximately 184 W per UV LED lamp head module 200) as photo-initiators can be toxic (and expensive) and uncured inks, coatings, or adhesives are undesirable. As noted above, high irradiance results in faster, deeper, and harder cured materials. Consequently, embodiments of the present invention, seek to achieve peak irradiance levels that are approximately ten times (or more) the levels disclosed in current state-of-the-art UV LED (and mercury lamp) curing systems while also maintaining both high efficiency and long life of the LEDs.

According to one embodiment, reflector 201 is easily factory swappable and preferably field-replaceable thereby allowing other reflectors to be attached to the body 305 of UV LED lamp head module 200 for different applications, which might fulfill different process goals/parameters. In the present example, reflector 201 is shown as an elliptical reflector that is of two-part construction, where the two major components are the opposing sides of one or more ellipses. Reflector 201 may be machined on a five-axis mill and then polished with a diamond grit polish or it may be extruded metal and post polished, or it may be extruded polymer without the need for post polishing due to the prior polishing of the mold cavity/extrusion die. As described above, reflector 201 may be of modular design, such that an application, such as ink curing on a flat substrate that demands a narrow projected focal beam "line" of high irradiance (output power density) could use a bolt on ultra-high intensity line generating reflector (not shown), whereas an application on a rough topological substrate that demands a longer depth of field could require a reflector pair (not shown) specifically designed for this longer depth of field (or longer depth of focus) that is easily interchanged with the high intensity reflector pair by simply unbolting the previous reflector pair and bolting the new reflector pair in place as described in more detail below. Similarly, a reflector pair may be specifically configured for long working distance with high intensity or long working distance with a wide area smooth intensity beam pattern on the work piece. Locating pins between the reflector 201 and the common anode substrate layer 317 may be employed.

In one embodiment, the internal surface of the preferably injected molded polymeric reflector 201 is a silver vacuum-deposited coating with an ALD (atomic layer deposition) protective overcoat that is corrosion resistant due to the pin-hole free nature of the ALD process. The silver coating may be deposited using various deposition processes (e.g., ALD, CVD, sputtering, evaporation, sol-gel). As polycarbonate is an inexpensive polymeric reflector resin, a vapor barrier should be placed on the polycarbonate before the silver is deposited so that the side of the silver coating facing the polymeric reflector substrate does not allow corrosive vapor (molecules) to corrode the silver from the inside out. Low vapor permeable resins (e.g., E48R (Zeon Chemicals, USA)) may be considered. Also, vapor barriers (e.g., copper, ALD oxide coatings) may additionally be considered and, deposited on the reflector prior to the silver or aluminum coating. The ALD dielectric overcoat is selected from the group of oxides (e.g., $Al_2O_3$) or fluorides (e.g., $MgF_2$) or some combination thereof. Alternatively, an HR coating on the reflector 201 can also be a dielectric overcoated aluminum coating on an injection molded polymeric reflector. The dielectric coating is preferably a single layer magnesium fluoride or silicon dioxide tuned for peak reflectivity around the wavelength that is best suited to the application. A dielectric stack based on optical interference may be employed for any of the above-mentioned configurations to increase peak irradiance in the selected wavelength range.

Embodiments of the present invention may employ secondary optics (not shown) for beam control and/or a window (e.g., a lens) 340 that has an antireflective (AR) coating. The AR coating is preferably a BAAR (broad angle antireflective) coating as the angles emitting from the exit aperture 353 may be in excess of 45 degrees, as such high angles would undergo significant deleterious reflection from the window surface if such a BAAR coating was not used. High UV resistant acrylic for tanning beds could be considered, but borosilicate glass is preferable for window 340 and secondary optics. In one embodiment, a window mount 341 holds window 340 in place as described further below. According to one embodiment, an o-ring (not shown) is situated between the window 340 and reflector 201. In one embodiment, the external housing for the reflector 201 may be injection molded. In various embodiments, an inert gas or micro-porous spheres (available from Zeolite, USA) may be used to control water vapor. This vapor can be an issue for LED longevity should no encapsulant over the LEDs be employed. Current state-of-the-art does not allow for an LED encapsulant (such as high purity silicone) to be employed as yellowing from the high photon energies of the short UV wavelengths is an issue. Silicone encapsulants from Schott (Germany) with low carbon content are known to be the least yellowing in existence at this time.

For purposes of measuring a distance from the window 340 to a work piece surface, it is to be understood that the window 340 has an inner surface (closest to the surface of the LED array 330) and an outer surface (closest to the surface of the work piece). Herein, distances to the work piece are generally measured with respect to the outer surface of the window 340.

Figure 3C:
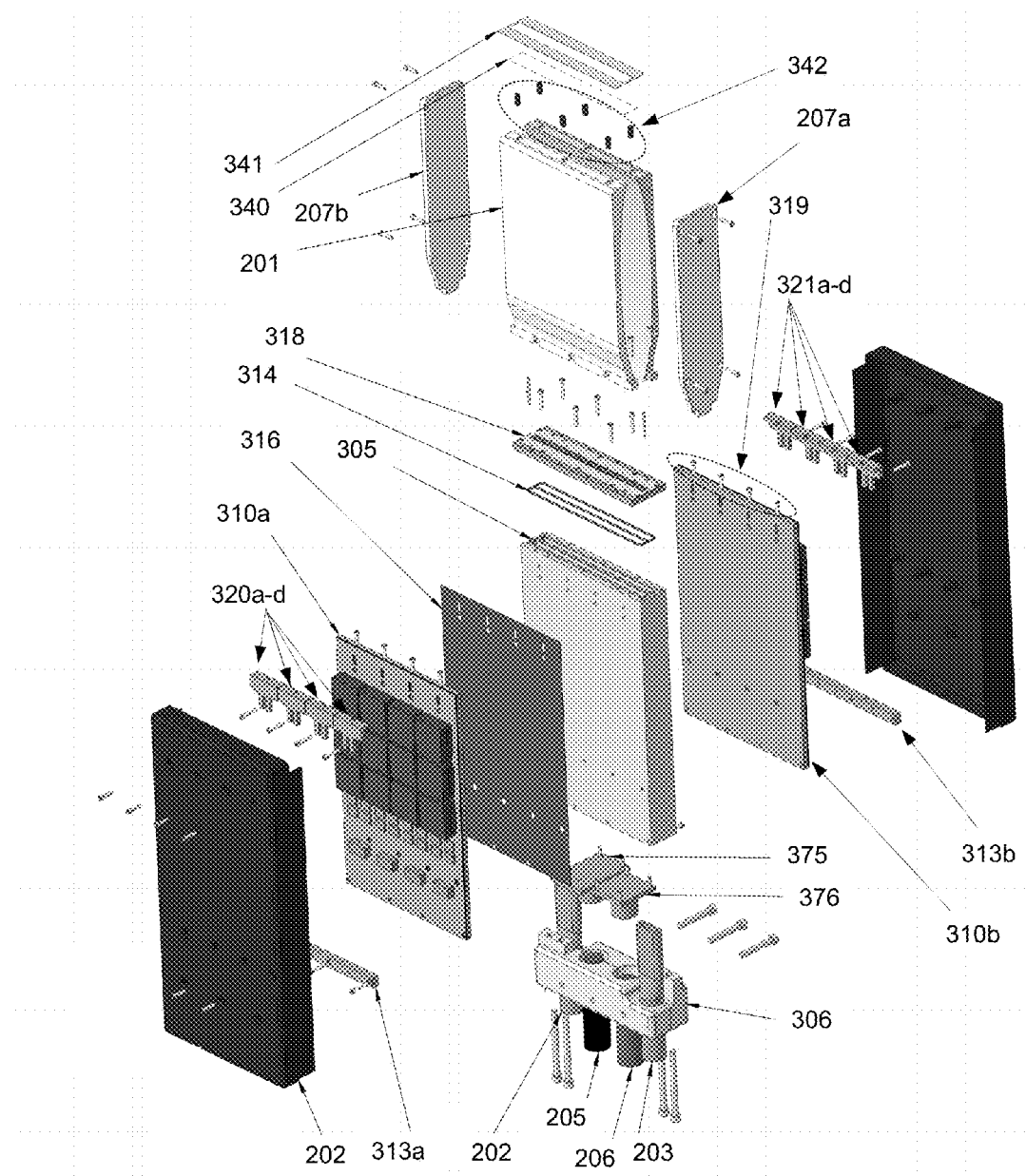
FIG. 3C is a top-level isometric exploded view of the UV LED lamp head module of FIG. 2A.

FIG. 3C is a top-level isometric exploded view of the UV LED lamp head module 200 of FIG. 2A. According to the present example, electrical power is provided to the UV LED lamp head module 200 via a cathode cable 205 and an anode cable 206, which are in turn coupled to cathode cross plate 375 and anode cross plate 376, respectively. In the present example, the cross plates 375 and 376 both include tubular structures orthogonal to their top surfaces to accept the corresponding cables 205 and 206 via preferably solder connections. The cathode cross plate 375 is wider than the anode cross plate 376 to provide an electrical connection with the cathode bus bars 304a-b, which in turn is coupled to the front surface of the LED driver PCBs 310a-b, which are generally cathodic layers separated by dielectrics and ultimately separated from the anodic common anode body (the metal core of the MCPCB) by one of these dielectrics layers. The anode cross plate 376 engages with the metal core (common anodic backplane) of the LED driver PCBs 310a-b. In one embodiment, it may be preferable to have the primary anode cable 206 and primary cathode cable 205 located at opposite ends of the lamp base 305 for enhanced current spreading purposes.

Now, moving from the electrical input and coolant input end of the UV LED lamp head module 200 to the light emitting end of the UV LED lamp head module 200, cathode claws 320a-d and 321a-d may serve several functions, including (i) carrying the electric current from the cathode side of the LED driver PCBs 310a-b to the cathode layer encompassed in the flex-circuit assembly bonded to the replaceable monolithic micro-channel cooler assembly (e.g., part of LED package 318); (ii) clamping the LED package 318 to the lamp body 305; and (iii) clamping the LED package 318 to the anode body 315a-b. In one embodiment, the cathode claws 320a-d and 321a-d clamp down on to the cathode side of the LED driver PCBs 310a-b thereby forming a complete cathodic electrical path for low impedance current flow with low electrical contact resistance. The cathode claws 320a-d and 321a-d may be slotted to allow clamping action via vertical (along the optical output axis) screws 319 to pull down and compress the separator gasket (o-ring) 314 and force a common anode substrate layer of LED package 318 in contact with the anode bus body 315a-b thereby forming a complete anodic electrical path for low impedance current flow with low electrical contact resistance.

Depending upon the particular implementation, cathode claws 320a-d and 321a-d could be replaced with alternative cathode connectors/bodies of various forms, including, but not limited to, bent metal foil, stamped spring foil, metal molded 3 dimensional geometries, flex-circuit and even wire.

In one embodiment, the micro-channel cooler assembly is clamped to the anode bus body 315a-b and/or the lamp body 305 with screws providing the clamping force. By unscrewing the potentially polymeric screws that effectively may clamp and sandwich the aforementioned LED package 318 between the anode and cathode assemblies, the LED package 381 or portions thereof, e.g., the micro-channel cooler assembly, can be easily removed and replaced.

The micro-channel cooler may be plated with the ENEPIG or ENIG process available from Superior Plating USA prior to the flex-circuit being optionally bonded to it, or after the flex-circuit is optionally bonded, or just the flex-circuit may be plated. The advantage to the ENEPIG process is that it is a universal coating in that lead-free solder components may be bonded to it as well as gold wires used in the wire bonding of the LED cathodes to the flex-circuit cathodes. Other coatings may be considered. It should be noted that it is preferable that only the areas of the entire apparatus (other than the LED bond pads) that have a gold containing layer be found on the top conductive material layer of the flex-circuit found at the opposite end of the wires that run to the LED bond pads. In some embodiments, the micro-channel cooler assembly and the anode body 315a-b may have clearance holes for cathode wires to travel through, and the cathode wires may then be soldered or set screwed in place in the cathode bus bars 304a-b. It is desirable to use large core, high strand count, small gage wire that has minimal sheathing thickness so the clearance holes do not have to be unduly large and thereby making the overall assembly unduly large. A good compromise between low voltage drop and small size is 10, range 1-30, Gage wire with 105 strands available from Alpha Wire and or CableCo USA. The anode and cathode parts may be plated for low contact resistance. Also, a petroleum based gel could be used if bare copper is chosen for any contact surface.

In the current example, anode cross plate 376 is affixed to the anode bus body 315a-b via preferably metallic screws that are inserted into threaded holes in the edge of the anode bus body 315a-b. Alternatively, if one were not concerned with ease of replaceability and/or disassembly such contacts could be soldered. This alternative could be considered in the context of other mounting mechanisms described herein, such as the cathode claws' 320a-b and 321a-b interface with either the LED driver PCBs 310a-b or the cathode layer of the flex-circuit (not shown). Similarly, cathode cross plate 375 is shown as being affixed (e.g., with metallic screws) to the cathode bus bars 304a-b, which extend slightly beyond the edge of the anode bus body 315a and 315b, respectively, to provide an air gap between the anode bus body 315a-b and the cathode cross plate 375 to prevent electrical shorting.

In one embodiment, an air gap (not shown) is provided between the cross plates 375 and 376 lamp body 305 for several reasons. Firstly, in one embodiment, anode bus body 315a and 315b, common anode substrate layer of LED package 381, a cathode layer of the flex-circuit (not shown) and cathode claws 320a-d and 321a-d serve in a synergistic fashion to make the various electrical contacts (anode-to-anode and cathode-to-cathode) through a clamping or pinching function. Consequently, if the cross plates 375 and 376 did come into contact with lamp body 305 they could unload the inherent preload function of cathode claws 320a-d and 321a-d. Secondly, it is preferable that lamp body 305 be thermally conductive and thermally conductive materials are sometimes also electrically conductive (e.g., electrically conductive graphite filler in a polymeric resin, such as polycarbonate or PPS or base metallic materials, such as copper, stainless steel or aluminum). As such, the air gap between the cross plates 375 and 376 serves to prevent shorting in such embodiments. In alternative embodiments, the lamp body 305 may be thermally conductive and electrically insulating, such as D5506 liquid crystalline polymer (LCP) a filled electrically insulating polymer available from Cool Polymers, USA.

Alternatively, the cross plates 375 and 376 could be attached or affixed to the lamp body 305 with polymeric screws for stress relief purposes. Additionally, glue means and the use of shims can be considered for ease of assembly and to account for dimensional tolerance stack up in production can be considered.

It should be noted that one should be cognizant of the fact that lamp body 305 (if it is in fact electrically conductive) is in contact with the common anode substrate layer 317. As such, electro-chemical (e.g., galvanic) corrosion can be encountered if dissimilar electro potentials come in direct contact or even in close proximity or even in indirect contact via fluid flow, for example. Therefore, materials used for common anode substrate layer 317 and materials used to facilitate thermal conductivity of lamp body 305 should be selected with care. In one embodiment, a copper anode substrate layer 317 is paired with a graphite filler of lamp body 305. If body 305 was aluminum and the anode substrate layer 317 was copper this would pose an enormous corrosion problem, for example.

With respect to lamp body 305, it is noted that due to the high aspect ratio and deep, narrow main lamp body cooling fluid channels 360 and 361, injection molding may be the most practical means of manufacturing; however, drafting of the external surfaces of the lamp body 305 would interfere with the orthogonal nature of the electrical contact points where the anode bus body 315a and 315b contacts common anode substrate layer 317 at preferably a zero or ninety degree angle in order to provide for low electrical contact resistance (i.e., two orthogonal smooth surfaces (plate-to-plate contact) vs. two surfaces meeting at an angle (sharp edge-to-plate contact)).

According to one embodiment, using a mold within a mold technique (wherein each half of the inner mold has a modular hand-load side), an inner mold is used to define the outer envelope and/or features of lamp body 305. When the two halves are pulled apart, the lamp body 305 is ejected without the need for draft thereby enabling the desired flush and parallel and/or orthogonal mounting of anode bus body 315a-b, common anode substrate layer 317 and cathode claws 320a-d and 321a-d due to the lack of drafting angle. The need for draft is eliminated as a result of the two-part construction, which reduces the surface area by 50% and doubles the rigidity of the mold allowing for the two mold halves to be pried part and the lamp body to be ejected despite the fact the fact that no draft is in the mold because there is, among other factors, a 50% reduction in surface drag during the ejection as compared to a traditional single piece mold. With the thermally conductive polymers contemplated, their high thermal conductivity require a higher mold surface temperature than would traditionally be utilized (so the resin doesn't "freeze" in the mold). Furthermore, because no filler particles can be sloughed out into the coolant during UV LED lamp head module operation as the micro-channel cooler could potentially become clogged, even higher mold surface temperatures are preferable to create a resin-rich "skin" that will fully contain the filler particles within the resin matrix.

Another potential issue with using a traditional injection molding process is the deep and narrow and high aspect ratio main inlet and outlet lamp body cooling fluid channels 360 and 361 may lead to a bending of the thin parallel plates of the mold used to define the main inlet and outlet lamp body cooling fluid channels 360 and 361. This issue is uniquely addressed, in one embodiment, by using a vertical injection molding process, involving balanced multipoint injection flow and pressure so as to not bend (deform) the metallic plates that form (define) the channels.

According to one embodiment, a two-part strain relief clamp 306 is used to remove stress from cathode cable 205, anode cable 206, cathode cross plate 375 and anode cross plate 376 as strain on these components would otherwise be transferred to the fragile LED driver PCBs 310a-b.

Returning briefly to the cathode claws 320a-d and 321a-d, in one embodiment, a beryllium copper or other conductive metal corrugated strip could be placed between the cathode claws 320a-d and 321a-d and a top surface of an electrically isolated cathodic foil of a micro-channel cooler assembly of LED package 318 for the purpose of providing a spring type action between these components. This could effectively negate the need for the preferably 0-80 screws that clamp the cathode claws 320a-d and 321a-d to the foil. Instead, the orthogonal screws through the cathode claws 320a-d and LED driver PCBs 310a-b and into the lamp body 305 could clamp the cathode claws 320a-d and 321a-d in place if a downward force was temporarily supplied to force the spring flat or nearly so, thus providing a low electrical resistance connection with one less screw. This same or substantially similar concept could be employed on the anode edge of the anode bus body 315a-b nearest the backside of the lamp body 305, however, one may consider a substantially monolithic corrugated beryllium copper or other electrically conductive material. An anode tie bar could wrap around the PCB and have orthogonal slots to accept screws. Solder or conductive adhesive can always be considered but they would affect ease of repairability. It should be noted that by affixing or clamping the LED driver PCBs 310a-b to the sides of the lamp body 305 this preferably mates the components in excellent thermal communication thereby allowing the flowing coolant to cool the LED driver PCBs 310a-b as, in one embodiment, they have waste heat dissipation requirements of around 0.5-1 W/cm$^2$+/−. Ultra high efficiency switching electronic SMD components of greater than 90% efficiency are preferable. In one embodiment, the deep high aspect ratio coolant channels 360 and 361 synergistically add surface area to lower the heat transfer coefficient required to cool the LED driver PCBs 310a-b while at the same time adding sufficient hydraulic resistance to balance the flow through the micro-channel cooler 410. The thin walls of the lamp body 305 not only lower the thermal resistance between the LED driver PCBs 310a-b and the coolant flow, but also allow for the cathode foil layer 513 of the flex-circuit 510 to be shorter in length (measured from the end of the micro-channel cooler 410 to the edge near the wire bonds).

Additionally, Lineage USA will have platinum rated conduction cooled 1000 W power supplies commercially available in 2011. These power supplies are 95% efficient, and in principle will not need any coolant water to carry away the waste heat, and just natural convection is used. It should be finally noted that if ~1100 W ~12V Power-One front end AC/DC power supplies were used, one could use two of the units per ~80 mm UV LED lamp head module containing about ~136 LED (of, for example, SemiLEDs' ~1.07×1.07 mm LEDs).

According to embodiments of the present invention, it is preferable to not solder LED package 318 or the micro-cooler assembly to the LED driver PCBs 310a-b as this method would decrease modularity and increase integration, with the net result of decreased repairability or replacement of subcomponents. As an example only, if one of the LED driver PCBs 310a-b fail, it may simply be unscrewed using preferably injection molded, or machined polymer (nylon, PEEK, Torlon) screws, as previously described, and replaced with a repaired or new board. The same holds true for LED package 318 preferably directly bonded to a micro-cooler assembly as described further below.

In relation to assembly of various components of the UV LED lamp head module 200, in a preferred but non-limiting example, 0-80 tapped holes may be placed in the edges of the LED driver PCBs 310a-b that face the direction of light output (which is to say facing the anode side of the micro-cooler assembly). Secondly, small claw-shaped cathode claws 320a-d and 321a-d that are preferably of copper or aluminum construction (and machined, molded, or stamped) and in the aggregate being of the same approximate dimension in the long-axis of the LED array direction (individually, the same approximate length of the isolated LED driver PCB 310a-b and/or flex-circuit segments). When the LED driver PCBs 310a-b are pushed up tight (as sliding is allowed by slots in the LED driver PCBs 310a-b when they are lightly screwed to the lamp body 305) to the anode over-hanging side of the micro-channel cooler, and then screwed in place with separate screws to the sides of the lamp body 305, the cathode claws 320a-b and 321a-b are placed on the protruding cathodic flex-circuit sections, and the orthogonal surfaces of the cathode claws 320a-b and 321a-b are placed over their respective positions on cathode pads of the LED driver PCBs 310a-b. Then, 0-80 polymer screws (or metal screws with non-conductive polymeric sleeves and/or washers) are placed through the cathode claws 320a-d and 321a-d, through LED package 318 (e.g., including micro-channel cooler/flex-circuit assembly) and into threaded holes in the (top light emitting direction of the lamp body 305) and tightened using a pre-set torque production screwdriver unit. Any embodiment could use metal screws with non-conductive polymeric sleeves and/or washers or polymer screws. For the same reason, non-conductive screws or polymeric sleeves and/or washers might be employed, the cathode layer 513 of flex-circuit 510 might be pulled back to avoid contact with metal screws to avoid electrical shorting of any layers. Metal screws could be in contact with and carry electrical current between anode and/or cathode layers.

If used, the polymer screws (which could be machined or molded at Craftech USA) are then firmly tightened which then complete the function of making a very low electrical resistance contact between anodic surfaces of the micro-channel cooler and LED driver PCBs 310a-b, and the proper cathodic surface locations of the flex-circuit cathodic segments and the cathode claws 320a-d and 321a-d and the pads on the LED driver PCBs 310a-b. It should be noted that most or all of the screwing and/or affixing operations mentioned above could be accomplished with preferably low melting temperature solder or glue or other affixing means; however, for purposes of ease of repairability screws are described as the affixing means in the context of various embodiments of the present invention. It is also contemplated that a slot could be placed in LED driver PCBs 310a-b such that each side of the slot accepts the protruding portions of the micro-channel cooler/flex circuit. The protruding portions of the flex-circuit could then be inserted into these slots and preferably soldered in place after the LED driver PCBs 310a-b are preferably screwed to the side of the lamp body 305. It should also be noted that spring contacts made from an electrically conductive material such as beryllium copper, which could be used preferably in place of the aforementioned adjustable cathode claws.

Figure 4A:
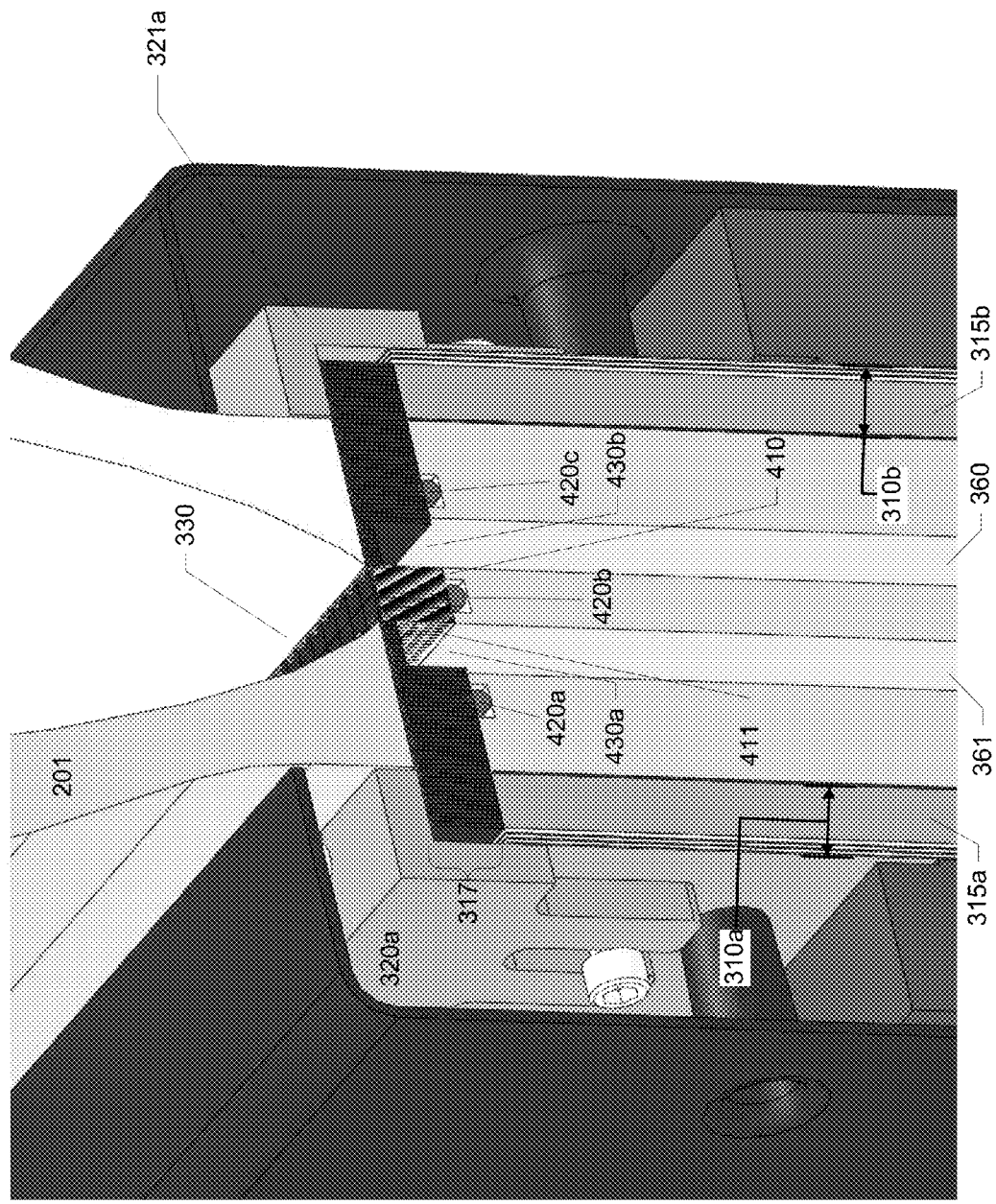
FIG. 4A is a magnified isometric cut-away view of a bottom portion of a reflector and a top portion of a body of the UV LED lamp head module of FIG. 2A.
Figure 4B:
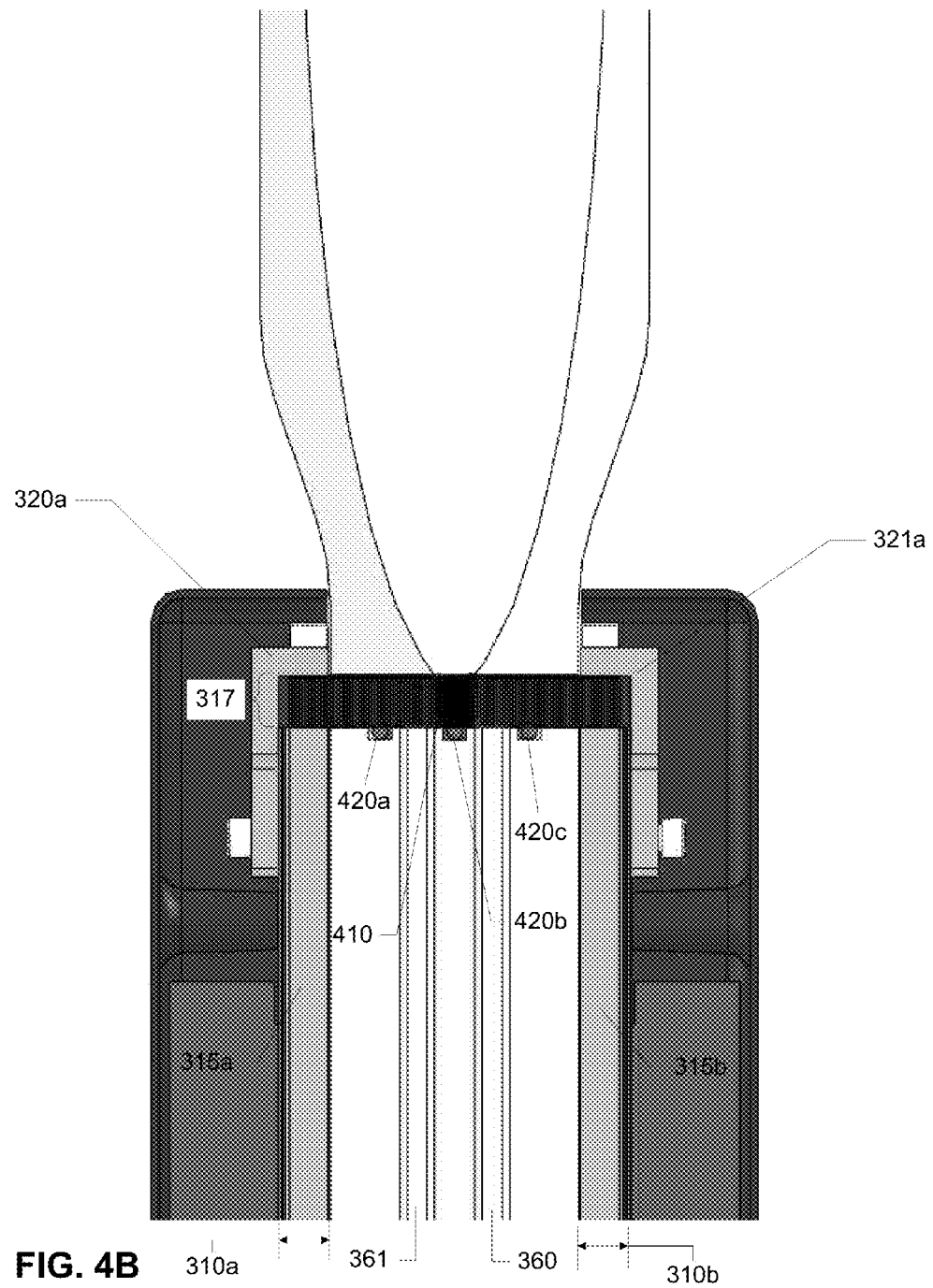
FIG. 4B is a magnified front cut-away view of a bottom portion of a reflector and a top portion of a body of the UV LED lamp head module of FIG. 2A.

FIGS. 4A-B provide magnified cut-away views of a bottom portion of reflector 201 and a top portion of body 305 of the UV LED lamp head module 200 of FIG. 2A. In these views, LED array 330 and various aspects of the common anode substrate layer 317 become apparent. Additionally, in these views, separator gasket 314 is depicted as being formed of a plurality of o-rings 420 and a preferred multilayer construction of the LED driver PCBs 310a-b becomes visible.

As described in further detail below, in one embodiment, a micro-channel cooler 410 provides the common anode substrate layer 317. According to one embodiment, micro-channel cooler 410 is a diffusion bonded etched foil micro-channel cooler including a heat spreader layer (not shown) diffusion bonded to foil layers (not shown) having etched therein various primary inlet/outlet micro-channels 411 and internal micro-channels (not shown). While micro-channel cooling does have a laminar component in which the boundary layer is compressed, in embodiments of the present invention, impingement cooling (e.g., turbulence) may result from etched coolant flow path shape and/or directional changes. An exemplary micro-channel cooler is illustrated by U.S. Pat. No. 7,836,940, which is hereby incorporated by reference in its entirety for all purposes. Micro-channel coolers meeting the cooling requirements described herein are available from Micro-Cooling Concepts, USA. Those skilled in the art will recognize that various other cooling schemes may be employed. For example, macro-channel cooling and other turbulent flow cooling paths (e.g., impingement, jet-impingement) or two-phase/nucleate boiling (or some combination), and cooling schemes may be considered.

According to various embodiments of the present invention, one objective is to create and maintain a relatively isothermal state (e.g., junction temperatures within approximately ±1 degree C. and also generally a maximum average junction temperature of ~40 degrees C. (range 30-200 degrees C.) from end-to-end of the LED array 330. To achieve this objective, embodiments of the present invention attempt to balance coolant flow through the micro-channel cooler 410 from front to back, top to bottom, end to end and/or side to side. In alternative embodiments, the flow may be balanced or imbalanced to accommodate design needs. The coolant may flow through internal primary and secondary channels (not shown) of the micro-channel cooler 410 in virtually any direction, selected from vertical, horizontal, orthogonal, parallel, etc., or any combination thereof, with respect to the bottom surface of, as well as under, the LEDs of the LED array 330. Another way of describing the orientation of the channels is with respect to the p-n junction plane, which is (in most LEDs) substantially parallel to the bottom surface of the LED.

Similarly, the internal primary and/or secondary channels they may be interconnected with virtually any orientation of manifold(s) selected from vertical, horizontal, orthogonal, parallel, diagonal, angular, by-pass, partial by-pass, etc., or any combination thereof, again with respect to the orientation of the bottoms of the LEDs (or the p-n junctions of the LEDs). It is preferable that all, or almost all (near 100%) of the coolant eventually flows from the top portion (e.g., main inlet micro-channel cooler cooling fluid channel 430b) of main inlet lamp body cooling fluid channel 360 through the micro-channel cooler 410 to the top portion (e.g., main outlet micro-channel cooler cooling fluid channel 430a) of main outlet lamp body cooling fluid channel 361 in a direction that is orthogonal, or perpendicular, to the long-axis of the LED array 330 and/or micro-channel cooler 410. In one embodiment, micro-channel cooler 410 utilizes flow paths optimized by CFD to reduce flow velocities to such a level so as to greatly reduce erosion. In one embodiment, coolant velocities of approximately 2 meters/sec. are preferred to reduce erosion of the channels. Ceramic materials may be used for the channel substrate to even further eliminate erosion potential.

As noted earlier, the main inlet lamp body cooling fluid channel 360 and the main outlet lamp body cooling fluid channel 316 are sized such that the coolant flows uniformly through the etched foil internal micro-channels, and so that preferably nearly all of the coolant eventually ends up running in a substantially perpendicular direction to the long axis of LED array 330, in that any given molecule of coolant that starts in main inlet lamp body cooling fluid channel 360 eventually ends up in the main outlet lamp body cooling fluid channel 361, and so, essentially each molecule of coolant eventually flows substantially perpendicular to the long-axis of LED array 330 (substantially parallel to the short-axis of the LED array 330) as it traverses micro-channel cooler 410 and flows under the LEDs. By making the main inlet lamp body cooling fluid channel 360 very narrow (e.g., approximately 1-4 mm and preferably approximately 2.3 mm) wide and very deep (e.g., approximately 1-10,000 mm and preferably about 100 mm), the resultant hydraulic resistance aids in uniform micro-channel flow in terms of balanced flow through substantially all or most of the internal channels of micro-channel cooler 410, whether or not they be primary, cross, secondary, manifold, etc. channels. It should be understood that these channels could have curves, s-bends, protrusion for turbulence, and perhaps narrow and widen and/or deepen as they traverse the space under LED array 330 in the direction that is substantially lateral or parallel to the short axis of LED array 330. Again, the orientation of any given micro-channel can be in any orientation (as well as flow direction) with respect to the orientation of the p-n junctions of the LEDs.

As described in further detail below, LED array 330, comprising light emitting devices, such as LEDs or laser diodes, are mounted to the micro-channel cooler 410. In one embodiment, the range of the number of LEDs along the length of the micro-channel cooler is 2-10,000, and the size of each LED is approximately 1.07, 1.2, 2, 4 mm square (or 2×4 mm), range of 0.1-100 mm. The aspect ratio of the width to length is preferably about 1:68 to 1:200, but the range may be 1:10-1: 1,000. It should be noted that the LED arrays may not be high aspect ratio and may be substantially square, substantially rectangular, substantially circular or other geometries. Exemplary LEDs are available from SemiLEDs, USA. SemiLEDs' LEDs have a unique (often plated) copper substrate which is advantageously bonded to the copper (or ceramic) micro-channel cooler 410, thereby maintaining the thermal and cost advantageous of this high thermal conductivity material. According to one embodiment, the size of the LEDs employed are 1.07×1.07 mm square and the LED array 330 comprises an array of 68 LEDs long by 2 LEDs wide.

In one embodiment of the present invention, the LEDs of LED array 330 are placed substantially in electrical parallel, or have at least two LEDs in parallel, on a preferably common anode substrate. This is a very thermally efficient manner of connection, as no thermally impeding dielectric layer between the base of the LED and the substrate need be added for the purpose of electrical isolation as is needed in a series configuration or series/parallel configuration. Nonetheless, it should be noted that any of these configurations could be considered in various embodiments, as well as a purely series arrangement, or a series/parallel arrangement. While a dielectric layer could substantially add to overall thermal resistance, thereby raising the junction temperature of the device(s) and adversely impacting output power and/or efficiency, it is contemplated that a very thin dielectric layer on the order of a few microns thick or less may be grown by means such as atomic layer deposition and provide a very low thermal impedance layer over a material such as copper for the purpose of electrical insulation in a series/parallel type arrangement. This dielectric could be selected from the group of oxides, nitrides, carbides, ceramics, diamond, polymers (ALD polyimide), DLC, etc.

According to various embodiments of the present invention, one objective is to maintain extremely low thermal resistance between the epitaxial p-n junctions of the LEDs, or at least the bottom of the preferably bare die, that is approximately 0.015 K-cm2/W, but the range may be 0.0010-15 K-cm$^2$/W, and is often around 0.024 K-cm$^2$/W. Very thin layers of foil, bond pads, traces, etc. of either metallic, dielectric, ceramic, or polymer layers may be considered, but are not optimal due to the increase in thermal resistance that results from these additional layers, which inevitably results in an increase in junction temperatures, with a corresponding decrease in efficiency. Various means for decreasing current droop associated with the epitaxial structure growth and design, such as thicker n or p capping layers may be employed, as well as other state-of-the-art means (e.g., new quantum barrier designs, reducing non-radiative recombination centers, etc.) found in recently published scientific journals, and authored by employees of Philips, Netherlands, and RPI, USA, and others (see, e.g., Rensselaer Magazine, "New LED Drops the 'Droop'" March 2009 and Compound Semiconductor Magazine, "LED Droop: Do Defects Play A Major Role?" Jul. 14, 2010, both of which are hereby incorporated by reference in their entirety for all purposes).

As such, in accordance with various embodiments, an extremely low thermal resistance path exists between the LED junction and the etched (e.g., chemically etched) foil layers that contain flowing liquid in the preferably chemically etched micro-channels, because the LEDs are directly mounted (preferably with 2.5 um thick SnCu solder), and the heat spreader (if employed) and foil layers are thin, and they preferably do not enlist an intervening dielectric layer. Other etching or lithographic or machining processes may also be considered in the manufacture of the micro-channels.

According to one embodiment, the LEDs of LED array 330 are bonded directly (i.e., no substantial intervening layer (whether bulk material, foil, thin-film, or other material) between the LED and the micro-channel cooler 410 other than, for example, a thin pre-sputtered solder layer that is preferably pre-applied (e.g., by sputter deposition means) to a bottom surface of the LEDs.

As described in further detail below, a separator gasket 314 may be formed by one or more o-rings 420 to seal the common anode substrate layer 317 to the body 305 and also prevent coolant bypass substantially directly under the LED array 330. While in this and other figures, the o-rings 420*a-c* do not appear to be compressed, it will be appreciated that in real-world operation, they would in fact be compressed to perform their intended function of preventing fluid by-pass between channels or into the external environment. In the present example, separator gasket 314 is substantially parallel to, and in the same z-axis plane, as the bottom surface (opposite to the light emitting direction) of the diffusion bonded foil layers (not shown) of the micro-channel cooler (whether layered vertically or horizontally). The cross-section of the separator gasket 314 is preferably substantially round, may be made of a soft durometer silicone, and may be manufactured by Apple Rubber USA. In alternative embodiments, the cross-section of the separator gasket 314 may be square or rectangular.

With reference to the multilayer construction of the LED driver PCBs 310*a-b* illustrated in the present example, in one embodiment, copper (or aluminum, polymer, filled polymer, etc.) metal core PCB boards that are approximately 2.5 mm thick (range 0.1-10 mm) and available from Cofan Canada are constructed of multiple layers to keep the size of the PCB at a minimum. The high power FETs and gate drivers and inductors and resistors and capacitors may be mounted on the preferably Thermagon USA layer that is closest to the metal core. In fact, in some embodiments, this layer could be windowed or cored so that the FETs (or other driver PCB components) can be mounted directly to the metal core with or without attachment screws. The LM 3434 or LM 3433 (examples only) series LED common anode drivers available from National Semiconductor USA could also be mounted as close as possible to the metal core as well, meaning that a minimal dielectric layer thickness (if any) may exists between the components and metal core. Equal trace path lengths and close component spacing should also be considered for efficient electrical and stable operation. Custom wound inductors can increase drive sub-assembly efficiency greatly. The inductors could be oriented in such a manner as to make the magnetic fields of the separate drivers (e.g., 8 or 15) with a preferable common backplane (e.g., anode body 315*a-b*) that also may be shared with the common anode substrate 317 of the micro-cooler flex-circuit assembly advantageously interacting with each other to increase the efficiency of the preferably constant current driver (though a constant voltage driver may be considered, especially with special circuitry). Pulse width modulation (PWM) constant current drivers may be considered, although, PWM can have a deleterious effect on LED lifetime at high currents due to current ripple, additional capacitors between the inductors and the LEDs should be considered. Alternatively, an iron substrate could be placed between the inductors to reduce undesirable interaction between the inductors or other components that may be orientation and spacing dependent. Most preferably, shielded, off-the-shelf (OFS) inductors from VASHAY, India can be considered.

On the backside of the lamp body 306 (the side where the main input water and electrical energy in/out sources are located) the preferably metal (copper, aluminum, composite) MCPCB cores can have a screwed or soldered tie bar (or anode cross plate 376) between the two MCPCB (PCB's with metal cores available from Cofan, Canada) cores to make a space and/or strong mounting plate for a single wire connection for the anode that will then run to the main AC/DC front end power supplies that are connected to the AC mains.

In one embodiment, the metal cores of the LED driver PCBs 310*a-b* are the ground plains—there may be more than one ground plane on each LED driver PCB 310*a-b*. As such, the edge of the PCB is preferably clamped or soldered to the ground plain of the common anode substrate layer 317. This is preferably accomplished by allowing the common anode substrate layer 317 to extend, or hang over, each side of the body 305, such that the anodic side of the common anode substrate layer 317 can touch and be in electrical communication with the anode side (edge) of the LED driver PCBs 310*a-b*, and the cathodic sides of the common anode substrate layer 317 (e.g., the top foil layer) can preferably touch and be in electrical communication with the proper top cathode area of the individual cathodic segments that are in electrical communication with the LED driver PCBs 310*a-b*.

Figure 5A:
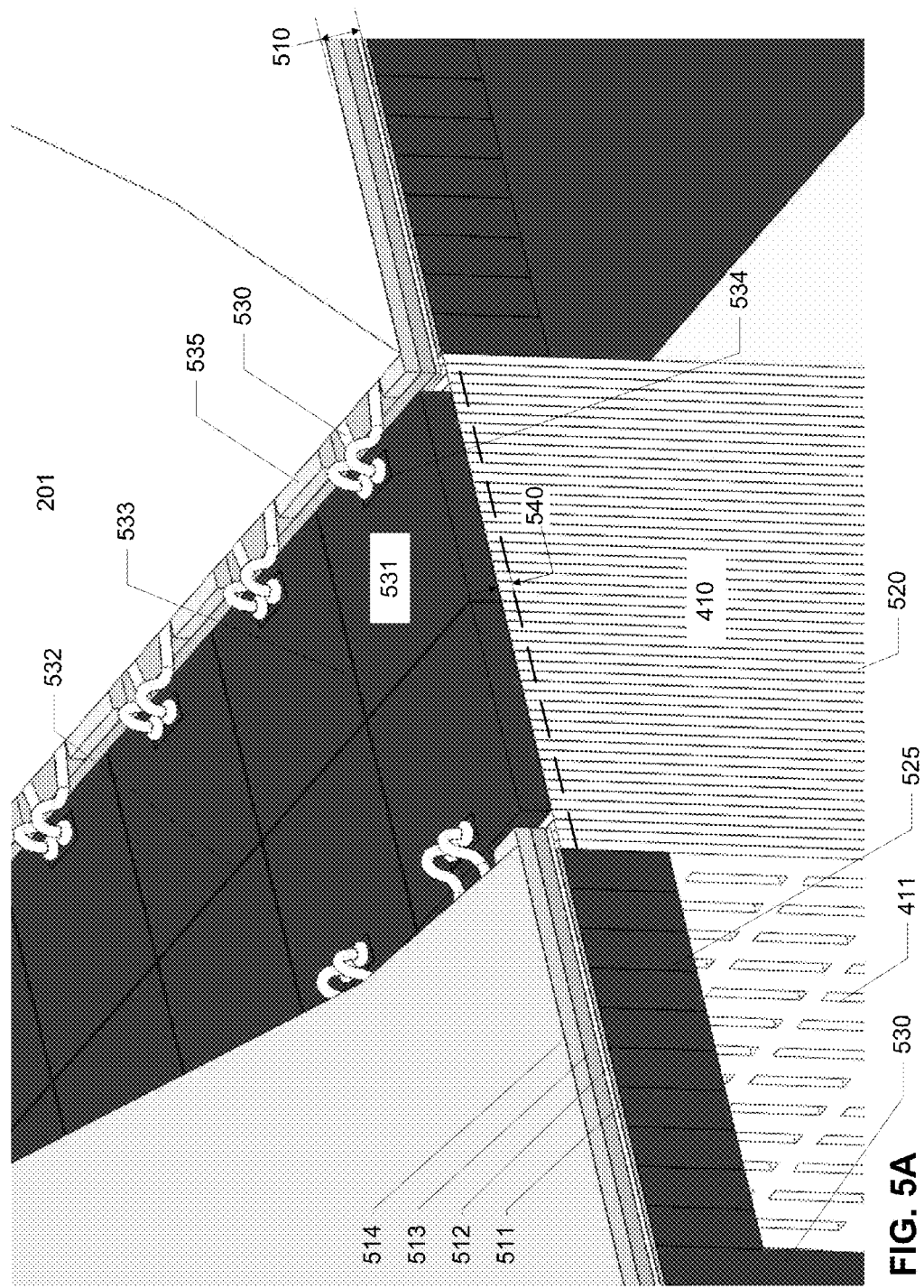
FIG. 5A is a further magnified isometric cut-away view illustrating an LED array and its interface with a common anode substrate layer of the UV LED lamp head module of FIG. 2A.
Figure 5B:
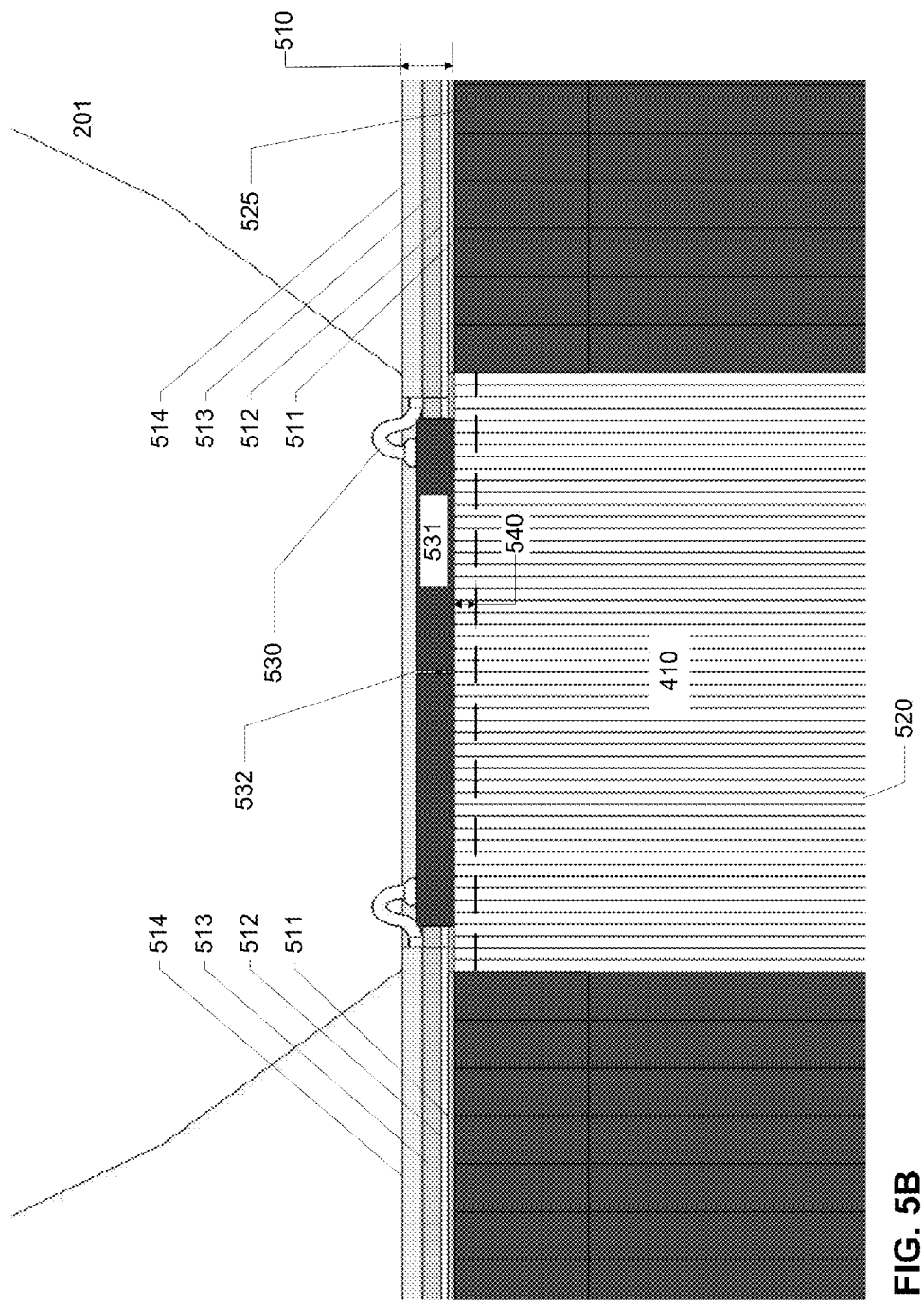
FIG. 5B is a further magnified front cut-away view illustrating an LED array and its interface with a common anode substrate layer of the UV LED lamp head module of FIG. 2A.

FIGS. 5A-B provide further magnified views illustrating LED array 330 and its interface with common anode substrate 317 of the UV LED lamp head module 200 of FIG. 2. In these views, the high fill-factor of the LED array 330, the electrical coupling of the individual LEDs, the proximity of the base of the reflector 201 to the surface of the LEDs and the various layers of a flex-circuit 510 become apparent. Additionally, in these views, the preferably vertically-oriented foil layers of the micro-channel cooler 410 become visible.

According to one embodiment, common anode substrate layer 317 may include a micro-channel cooler 410 for transferring heat from LED array 330, an integrated etched capping layer 525 and a solid capping layer 530. In one embodiment, the width of the micro-channel cooler 410 is only slightly (e.g., less than about 400 microns (range 50-2,000 microns)) wider than the LED array 330. In one embodiment, the total width of the micro-channel cooler 410 is about 1.2 times (range 1, 1.1, 1.3, 1.4, 1.5, 1.6, 1.7, 1.9, 2, 2.1, 2.2, 2.3, 2.4 to 2.5×) the total width of the LED array 330. In the present context, computer modeling suggests that increasing the total width of the micro-channel cooler 410 to a width of nearly double (2×) the width of the LED array 330 decreases the peak thermal resistance by only about 5%.

The micro-channel cooler 410 may include a heat spreader layer 540 (a/k/a thermal diffusion layer) (e.g., approximately 125 microns thick (ranging from less than 500 microns, less than 250 microns, less than 200 microns, less than 150 microns, less than 100 microns, less than 50 microns, to less than 25 microns), below a top surface of the micro-channel cooler 410, a plurality of primary inlet/outlet micro-channels (e.g., primary inlet micro-channel 411) and various inlet manifold passages, heat transfer passages and outlet manifold passages. Notably, in the present context, the heat spreader layer 540 really provides little true heat spreading; however, it does provide an extremely short thermal diffusion length (distance between the bottom of the LEDs and the closest of the heat transfer channels (not shown) of the micro-channel cooler 410). Exemplary heat transfer channels, their orientation, flow directions and dimensions are provided by U.S. Pat. No. 7,836,940, incorporated by reference herein.

The top surface of the micro-channel cooler 410 may couple the micro-channel cooler 410 with LED array 330. Primary inlet micro-channels (not shown) may be configured to receive and direct a fluid into internal passages within the micro-channel cooler 410, including heat transfer passages. The heat transfer passages may be configured to receive and direct the fluid in a direction substantially parallel to the top surface and substantially perpendicular various input and output manifold passages. The outlet manifold passages may be configured to receive and direct the fluid to one or more primary outlet micro-channels (e.g., primary outlet micro-channel 411).

In one embodiment, micro-channel cooler 410 may be formed from a plurality of etched foil sheets (e.g., foil sheet 520) having formed therein the internal passages and manifolds for directing coolant flow. In the current example, a monolithic micro-channel cooler body is formed by diffusion bonding the combined etched capping layer 525 and solid capping layer 530 to micro-channel cooler 410. As shown in FIG. 5A, foil layers of the etched capping layer 525 are preferably thicker than the foil layers 520 of the micro-channel cooler 410. In one embodiment, the capping layers 525 and 530 could be machined.

In an embodiment in which the diffusion bonded foil layers (e.g., foil layer 520) are vertically stacked (and diffusion bonded together) with their edges lying under the bottom portion of the LEDs as illustrated in FIGS. 5A and 5B, the LEDs are preferably bonded directly to the vertically-oriented micro-cooler (with or without plating such as ENIG, or ENEPIG, Superior plating, USA), and preferably two machined pure (C101 or C110) copper blocks, with mirrored (matching) macro-coolant flow and/or coolant directing channels, "pinching" the vertically laid up etched diffusion bonded micro-channel cooler. Each copper block (which could be in and of itself be a stack of diffusion bonded foils or a solid block) is diffusion bonded to opposing sides of the vertically stacked foil micro-channel cooler 410 in one step. In other words, the foil layers and blocks are preferably diffusion bonded all in one step. The resultant stack is then preferably machine excised, and the assembly can then be referred to as the micro-channel cooler assembly, whereas portions of the micro-channel cooler assembly may be referred to as outer capping layer portions (525 and 530) and a micro-channel cooler portion 410. The micro-channel cooler assembly (e.g., outer capping layer portions 525 and 530) is/are preferably drilled before performing a machined excision process and before surface finishing process(es) (e.g., a plating process). If a plating process is utilized for the purpose of providing a solderable surface for the LEDs and/or a wire bondable surface for the wires that attach to the LED bond pads on the preferable LED top-side, a machined polymer panel is preferably provided that allows for an o-ring groove (preferable utilizing the same aforementioned separator gasket/o-ring design) that allows the micro-channel cooler assembly to be clamped to the polymer block and put into a plating bath with out solution getting into the ID of the micro-channels. This process may also allow for a non-corrosive surface to be plated in regions that the anode and/or cathode bus bars 304a-b may be eventually clamped or soldered to in the end product. The LED driver PCBs 310a-b may also be edge plated for corrosion reduction and low voltage drop purposes.

The micro-channel cooler assembly could undergo a quenching or annealing or precipitation hardening process so that pure hardened copper (which has an approximately 10% higher thermal conductivity than Glidcop) could be used in the foil layers (e.g., foil layer 520). Pure copper would enhance solder wetting.

In an embodiment in which the diffusion bonded foil layers (e.g., foil layer 520) are oriented horizontally, the micro-channels of micro-channel cooler 410 may be etched in the same plane as the bottom of the LEDs (e.g., LED 531) so the primary inlet/outlet micro-channels (e.g., channel 411) can be etched or even machined in the foil layers. The internal micro-channels of micro-channel cooler 410 may be formed through all or substantially all of the diffusion bonded foil layers (e.g., foil layer 520) substantially as deep as the thickness of all the layers together and/or stopping near or at the bottom of the heat spreader layer 540 may be considered.

Turning now to the positioning of reflector 201, it is preferable that dielectric spacer layer 514, such as polyimide film, be placed between the bottom surface of the reflector 201 and the micro-channel cooler 410. This insulates the reflectors from the micro-channel cooler 410 both thermally and electrically, as well as provides a space for the wires (e.g., wire 530) from the LEDs (e.g., LED 531) to fit under the reflector 201 and have the crescent end of the wire affixed to the preferably gold containing plated copper foil layer 513 that is part of the flex-circuit assembly 510, which is directly bonded to the micro-channel cooler 410. As such in one embodiment, the dielectric spacer layer 514 is at least as thick as the thickness of the wires (e.g., wire 530).

Using an automated die bonder such as a Datacon, Austria, MRSI, USA with a tamping tool or even a capillary tool, the wires (e.g., wire 530) can be automatically tamped (bent) down in such a way as to lower the wire loop until it is substantially parallel (and perhaps even touching the foil layer on top of the polyimide layer before the crescent termination point) to the flex-circuit 510-polyimide/copper foil layer(s) (a/k/a conductive circuit material layer). The flattened wire does not touch the anode surface or the edge of the LED (e.g., LED 531) as a short could otherwise result. Other manual and/or automatic means may be considered, such as one long tamping tool that tamps all of the wires in one step, or the edge reflector itself with or without a dielectric coating could be employed for this tamping purpose. The primary purpose of this wire-bending step is to allow the reflectors to be placed in very close proximity to the LEDs (e.g., within at least a wire diameter) and to eliminate chafing, touching, or shorting to the reflector 201. The reflectors (e.g., reflector 201) may be preferably designed with a non-imaging software tool such as Photopia, USA. The reflectors may have different operational characteristics such as short to long working distances, or short to long depths of field. They should be easily replaceable such that they are modular and interchangeable and such that they provide the end user with the maximum in operational flexibility. In one embodiment, external dimensions of reflector 201 does not substantially change for reflectors configured for differing stand off distances. For example, as described further below, a reflector optimized for a 2 mm focal plane may have substantially similar external dimensions of a reflector optimized for a 53 mm focal plane.

The reflectors (e.g., reflector 201) may be injection molded from acrylic, polysulphone, polyolefin, etc. They may be coated with aluminum and/or silver with a dielectric enhancement layers at DSI, USA. They may also be extruded from a polymer or metal. It should be noted that monolithic reflector halves 201 running the length of the entire assembly of all the UV LED lamp head modules 200 placed end to end (serially in length) may be employed. These long reflectors could have polished and coated end cap(s) at each end. They could be 5-axis machined from 6061 Al and polished with diamond and a horse hair brush (as the reflectors may be polished) and coated with, for example, a single layer of MgF2 or $SiO_2$ optimized, for example (as all aforementioned examples) at 390-400 nm.

One skilled in the art could conceive of any length of LED array 330, reflector 201 and lamp body 305. As described above, one possible length of lamp body 305 is approximately 80 mm. This allows for approximately 60 45 mil per side LEDs or 68 40 mil per side LEDs, both preferably in two rows with about a 15 micron (range 5-50 um) gap (e.g., gap 532) between the two rows. A single row or multiple rows (from 1-n) LEDs may be considered. Even rectangular LEDs that have a longer length along the long-axis of the LED array may be considered. Along the long-axis, it is preferable to have less than a 25 micron (range 5-100 um) gap (e.g., gap 533). In one embodiment, center-to-center distances between LEDs of the LED array 330 are approximately 10 to 20 microns greater than the combined edge lengths of neighboring LEDs.

Embodiments of the present invention take into consideration the overall z-axis stack up of the metallic and dielectric layers of the flex-circuit 510 (minus the dielectric spacer layer 514), plus the wire layer thickness (diameter of each wire or thickness of each wire strip) running above the preferably cathode flex-circuit layer 513 and running to the rectangular-shaped cathode wire bond pad 534 shown beneath the ball bonds of the wires (e.g., wire 530) on the preferably top surface of the LEDs.

In one embodiment, the total z-axis stack up is not much thicker than the thickness of the LEDs (a/k/a the LED layer). In various embodiments of the present invention, the LED layer may have a thickness of approximately 145 microns and ranging from a thickness of approximately 250 microns or less, 200 microns or less, 150 microns or less, 100 microns or less, 50 microns or less to 25 microns or less.

In various embodiments of the present invention, in which the flex-circuit layer 510 includes the dielectric spacer layer 514, the flex-circuit layer may have a thickness of approximately 7.8 mil or less and ranging from a thickness of approximately 12 mil or less, 10 mil or less, 5 mil or less to 3 mil or less.

In various embodiments of the present invention, in which the flex-circuit layer 510 excludes the dielectric spacer layer 514, the flex-circuit layer may have a thickness of approximately 5.3 mil or less and ranging from a thickness of approximately 10 mil or less, 8 mil or less, 2.5 mil or less to 0.5 mil or less.

In one embodiment, the total z-axis stack up is not much thicker than the thickness of the LEDs (a/k/a the LED layer). In various embodiments of the present invention, the LED layer may have a thickness of approximately 145 microns and ranging from a thickness of approximately 250 microns or less, 200 microns or less, 150 microns or less, 100 microns or less, 50 microns or less to 25 microns or less.

In one embodiment, a bottom surface of the optical reflector 201 is between approximately 1-1.5× the thickness of the wire layer above a top surface of the light emitting device array layer. This allows reflector 201 to fit in close proximity to either or both the edge of the LEDs or in relation to the top surface of the LEDs, which thereby maintains irradiance by maximizing the number of emitted photons that are controlled by the reflector 201 and minimizing the number of emitted photons that escape the reflector 201 by going underneath the reflector 201. Locating reflector 201 close to the LED edge also allows for a more compact reflector in terms of height. This proximity of the reflector 201 to the LED array 330 also allows for a shorter length cathode layer 513 of the flex-circuit 510, which also allows the cathode layer 513 to be thin and still carry high current without too much impedance. The further the reflector edge gets from the LED, the taller the reflector needs to be according to commonly known optical principles. Although slightly higher irradiance could be achieved with taller reflectors, taller reflectors may be impractical in certain implementations.

Additionally, the flex-circuit 510 is inexpensive to manufacture and is very compact and thin, as such, it is well suited to usage in the context of embodiments of the present invention in which the overall z-axis stack up of the metallic and dielectric layers of the flex-circuit are desired to be minimized. Lenthor, USA, is an example of an excellent flex-circuit manufacturer. In one embodiment, flex-circuit 510 may extend beyond the micro-channel cooler assembly and may be connected (directly or indirectly) to external DC/DC and/or power supplies.

As described earlier, another novel feature of embodiments of the present invention includes the use of a preferably diffusion bonded (though the layers may be soldered or glued or brazed) preferably etched foil micro-channel cooler 410 that preferably has a high aspect ratio of at least one short laterally etched channel(s) (across the short direction (width) of the LED array 330) that may be in thermal parallel and preferably arrayed in a side-by-side fashion over a long length, in which the coolant flows across and underneath the LED array 330 in the direction preferably substantially parallel to the shortest dimension(s) of the array 330, usually the width not length dimension. In other embodiments, the coolant may flow in a direction along the length of the LED array 330 and/or cooler 410, and it may flow vertically (towards the bottom surface of the LEDs) in some areas. In one embodiment, many channels may flow underneath the bottom of the LEDs and very close to the bottom of the LEDs separated by only about 125 um of copper (range 1-1,000 um), plus a thin layer of solder that is used to bond the LED directly to the common anode substrate 317. Additionally, multi-directional etched coolant paths and orientations, individually or in groups, also described as internal heat transfer channels, running parallel, perpendicular, vertically, or horizontally, connected, or not connected, or some combination of both, oriented with respect to the length or width or some combination or both, of the LED array 330, and/or the bottom surface of the LED(s) may be considered.

According to one embodiment, the internal heat transfer channels may be oriented such that (i) two or more adjacent LEDs in the shortest dimension of the LED array have substantially independent heat transfer channels under each LED and (ii) the LEDs above these channels are cooled independently (i.e., the group of channels under each LED have substantially no convective communication with each other or with the group of channels under the adjacent LED). Hence, the two or more adjacent LEDs are said to be cooled in thermal parallel rather than in thermal series. Thermal series would result if the channel flow substantially directly underneath the LEDs was commingled or if a common channel flowed substantially directly underneath both LEDs.

The foil layers (e.g. foil layer 520) of the micro-channel cooler 410 are preferably substantially copper, and they preferably have around 1% (range 0.1-10%) of an interspersed ceramic material such as $Al_2O_3$ and known commonly as Glidcop, which is known to maintain its stiffness, strength and shape after being subjected to high diffusion bonding temperatures. Glidcop is now available having nearly the same thermal conductivity as pure copper.

In one embodiment, the micro-channel cooler 410 is constructed as a high aspect ratio device corresponding to the high aspect ratio of the directly mounted LED array 330. This is to say that the cooler 410 has a longer length on which the LED array 330 is mounted along, than it's width, and the cooler 410 itself often has many short channels side by side and with flowing coolant in a direction often parallel to the width of the LED array 330, and perpendicular to the long-axis of the cooler 410 (the largest dimension), and that may have 1-n channels located side by side to one another. Internal micro-channels may be oriented to form manifolds that are parallel, perpendicular, horizontal and/or vertical to either or both the long-axis (length) or the short-axis (width) of LED array 330. The foils (e.g., foil layer 520) are then preferably stacked on top of each other (or together) with each channel preferably located underneath the channel that is located on or in the foil immediately above the neighboring foil whether or not the foils are stacked in any vertical or horizontal or other angular or rotationally located orientation in a three dimensional space. In one embodiment, the LED(s) are mounted directly to the surface (e.g., a common anode substrate) formed by the edges (when the foils are stacked vertically) of a multiple diffusion bonded stacked foil laminate. It is preferable that the surface formed by the edges of the foil laminate be first made flat before LED array 330 is soldered to this surface.

As a non-limiting example, the LEDs could be mounted in two (1-n) rows across the width, and be on the order of 50 to 300 LEDs along the length of the row. The length of the row is preferably around 90% (10-100%) or more of the length of the cooler 410. That is the LED array 330 extends as close as possible to the edge of the micro-channel cooler 410. In this manner, there is no significant irradiance gap in serially connected UV LED lamp head modules 200. This configuration is most beneficial in the context of short working distances (~2 mm).

It is preferable that the internal micro-channels running beneath the LEDs of LED array 330 have approximately equal flow so that the junctions of the LEDs are approximately the same temperature. For some specialized applications the flow could be different in some channels to run LEDs hotter or cooler, especially if the LEDs are of differing wavelength as short wavelength LEDs may require more cooling. It should be noted that not all embodiments require 100% of the coolant running through the micro-channel cooler to run through heat transfer channels of the micro-channel cooler.

According to one embodiment, CFD is preferably employed to design the main inlet and outlet coolant manifolds formed in base of the body 305 to enhance or constrict coolant flow as needed to accomplish the aforementioned desirable nearly equal flow in the micro-channels. CFD is preferably conducted by MicroVection USA. Enhancement could be accomplished by making the channels deeper or wider or both, or conversely, constriction could be accomplished by making the channels shallower or narrower or both. All of these geometries could be three dimensional with simple or compound contours or nearly straight or sharp geometries. Again, speaking to the micro-channels, they could be of differing size, shape, depth, width, number, center to center spacing, number of etched foil layers, curves, protrusions, squiggles, gull-wings, etc. needed in order to balance flow and or reduce thermal resistance between the channels and the LED junctions.

Figure 6:
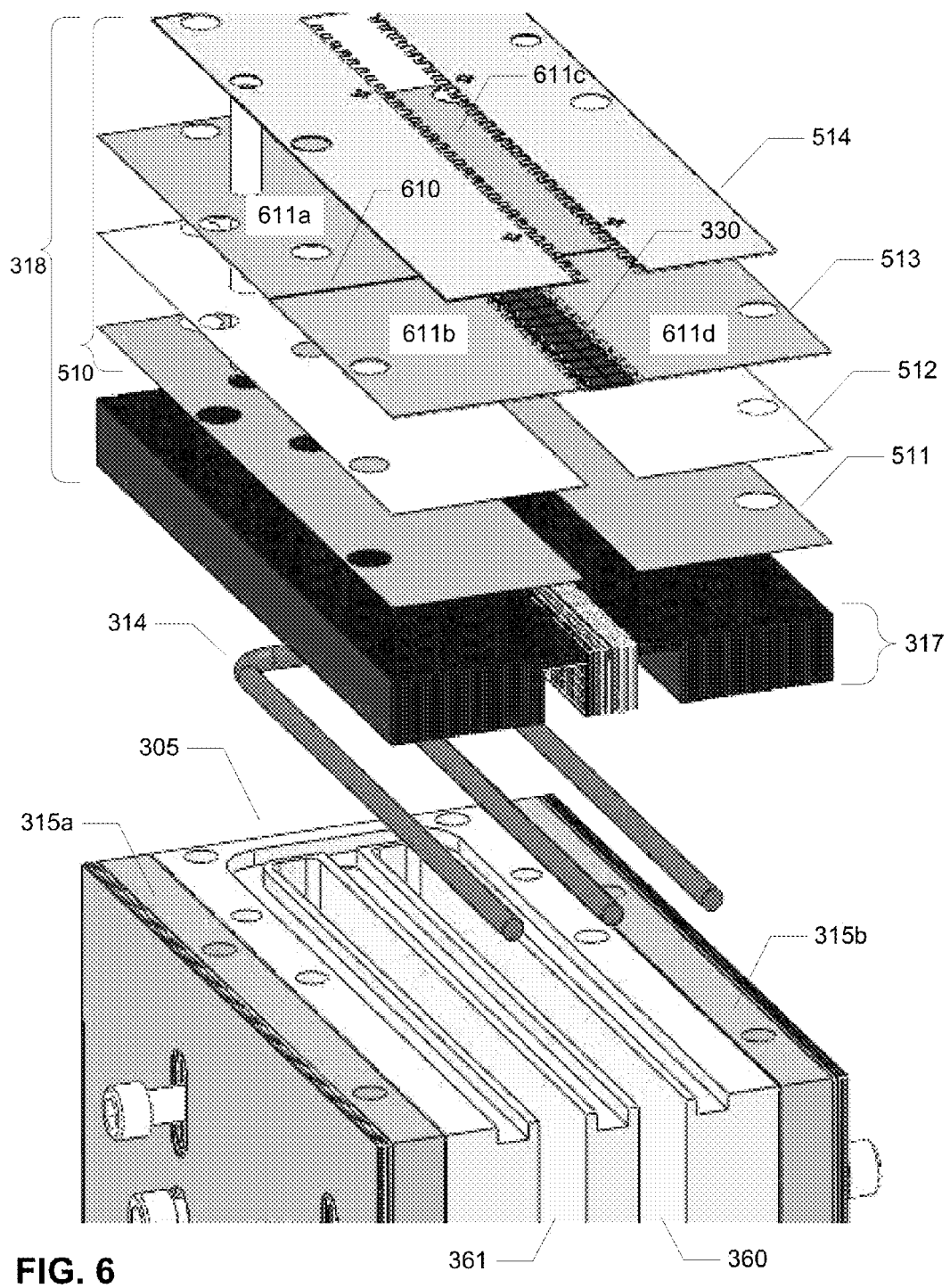
FIG. 6 is an exploded magnified isometric cut-away view of a top portion of a body of and illustrating various layers of the UV LED lamp head module of FIG. 2A.

FIG. 6 is an exploded magnified isometric cut-away view of a top portion of the body 305 of and illustrating various layers of the UV LED lamp head module 200 of FIG. 2. In this example, LED array package 318 includes the dielectric spacer layer 514, the cathode layer 513, the dielectric separator layer 512, the adhesive layer 511 and the common anode substrate layer 317. Flex-circuit 510 could also include an anode layer (not shown). As described above, layers 511-514 may collectively form a flex-circuit 510 from the Pyralux family of product. In one embodiment, the flex-circuit 510 may not include the dielectric spacer layer 514, which could be bonded to a bottom surface of the reflector 201 or simply be free floating between the bottom surface of the reflector or bonded to a top surface of the flex-circuit 510. In alternative embodiments, a rigid flex or rigid circuit with a rigid dielectric (e.g., FR4, ceramic, glass or the like) could replace flex-circuit 510.

In one embodiment, dielectric spacer layer 514 and dielectric separator layer 512 comprises a polyimide (e.g., Kapton, available from DuPont, USA), PEN or PET layer. The cathode layer 513 is preferably a copper foil. Cathode layer 513 and dielectric separator layer 512 preferably form an integrated layer of cathode foil and dielectric (which is known as "adhesiveless" in the Pyralux family of products available from DuPont, USA). As described above, these layers forming LED package 318 are pinched between cathode claws 320a-d and 321a-b and anode body 315a-b.

One design choice is binning individual UV LED lamp head modules (which when forming serial arrays would typically require connecting lamps within the same bin) versus binning LEDs within UV LED lamp head modules. Having the capability to bin within individual UV LED lamp head modules means one need not bin individual lamps. As noted above, in one embodiment in which binning is performed within the UV LED lamp head module 200, flex-circuit 510 (e.g., comprising an electrically isolated (segmented) cathode layer 511, dielectric separator layer 512 and dielectric spacer layer 514) is employed to potentially individually address each LED of the LED array 330, or groups of LEDs so that the LEDs may be binned for Vf, wavelength, size, power, etc. in groups from 1-n, thereby substantially lowering the demands on the LED manufacturer(s) to supply LEDs in just one or a few bins. According to one embodiment, the bins can be about 0.1 Vf or less—and most preferably 0.05 Vf or less, or even 0.01 Vf or less. Depending upon the particular implementation, the LEDs of LED array 330 could be in just one or two large Vf bins, such that one or two long strips of LEDs in the arrays are from the substantially same Vf bin. Conversely, the bins could be as tight as 0.00001 Vf. In this example, segmentation of the flex-circuit layer 510 and or the LED driver PCBs 310a-b could be reduced or even eliminated. This may be accomplished when very large volumes and or large LED chips are produced and there are substantial numbers of LEDs available from the manufacturers in Vfs that are close to 0.001 Vf or less.

However, the segmentation of the LED driver PCBs 310a-b and flex circuit 510 allows numerous options to bin by Vf values, or not at all. In the present example, the LEDs of LED array 330 are divided into eight individually addressable groups by locating them within eight flex-circuit segments (four of which are visible in the present view, i.e., segments 611a-d). In one embodiment the segments 611a-d are formed by photolithigraphically patterning the cathode layer 513 and etching away the metal foil to form electrical isolation traces (e.g., electrical isolation trace 610). Dielectric layer 512 in the area below the LEDs is removed by laser machining, routing or stamping.

In general, the most suitable UV LED wavelengths are in the range of about 360-420 nm, and most preferably ~395 nm. It should be noted that a mix of wavelengths may be use in each UV LED lamp head module 200 and smaller groups and/or even individual LEDs or some combination of both, may be individually addressed by wire bonding to an individual conductive stripe (not shown) of cathode layer 513 (patterned conductive circuit material layer) on flex-circuit 510, the conductive stripe (conductive circuit material layer) being preferably photolithographically imaged and etched with a preferably polyimide (non-electrically conductive layer a/k/a dielectric layer) beneath it. The cathode layer 513 is usually copper.

According to one embodiment, separator gasket 314 (e.g., monolithic o-ring 420) fits in a groove machined or molded into the body 305. As depicted in the present example, the groove (or gland) shape machined into the body 305 may be roughly described as an "o" with tight radiuses in the corners and a portion running through the middle of the gasket in the long axis direction. This preferably single-plane gasket design is made possible by the unique foil layer design in which the etched internal passages of the micro-channel cooler 410 for coolant are found only in the portion that lies substantially under the LED array 330, and not in the portions around the areas that fall substantially under the heat spreader peripheral regions. This allows the bottom of the preferably monolithic micro-channel cooler assembly to be flat and substantially parallel to the mating portion of the lamp body 305 that contains the groove for the separator gasket 314.

The peripheral regions of the micro-channel cooler assembly noted above are best explained as the regions that substantially exist outside of the coolant flow areas and/or the regions that exist under the preferable "o" cross-section seal. A benefit of this design is that multiple seals or a seal with differing z-axis planes is avoided. In essence, a three-dimensional (z-axis on two or more planes) configured seal is not needed as a more simple planar two-dimensional (z-axis on one plane) seal will suffice. The diffusion bonded foil layers (e.g., foil 520) are etched with not only heat transfer passages before diffusion bonding, but also the primary inlet/outlet micro-channels (e.g., primary outlet micro-channel 411) may be etched in an embodiment of the instant invention. Thus, when the foils 520 making up the micro-channel cooler 410 (e.g., 200 micron thickness) and the foils making up the portion of the micro-channel cooler 410 typically having no heat transfer passages (e.g., solid capping layer 530 and etched capping layer 525) are bonded together, a monolithic micro-channel cooler assembly (including micro-channel cooler 410) results that has a flat bottom side that is used to compress the uniquely shaped seal that exists between the preferably monolithic micro-channel cooler assembly and the preferably monolithic lamp body 305.

Not shown is an optional monolithic diffusion bonded heat spreader layer (e.g., approximately 0.5 mm thick (range 0.1 to 1 mm)) that may span the top surface of common anode substrate 317.

Figure 7:
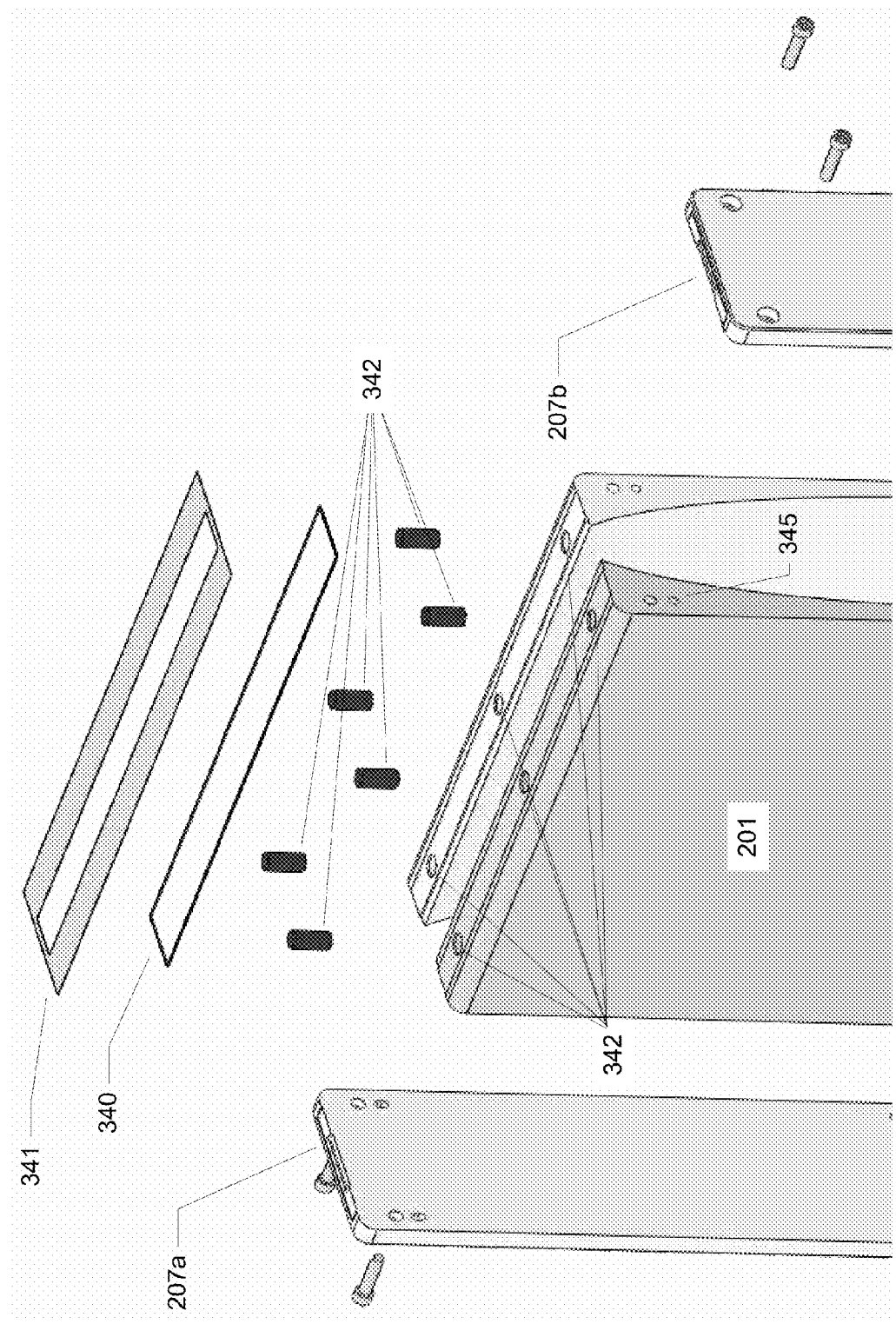
FIG. 7 is an exploded magnified isometric cut-away view of a top portion of a reflector of the UV LED lamp head module of FIG. 2A.

FIG. 7 is an exploded magnified isometric cut-away view of a top portion of a reflector 201 of the UV LED lamp head module 200 of FIG. 2. According to one embodiment, the reflector 201 is about the length of LED array 330, preferably a few mils longer, and the reflector could include end caps 207a-b. End caps 207a-b may be affixed to reflector 201 with screws and/or magnets (not shown).

In one embodiment, very long reflectors may be employed such that 80 mm lamp module sections are arrayed end-to-end yet the reflectors are monolithic and as long as perhaps all of the multiple 1-n lamp modules affixed end-to-end. This affixing could be done to a common rail like assembly.

It should be noted that in UV LED curing systems including multiple lamp head modules, reflector 201 could be used in conjunction with mini-reflectors (as described further below) located in the area between the lamp head modules, and more particularly, in the area located between the respective ends of the LED array on each adjoining lamp head module.

In one embodiment, a field replaceable window 340 covers the output opening of the reflector 201. Window 340 is preferably made from a borosilicate glass with a wide angle UV or visible AR coating. Window 340 may be attached to reflector 201 with one or more magnets 342 if iron containing strip(s) (e.g., window mount 341) are placed on top of window 340. The magnets 342 are preferably placed in corresponding pockets 342 in the reflector 201. Of course, alternative means of affixing window 340 to reflector 201 may be considered such as 90 degree angle bars wherein one portion wraps around and clamps on the glass, and a slotted portion orthogonal to the clamping surface contains screws that are located in the side of the reflector 201. In one embodiment, window mount 341 is recessed into the top surface of reflector 201 to provide alignment and location. In some embodiments, window mount 341 may be attached to reflector 201 with screws.

In one embodiment, serial connection of multiple UV LED lamp head modules 200 may be facilitated by including orthogonally oriented (with respect to magnets 342) steel pins or magnets in holes 345. Alternatively, the magnets or steel pins (not shown) could be located within mini-reflectors (not shown).

Figure 8:
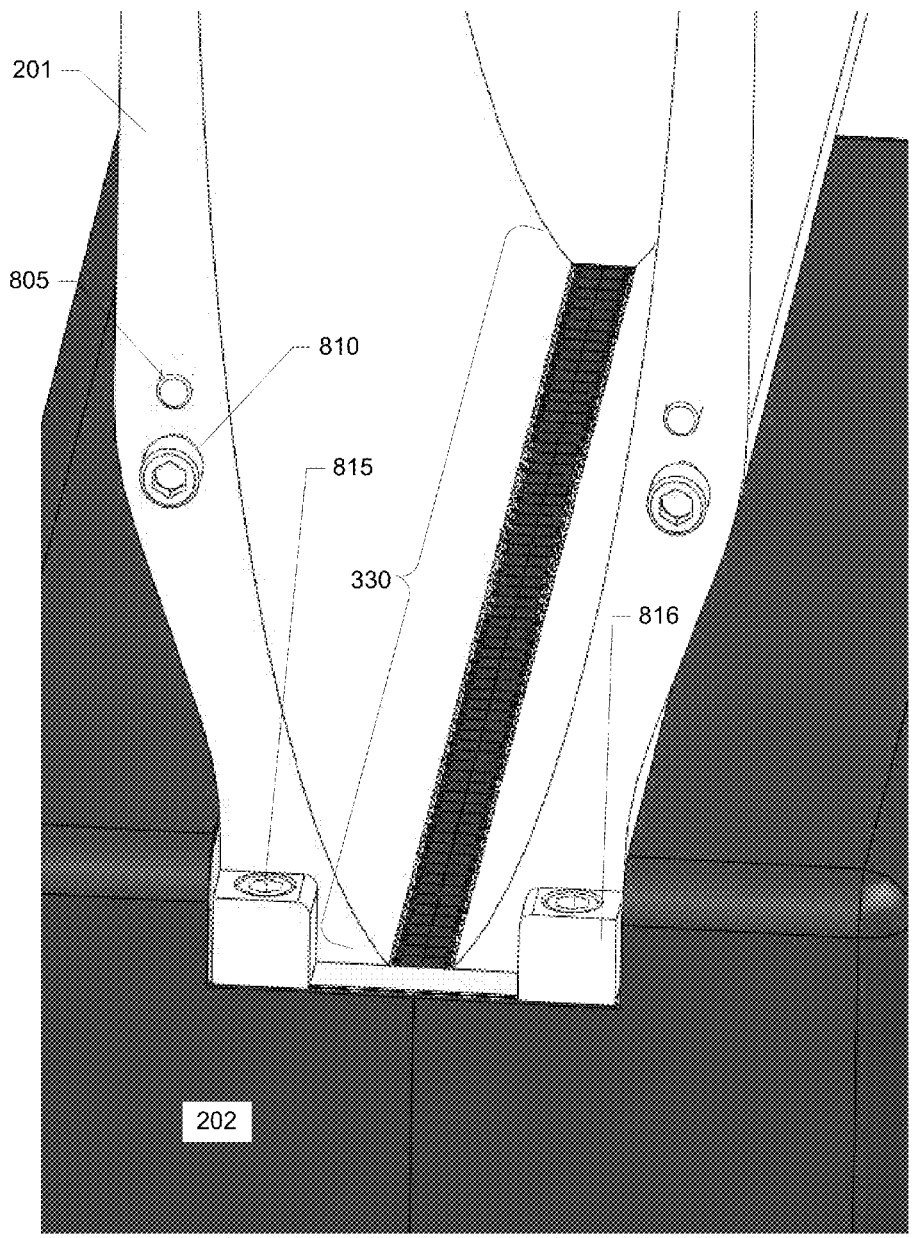
FIG. 8 is a magnified isometric view of a reflector of the UV LED lamp head module of FIG. 2A with the end cap removed.

FIG. 8 is a magnified isometric view of a reflector 201 of the UV LED lamp head module 200 of FIG. 2 with an end cap removed. This view is intended to illustrate the modularity of reflector 201. In this example, two of four screws 815 are shown that affix the reflector 201 to the lamp body 305. By simply removing these screws 815, a new reflector with different optical properties can be substituted in place of reflector 201. In the current example, integral injection molded feet (e.g., foot 816) may be used as alignment features for mini-reflectors (discussed below) or end caps. Steel screws 815 could be used to orient, align and/or hold such mini-reflectors in place if, for example, the mini-reflectors contained magnets (with their magnetic fields oriented properly with respect to the screws 815).

Also, locating pins or mated male/female features that extend from the bottom of the reflectors into the micro-channel cooler 410 or vice versa may be employed for ease of alignment of the reflector 201 with respect to LED array 330. These pins or mating features may be part of the injection molded reflector.

In one embodiment, locating pins, such as pin 805, could be used to align mini-reflectors or end cap reflectors. Screws 810 could be used to affix end cap reflectors to reflector 201.

Protective housing 202 is shown that preferably injection molded and each half may be a mirror image of the other.

Figure 9A:
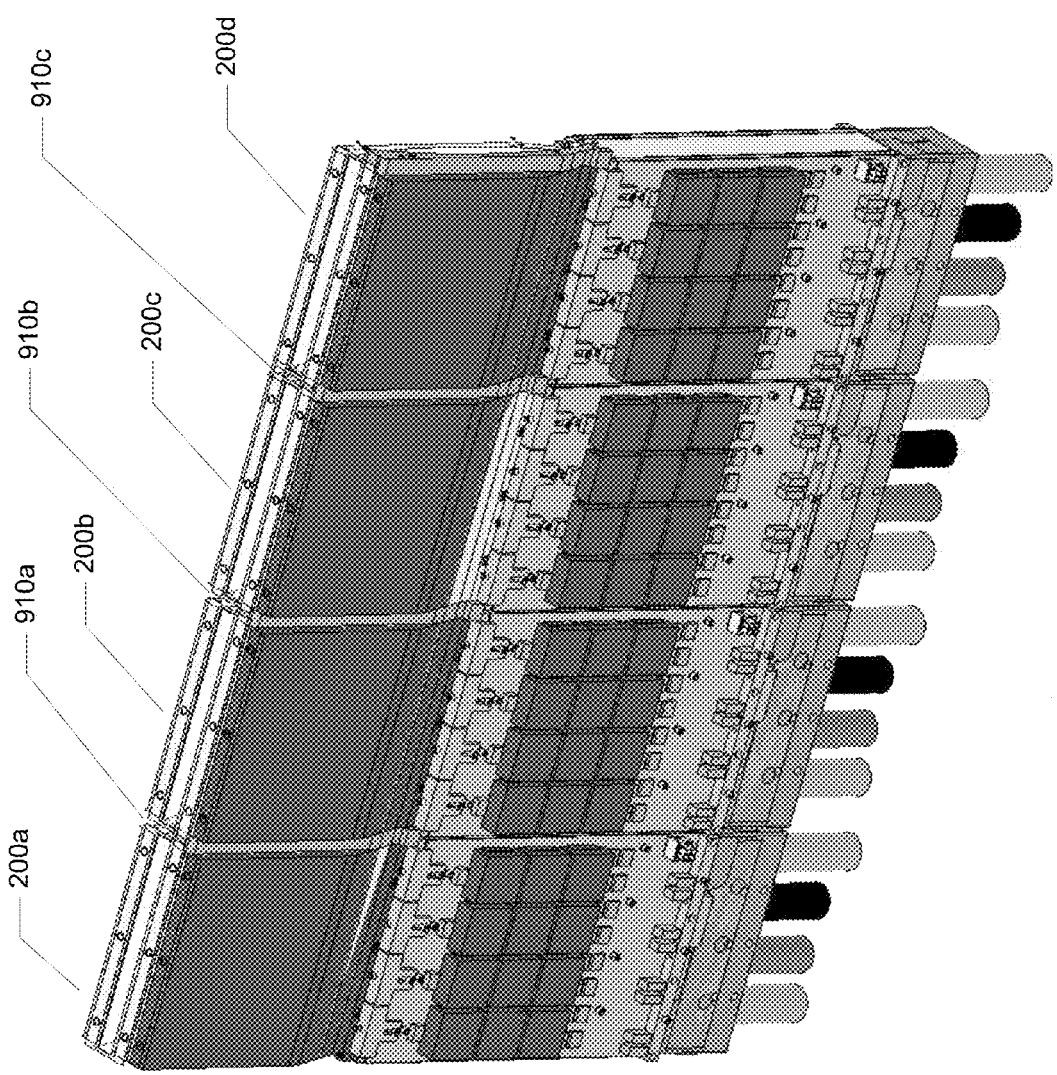
FIG. 9A and FIG. 9B are an isometric view and an exploded isometric view, respectively, of four interconnected UV LED lamp head modules in accordance with an embodiment of the present invention.
Figure 9B:
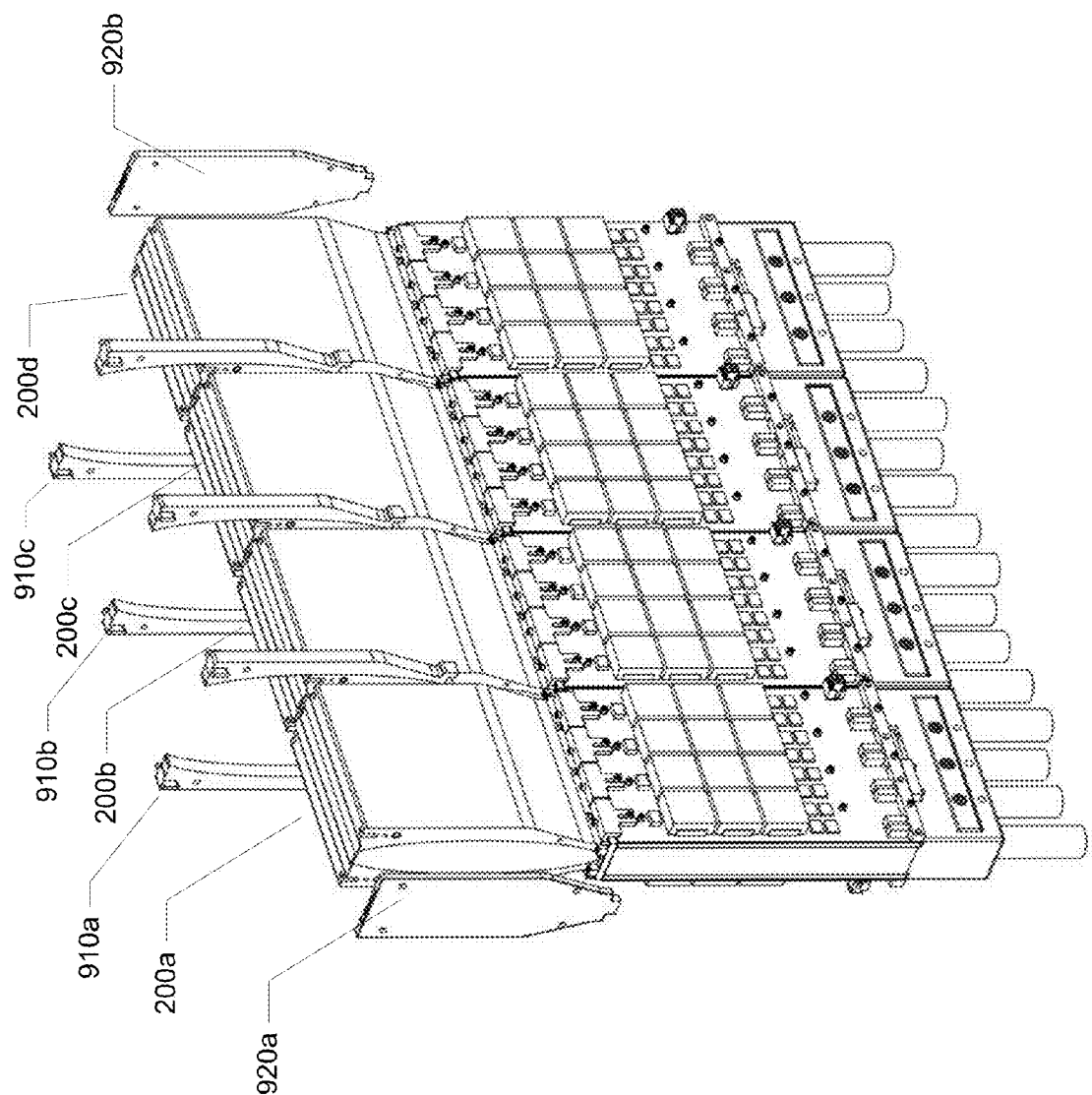

FIGS. 9A-B are isometric views of four interconnected UV LED lamp head modules 200a-d in accordance with an embodiment of the present invention. In one embodiment, each UV LED lamp head modules 200a-d may be designed to be mounted to a common mounting rail (not shown), associated with a customer's UV curing apparatus or machine. To facilitate the serial length-wise integration of UV LED lamp head modules 200a-d (from 1 to n in number) mini-reflectors (e.g., mini-reflectors 910a-c) are provided to allow for the ability to obtain an essentially contiguous beam pattern on the work piece with essentially no discernable irradiance loss in the area between each UV LED lamp head module 200a-d (e.g., the area below mini-reflector portion 910a-c on the work piece surface). Because photons can exit an LED at any angle, it is possible for a photon to traverse the entire length of serially connected UV LED lamp head modules before exiting the window.

The window(s) 340 could have a physical gap in length (e.g., every 320 mm assuming 4 80 mm length UV LED lamp head modules 200). In an alternative embodiment, windows 340 could be 80 mm long as such there would be three gaps in 320 mm, each of which could be covered by a separate mini-window (not shown). The separate mini-windows could be installed over these physical gaps and be affixed via a magnetic strip (not shown) or other mechanically fastened strip and result in a dust or foreign material ingress prevention. Other manufacturers use an index matching fluid or adhesive; however, as mentioned previously, these materials (available from Schott, Germany and Dow, USA) can yellow or degrade. In one embodiment, one or both of separate mini-windows and reflective index matching fluid and/or adhesive may be employed.

The major and mini-reflectors could be affixed to each other with their own mini slotted rail that could run between each main reflector with the mini reflector underneath the rail and between the major reflectors. The major reflectors are defined as the longest portions of the reflector halves that exist in the assembly considered for various applications. Long assemblies for wide format printing and flooring, and short reflectors for applications such as surgical mask component adhesive curing may be considered.

In connection with interconnecting multiple UV LED lamp head modules, intervening end-caps are removed and mini-reflectors (e.g., mini-reflectors 910a-c) are inserted in place thereof between the UV LED lamp head modules to be serially connected. The mini-reflectors 910a-c serve to create uniform irradiance pattern on the work piece and avoid areas lacking in irradiance, which would otherwise create a difference in peak irradiance along the length of the projected beam on the work piece when serially connected UV LED lamp head modules 200 are employed. This could have deleterious process effects.

In order to provide this essentially uniform irradiance between LED lamps, several novel means may be considered. Firstly, the reflector end-caps between the lamps may be removed. The distance between the two LED arrays may be ~6 mm, range 0.1-100 mm. Small ~6 mm reflector subsection(s) (e.g., mini-reflector 910a-c) could be placed between the two main reflectors, the mini-reflectors 910a-c may have substantially the same shape as the main reflectors. As described above, the mini-reflectors 910a-c may also have locating pins, screws, tie-bars and/or beams (not shown) in the perpendicular plane (across the opposite-side reflector halves) and/or parallel planes (parallel to the same-side reflector halves and serving to connect them together). Small tie-bars (not shown) that are screwed in place may be strategically placed between the reflector halves for purposes of mechanical rigidity and separator gasket 314 or o-ring 420 loading. These tie-bars, if used, should be of a stiff, high modulus material with minimal cross section exposed to the photons emitted from the LEDs. This will minimize any impact that the tie-bars may have on the projected beam and its ultimate irradiance uniformity on the work piece, as one would like to avoid interrupting or blocking the trajectory of emitted photons as much as is practically possible. The reflectors (e.g., reflector 201) are preferably two separate halves that are affixed to the micro-cooler assembly with their polished and curved portions facing each other, and they may have locating pins and it may be easy to interchange reflectors with screw attachment (e.g., screw 815), so that different reflectors with differing optical properties may be easily interchanged between lamp assemblies. Alternatively, the mini-reflectors 910a-c could be screwless (fastenerless) and magnetic holding cylinders could be employed to mechanically couple the mini-reflectors 910a-c to the main reflectors 200a-d. Additionally, a magnetic (e.g., a laser-cut steel) strip (e.g., window mount 341) that holds the window in place could have locating pins (not shown) that could be molded into the top surface of the reflector and poke through holes in the window mount 341 and serve to locate the output portions of all the reflectors in an essentially contiguous straight line. FIG. 7 shows that window mount 341 is recessed into the top surface of reflector 201 to provide additional alignment and location. The mini-reflectors may be attached to lamp body 305 via screws.

Figure 10A:
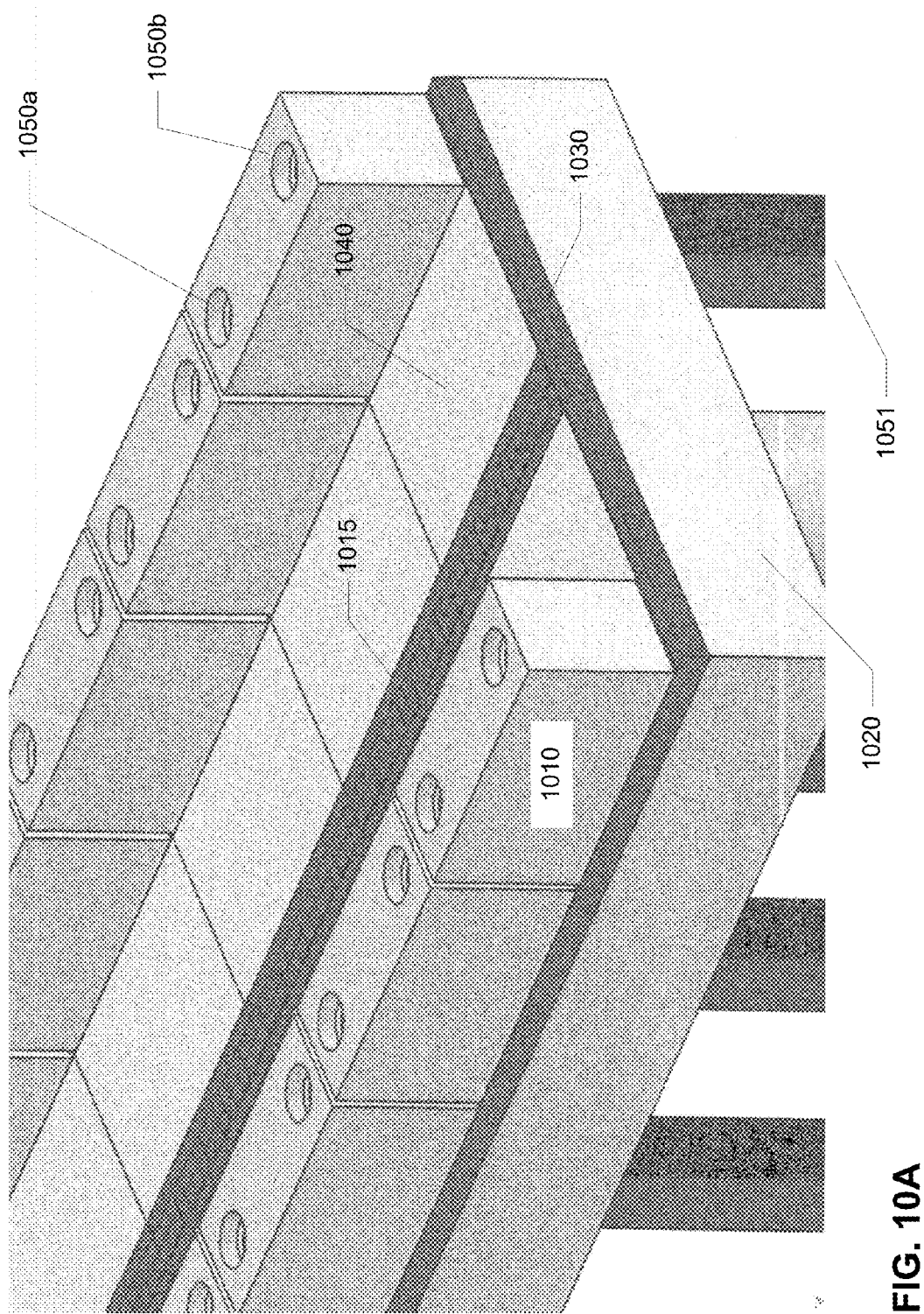
FIG. 10A is an isometric view of an alternative embodiment of an LED array package and heat spreader.
Figure 10B:
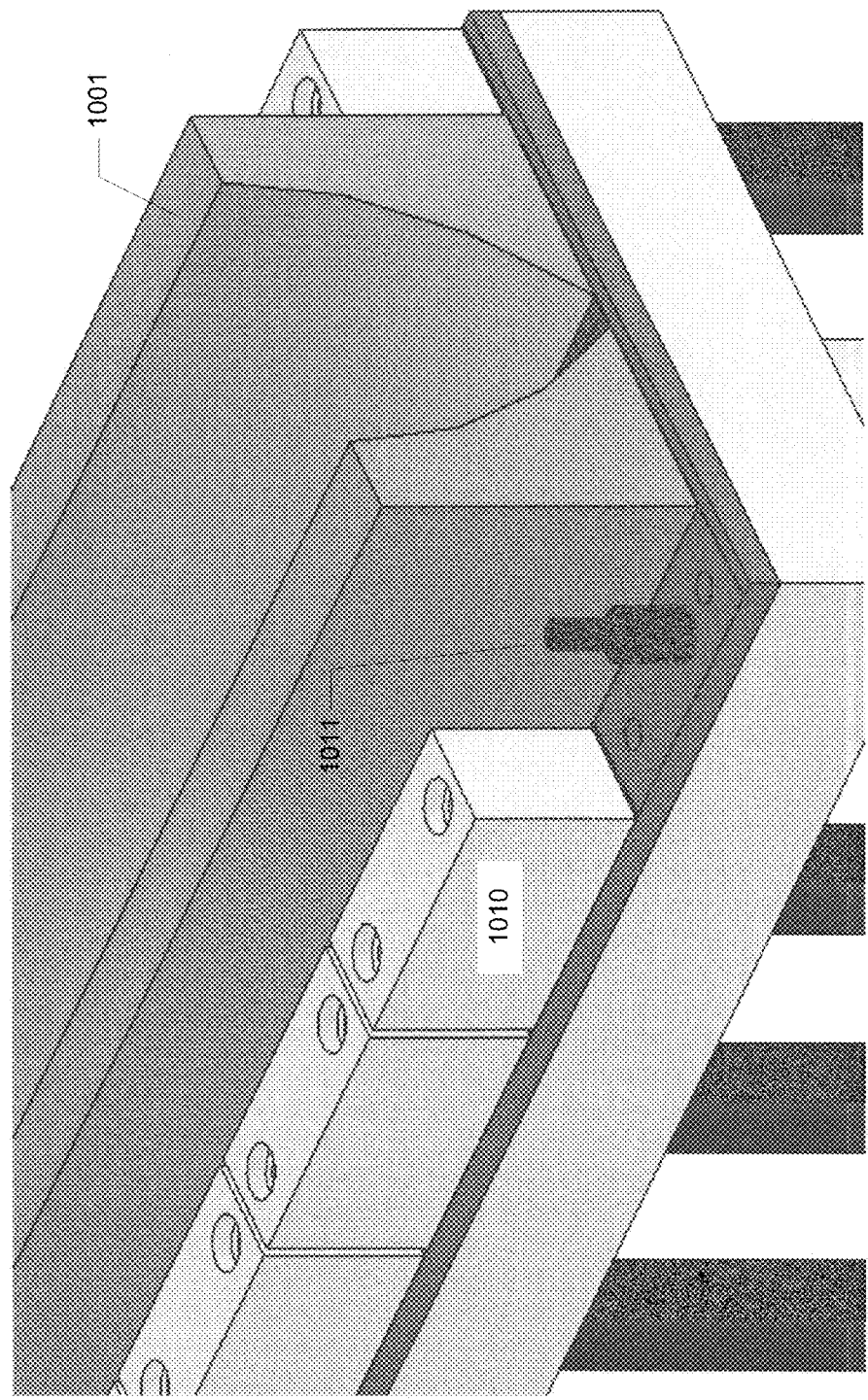
FIG. 10B is an isometric view of an alternative embodiment of an LED array package and heat spreader with a macro-reflector in accordance with an embodiment of the present invention.
Figure 10C:
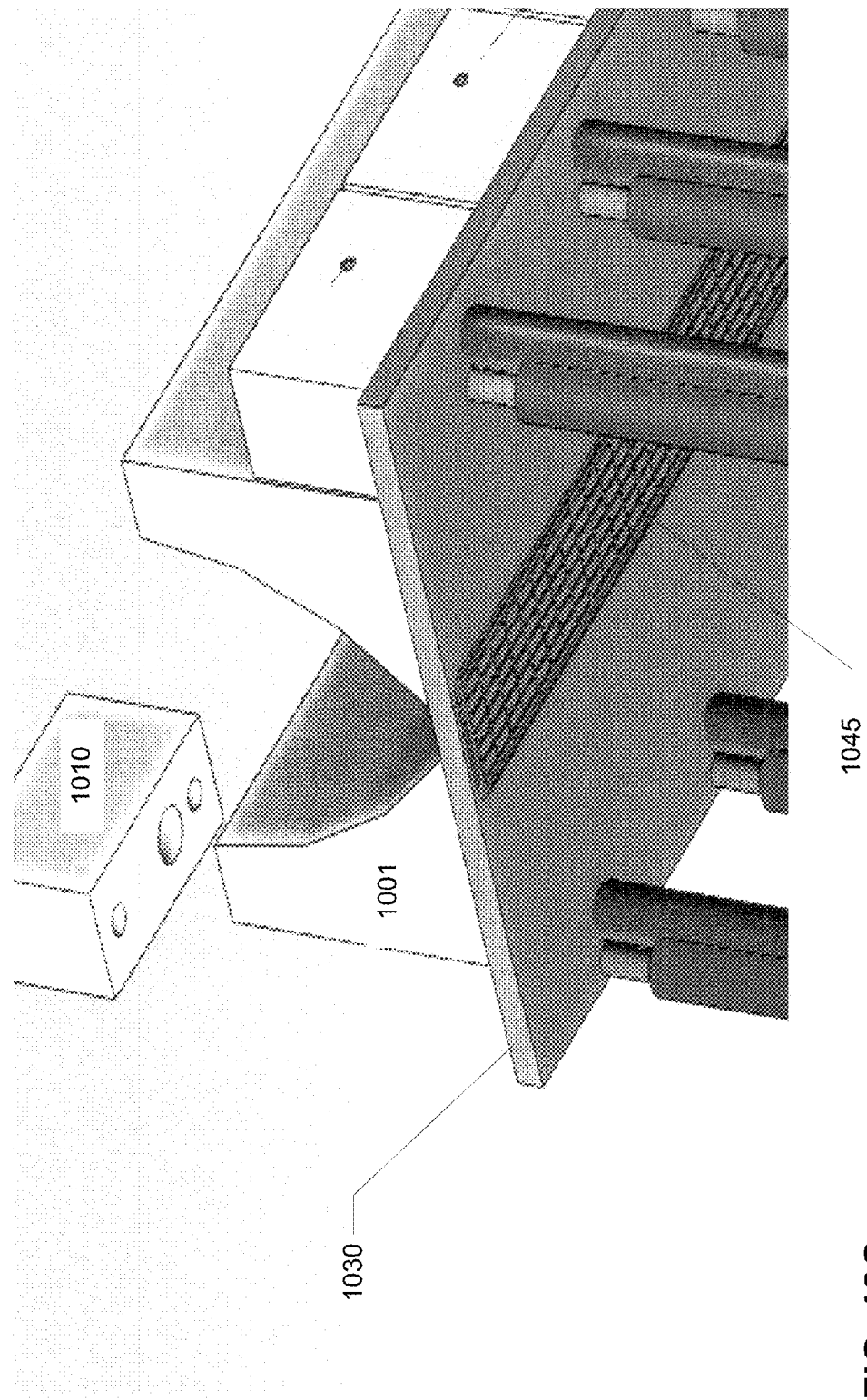
FIG. 10C is an isometric view depicting the bottom-side of the heat spreader of FIGS. 10A and 10B.

Turning now to FIGS. 10A-C an alternative embodiment of an LED array package (e.g., an LED array 1015 coupled to a flex-circuit (not shown) and a heat spreader layer 1030) is now described. This alternative embodiment is provided to illustrate, among other things, that the pinching/clamping function of cathode claws 320a-d and 321a-d can be accomplished with connectors having differing geometries. In the present example, cathode bus bars, e.g., cathode bus bar 1010 and monolithic anodic lamp body 1020 are pinching/clamping the anode heat spreader layer 1030 and the cathode flex-circuit layer 1040 together. Additionally, holes, e.g., holes 1050, may be formed in these layers to allow anode and cathode wires 1051 to pass there through, or conductive screws with or without a dielectric sleeve.

In one embodiment, massively parallel (e.g., substantially all LEDs of the LED array are electrically paralleled) high current density UV LEDs (SemiLEDs, USA) may be directly mounted on a common copper anode plate 1030. Individual or groups of LEDs may be addressed by flex-circuit (which aids in manufacturing flexibility with regards to binning requirements for Vf, power, wavelength, etc.). A high aspect ratio LED array (with a length longer than width which allows for a narrow concentrated output beam), high-fill-factor array (which allows for conservation of brightness), modular macro-reflectors (which controls a much higher percentage of photons than micro-reflectors and allow end user flexibility for applications from close to far working distances, power densities, and depth of field). In one embodiment, a two sided rectangular opposing elliptical reflector shape (wherein the center portion is wider than the input and output apertures) allows for a very tightly focused beam.

Anode substrate 1030 is bolted to a replaceable lamp body 1020 that has at least one liquid flow channel (e.g., channels 1045) that has a high heat transfer coefficient for low thermal resistance (this allows the LEDs to be operated at high current in a high fill-factor array). Additionally the anode plate 1030 (a/k/a sub-mount) is attached to the lamp body (a/k/a lower heat sink segment which may be machined or injection molded) in a "clam shell" arrangement (affording an easy means of sealing by compressing the formed o-ring (e.g., o-rings 420*a-c*) (Apple Rubber Products, USA) and low thermal resistance as the liquid coolant can intimately contact the anode plate 1030.

Individual cathode bus bars (e.g., cathode bus bar 1010) are bolted through the anode substrate 1030 making electrical contact with the cathode flex-circuit 1040 and at the same time holding the anode 1030 tightly to the lamp body 1020 and/or anode bus bar (in effect the anode plate 1030 with the cathode flex-circuit 1040 is "pinched" between the lower anode bus bar 1030 and upper cathode bus bar 1010—the lower anode bus bar 1030 actually is the anode substrate 1030 of the LED driver boards (not shown).

In one embodiment, a Kapton (dielectric) spacer layer between reflector 1011 and cathode flex-circuit foil 1040 allows for the wires (not shown) that connect the LEDs to the cathode foil 1040 to be bent under and "clear" the long (rectangular shaped) reflector edge. It also electrically isolates the reflector if the reflector should be aluminum or have a metallic coating such as silver, groups of LEDs are powered by their own driver chips, such as LM 3433 (National Semiconductor, USA), which are part of DC/DC power supplies (allowing for driving the groups with varying power, most due to varying Vf bin). In some embodiments, power supplies that go directly from AC to DC output in the 4-5V range can be considered.

In one embodiment, no significant number of LEDs are connected in series (thus a single LED failure cannot bring down a whole string and electrically inefficient load balance resistors are not needed). The bottom of the anode plate 1030 has chemically etched channels 1045 for coolant flow (thus allowing lower thermal resistance), having a lead-free (tin containing solder) on the backside (bottom) of the chip allow for simple and highly reliable vapor phase reflow (to insure that the large number of LEDs are uniformly bonded to the anode plate 1030).

In one embodiment, the vapor phase reflow process involves use of a vapor phase oven. In one embodiment, a tacky flux (Tack-Flux 7 available from Indium Corporation, USA) is used to tack the LEDs of the LED array in place prior to placing the micro-channel cooler assembly in the vapor phase oven. A vapor phase oven uses an inert liquid that when heated creates a very stable uniform heat transfer medium in the form of vapor. This medium replaces heat energy very quickly and transfers heat to the micro-channel cooler assembly by condensing this heated vapor. The maximum temperature that the micro-channel cooler assembly reaches is tied to the boiling point of the inert liquid. The boiling point must be higher than the solder melting temperature. A very isothermal temperature is reached across the entire micro-channel cooler assembly thereby creating one of the most reliable and repeatable solder reflow processes known.

Molded polymer screws can attach the cathode bus bars 1010 to the anode substrate 1030 through holes in the anode plate 1030/flex-circuit assembly 1040 (thereby eliminating any worry of shorting due to their polymer nature and they are low cost due to the use of molding), very flexible ultra-high strand count wire 1011 (CableCo, USA) may be used to carry the current to the LEDs (thereby reducing resistivity and strain). Very flexible coolant tubing may be placed into holes in the lamp body 1020 (lower heat sink) at opposite ends of the lamp (allowing longitudinal coolant flow, compact assembly, and low stress connections).

FIG. 10B Illustrates the alternative LED array package of FIG. 10A with a macro-reflector 1001 in accordance with an embodiment of the present invention. In this view, one cathode bus bar 1010 is removed to show a cathode wire 1011 coming up through the assembly to make contact with the removed cathode bus bar (not shown).

FIG. 10C is an isometric view depicting the bottom-side of the heat spreader layer 1030 of FIGS. 10A and 10B. This view depicts the removed cathode bus bar 1010 and micro-channels 1045 etched into the bottom surface of heat spreader layer 1030 to facilitate heat transfer through heat spreader layer 1030 by effecting the flow of coolant flow (e.g., via coolant fluid turbulation).

Figure 10D:
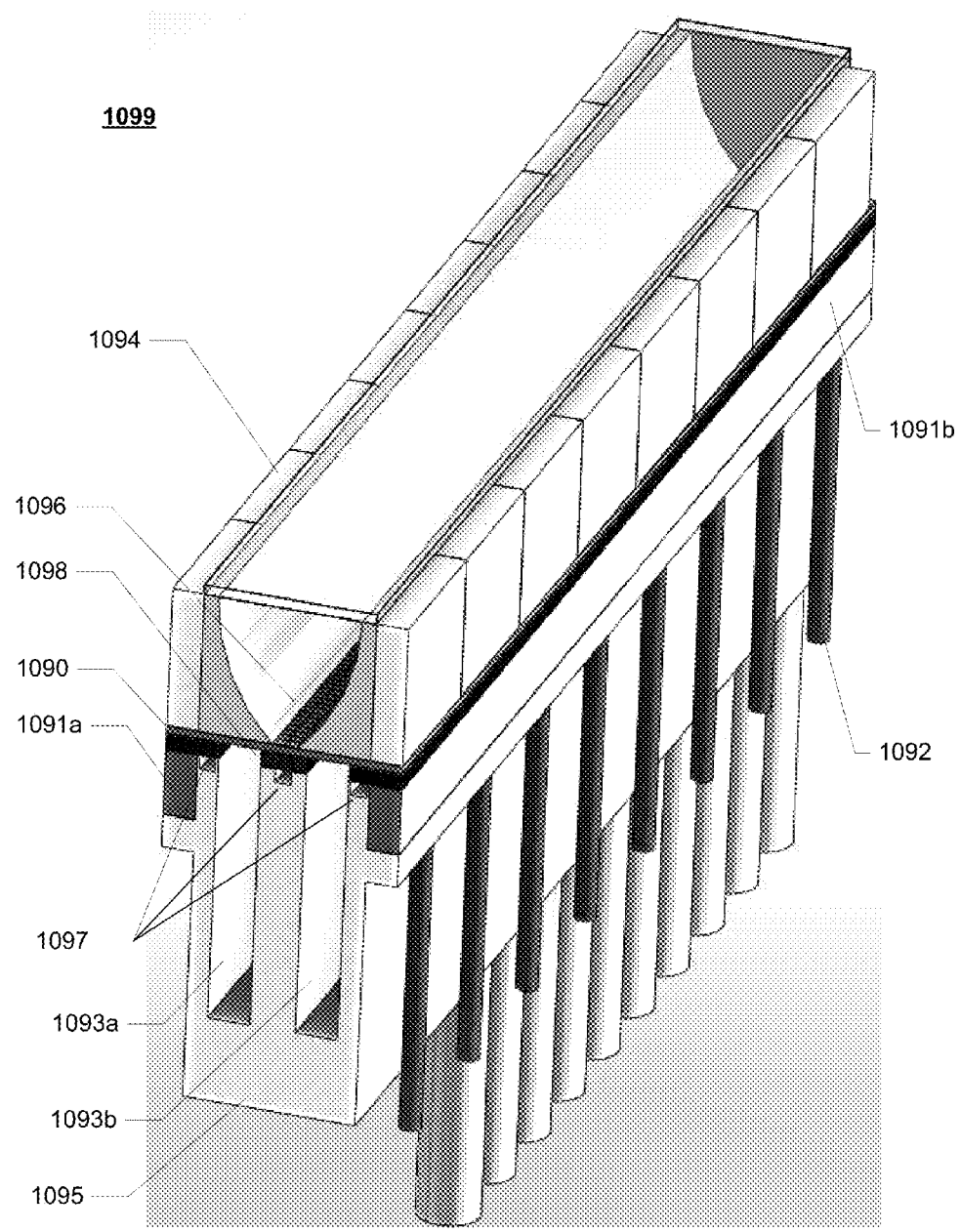
FIG. 10D is an isometric cut-away view of an alternative embodiment of a UV LED lamp head module.

Referring now to FIG. 10D an alternative embodiment of a UV LED lamp head module 1099 is now described. This alternative embodiment is provided to illustrate, among other things, an alternative configuration of an etched foil sheet micro-channel cooler 1098, heat spreader layer 1090 (approximately 0.5 mm thick), anode bus bars 1091*a-b*, cathode bus bars (e.g., cathode bus bar 1094), deep and long primary coolant inlet and outlet channels 1093*a-b* within lamp body 1095, and a single-plane separator gasket 1097. In this example, rather than having integrated LED drivers, wires (e.g., wire 1092) are provided to individually address LEDs of LED array 1096. In alternative embodiments, the wires could be replaced with flex-circuit (not shown) to address individual groups of LEDs.

Figure 10E:
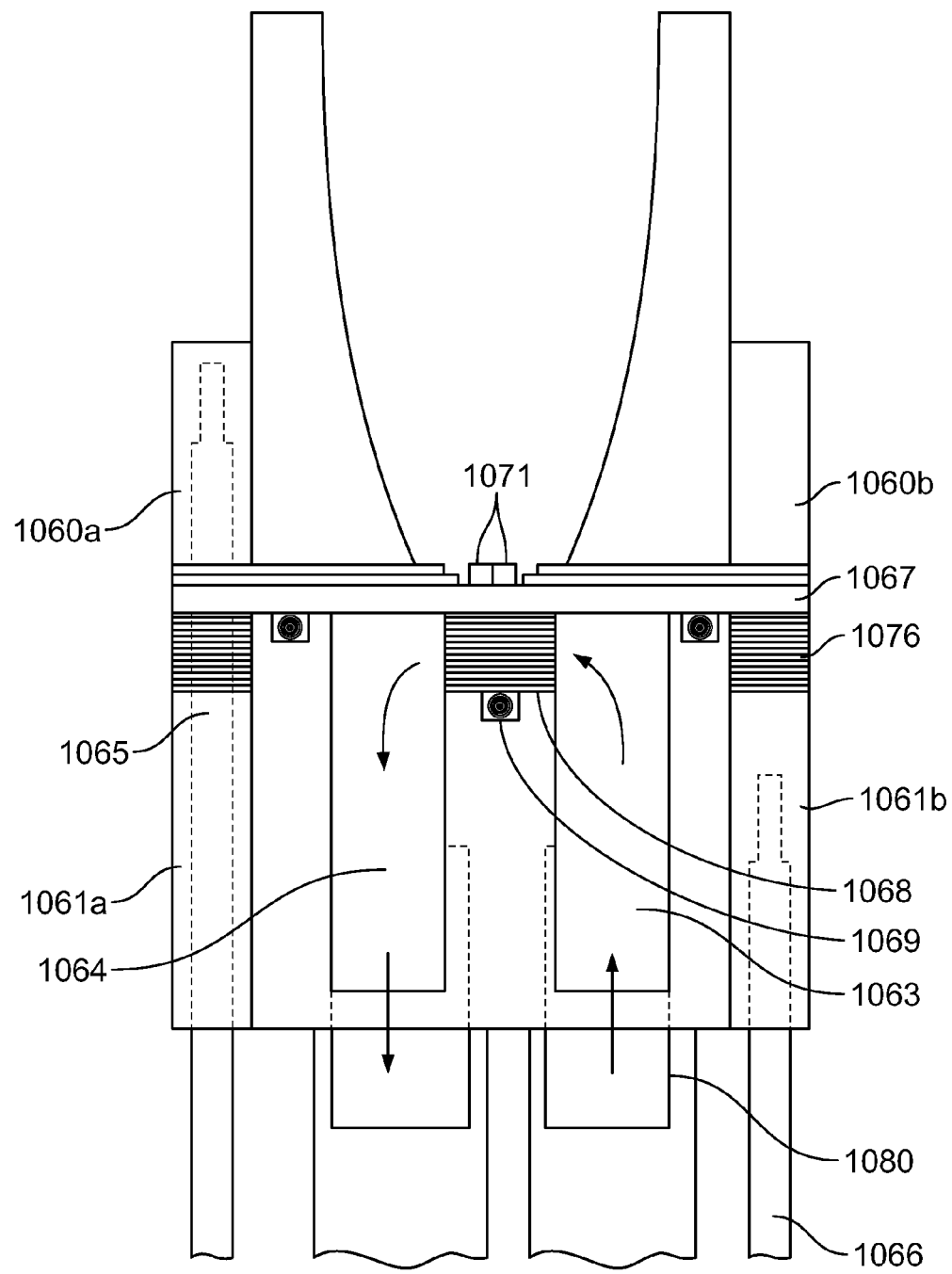
FIG. 10E is a front cut-away view of yet another alternative embodiment of a UV LED lamp head module.
Figure 10F:
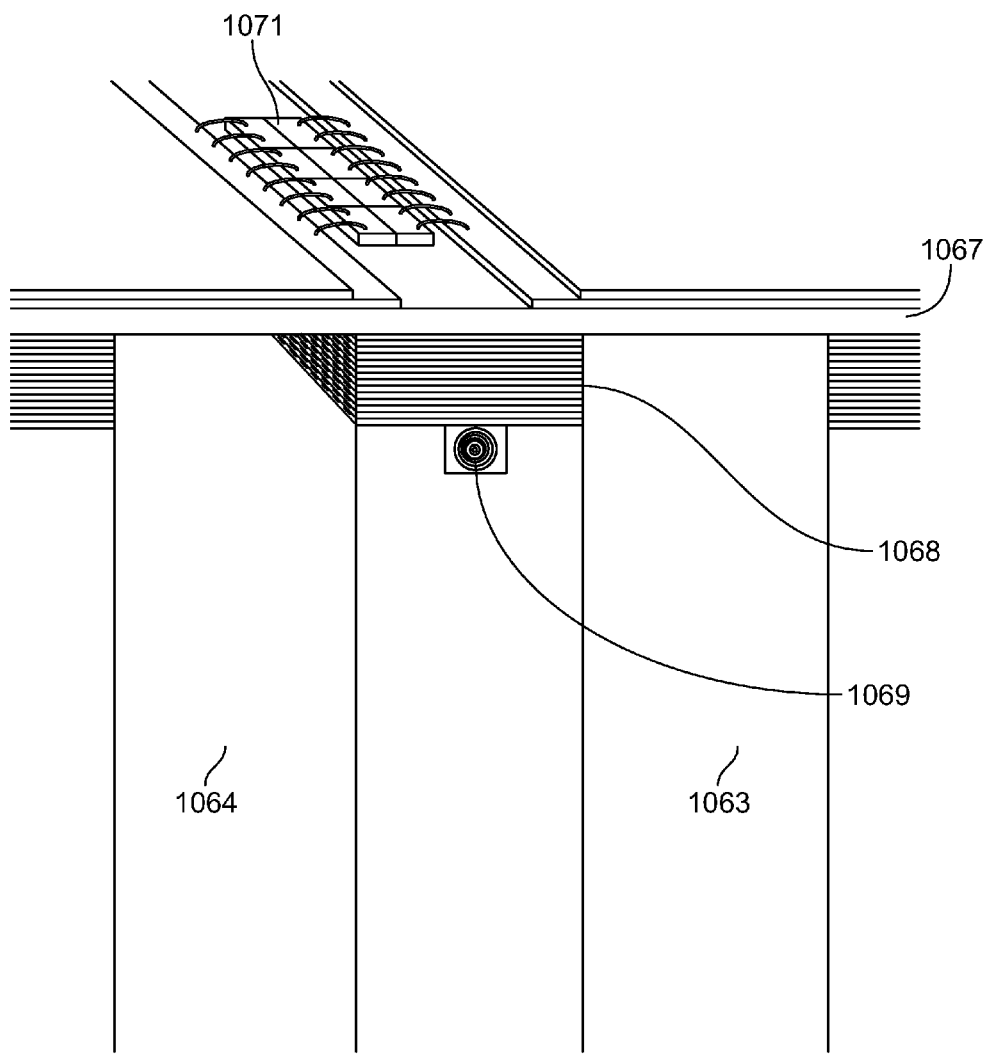
FIG. 10F is a magnified isometric cut-away view of the UV LED lamp head module of FIG. 10E.
Figure 10G:
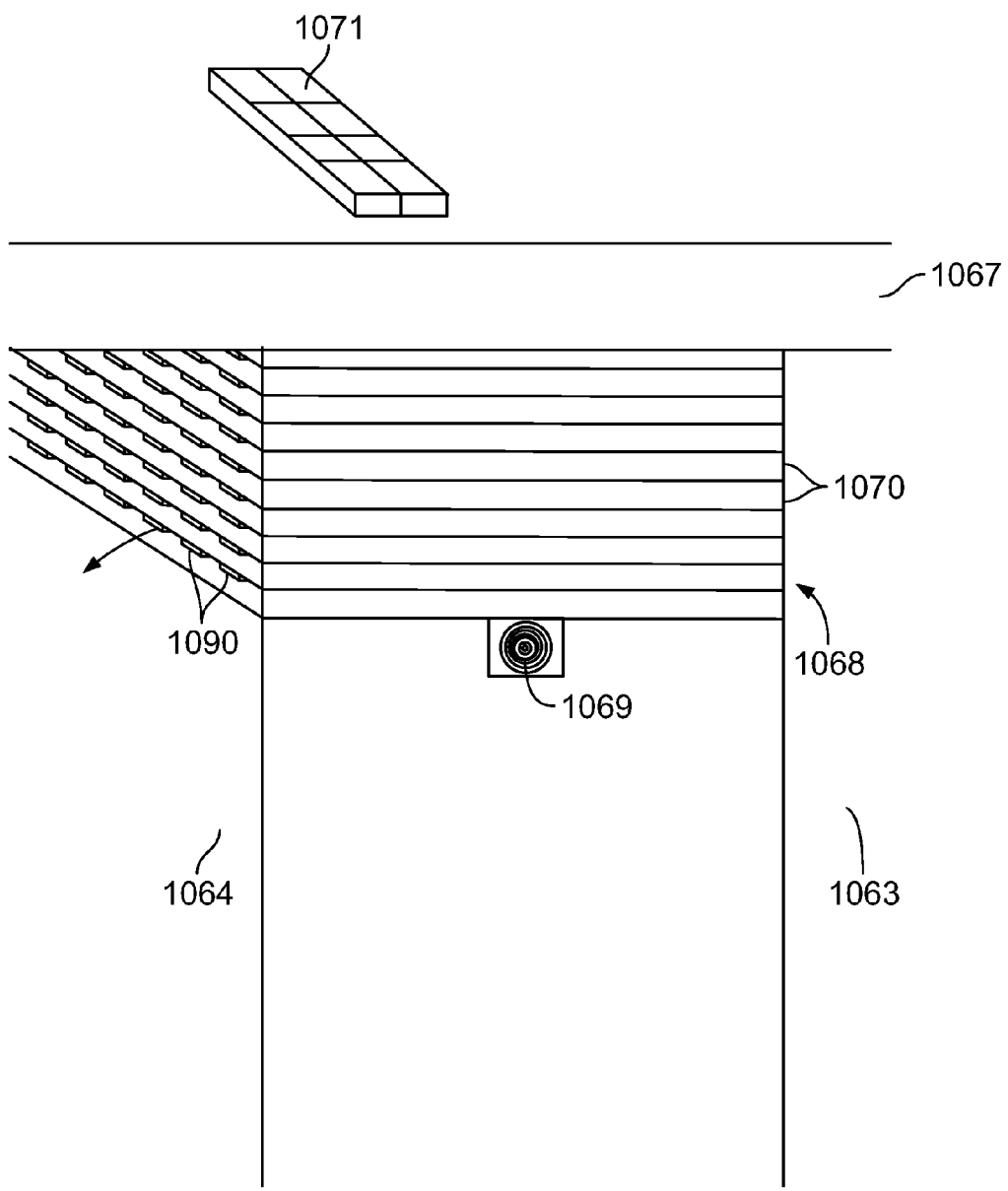
FIG. 10G is a further magnified isometric cut-away view of the UV LED lamp head module of FIG. 10E.

Turning now to FIGS. 10E-G yet another alternative embodiment of a UV LED lamp head module 1000 is now described. According to the present example, a "t"-shaped micro-channel cooler assembly (1068 and 1067) is shown, supported by optional outer foil layer areas 1075 and 1076. In one embodiment, the micro-channel cooler 1068, the heat spreader layer 1067 and outer foil layer areas 1075 and 1076 form a replaceable monolithic micro-channel cooler assembly.

According to the present example, a copper anode substrate (which could be considered a thick foil layer) is provided by the "t"-shaped micro-channel cooler assembly 1067 and 1068, which is diffusion bonded to lateral (lying flat) sheets of copper/alumina with etched micro-channels 1090 to make a single monolithic high thermal conductivity part.

In this example, the top of the "t" is the heat spreader layer 1067 and the vertical part of the "t" are the stacks of foil 1068 with etched channels. The two parts of the "t" are preferably diffusion bonded together after, or possibly in conjunction with, the bonding of the foil layers 1070. In this instance, a multi-plane seal (similar to the single-plane seal provided by o-rings 420*a-c*) may need to be considered, with a section under the etched foil layers (near the previously mentioned o-rings) that prevents bypass being in a different plane as the peripheral regions around the bottom of the heat spreader plate that prevent the flow of liquid to the surrounding outside environment. One could construct a mating lamp body to accommodate these features and construction. A difficulty may arise in preventing fluid bypass around the ends of the vertical "t" portion consisting of the etched foil diffusion bonded layers and lamp body 1062 that may contain a main coolant inlet channel 1063 and a main coolant outlet channel 1064. This is to say that fluid could potentially, without another means of sealing this region, flow from one channel 1063 to the other 1064 without going through the micro-channels 1090. This could be prevented by having the seal run vertically in the portion at either end of the foil stack, or perhaps glue or solder could be considered. The vertical stack of foiled could be diffusion bonded, brazed, glued or soldered to the bottom of the heat spreader layer as well. There could be an intermediate layer between the lamp body 1062 and the heat spreader layer 1067 that runs around the periphery of the area between the lamp body 1062 and the heat spreader layer 1067 that has a z-axis height that is substantially the same height as the vertical t-portion consisting of the stacked etched foil micro-channel layers 1068.

In this example, main coolant inlet channel 1063 and main coolant outlet channel 1064 run parallel to the high aspect ratio long axis length of the LED array 1071 (which is bonded to the copper anode substrate with an optional intermediate heat spreader layer 1067). In one embodiment, coolant inlet and outlet tubes 1080 are provided at opposite ends of the parallel but opposing main channels 1063 and 1064, thereby creating a manifolding arrangement wherein the micro-channels 1090 have substantially uniform coolant flow.

Monolithic anodic bodies 1061*a-b* are attached to the lamp body 1062 with polymer bolts clamping the separate cathodic bus bars 1060*a-b* to the anodic bodies 1061*a-b* with the cathode flex circuit foil bonded to the anode substrate (1068 and 1067) pinched in between. This pinching also compresses the o-ring 1069, and prevents coolant bypass, as well as coolant leakage to the outside environment.

The monolithic anode bodies 1061*a-b* directly oppose each other and are attached, and in thermal communication, to the sides of lamp body 1062, parallel to the main inlet and outlet flow channels 1063 and 1064, and perpendicular to, and in electrical communication with the copper anode substrate 1068 and 1067, that is itself clamped between the anode bodies 1061*a-b* and the cathode bus bars 1060*a-b* by polymer bolts. This configuration provides extremely low thermal resistance and its inherent isothermal nature, combine to allow a practical means for operating a high fill-factor, high density, high power, and high brightness UV LED array in a practical manner.

The heat spreader substrate 1067 could in itself be considered a foil layer. One may allow heat spreading to take place simply in the distances between the layers and/or between the etched channels. It should be noted that the vertical orientation of the layers can provide lower thermal resistance, but has differing ease of assembly and apparatus functionality. Squiggles, or bends, or "gull-wings" in the channels and in, or with interconnecting channels, may be advantageously considered, as may etched protuberances or varying widths and depths of channels for the purpose of turbulence generation or boundary layer compression. It is preferable to have the substrate (a/k/a heat-spreader, if one is indeed employed) strike a balance between spreading thermal energy, yet not being so thick that it adds substantially to the overall thermal resistance between the LED junction and the flowing coolant. Also, it should not be so thin as to be mechanically flexed by the internal pressure or turbulence of the flowing coolant, hence, it is reasonable to make the substrate about 125 um to 250 um thick, range of 10-1000 um, and to have about 8-16 foil layers, range 1-100, that are about 25-50 um thick, range 1-500 um, and have channel etched depth of about 12.5-25 um, range 1-500 um, and center-to-centers of about 30-60 um, range 1-1000 um, and finally a channel length of about 4000-4300 um, range 1-100000 um. The coolers may be plated internally or externally for the purpose of erosion, biofouling, corrosion, and/or electrical impedance reduction. Internal coating should generally be avoided as they can flake off later and deleteriously impact cooler lifetime. The foil layers could be made of a material such as nickel that is more erosion resistant, and/or the could be coated with a ceramic or metal in a conformal coating process such as ALD, preferably post diffusion bonding. It should be noted that it is common to pre-plate the layers with nickel prior to diffusion bonding. A micron, or sub-micron range filter can be employed either up or downstream or both from the cooler, and a deep UV C light source, such as a lamp or LED, could be employed for the purpose of the reduction of bio-fouling. Preferably 0.1-15 micron filters may be employed from 3M, USA, and/or membrane contractors from Membrana, USA that are very effective at removing carbon dioxide, which can have a deleterious effect on the pH of the cooling fluid and increase corrosion.

Figure 11A:
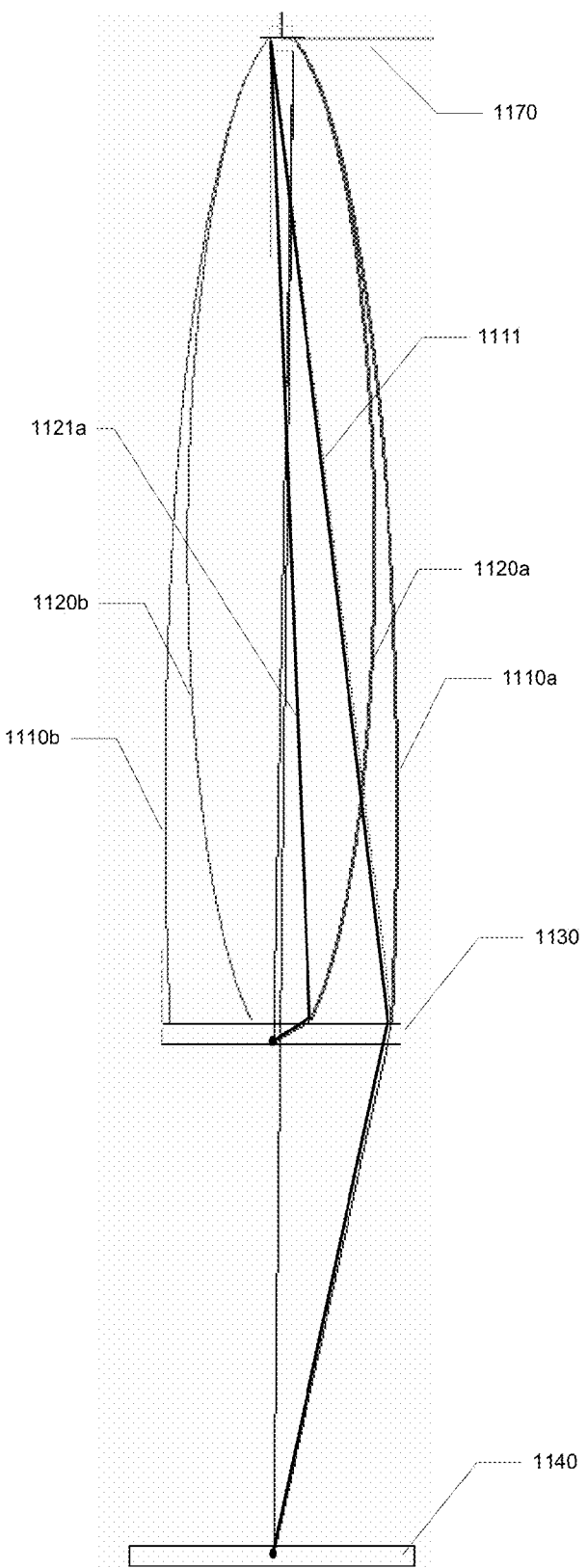
FIG. 11A conceptually illustrates two macro-reflectors of substantially the same height for different working distances in accordance with an embodiment of the present invention.

FIG. 11A conceptually illustrates a cross-section of two macro-reflectors 1110*a-b* and 1120*a-b* superimposed on top of each other in accordance with an embodiment of the present invention. In this example, the macro-reflectors 1110*a-b* and 1120*a-b* have substantially the same external height and width but are optimized for different working distances. Having a single deep trough macro reflector length and then having differing internal curved surfaces for differing focuses is efficient from a manufacturing standpoint as only a single outer mold is needed and differing curves are simply differing mold inserts.

In the present example, macro-reflector 1110*a-b* is optimized for a 53 mm focal plane 1140 and macro-reflector 1120*a-b* is optimized for a 2 mm focal plane 1130. Each curved portion shown is a mirror image of the other (assuming they have the same focal length) and represent a portion of a complete ellipse, parabola and/or a combination of the two. A parabola is a special case of an ellipse and would generally be used for collimating light.

An ellipse has two focuses, a primary focus and a secondary focus. In the current example, the primary focus is in the LED plane 1170 and the secondary focus is in the work piece plane 1130 or 1140.

In various embodiments of the present invention, marginal ray 1111 (representing the first ray captured by reflector 1110*a*) and the last ray (not shown) captured by reflector 1110*a* and exiting an LED array define an angular extent 1150 of approximately between 60 to 89 degrees and preferably 80 to 85 degrees, thereby exemplifying (using a simplistic 2-dimensional analysis) that the 53 mm macro-reflector 1110*a-b* controls more than approximately 80% of the photons that leave the LED array. In fact, 3-dimensional computer analysis suggests such a deep trough reflector design (when end caps (e.g., end caps 207*a-b*) are in place) controls over 90% of the photons that leave the LED array. The larger the angular extent the greater control over the photons that exit the LEDs. Therefore, angular extent can be increased, but practical considerations for reflector sizes (lengths and widths) need to be taken into consideration.

Figure 11B:
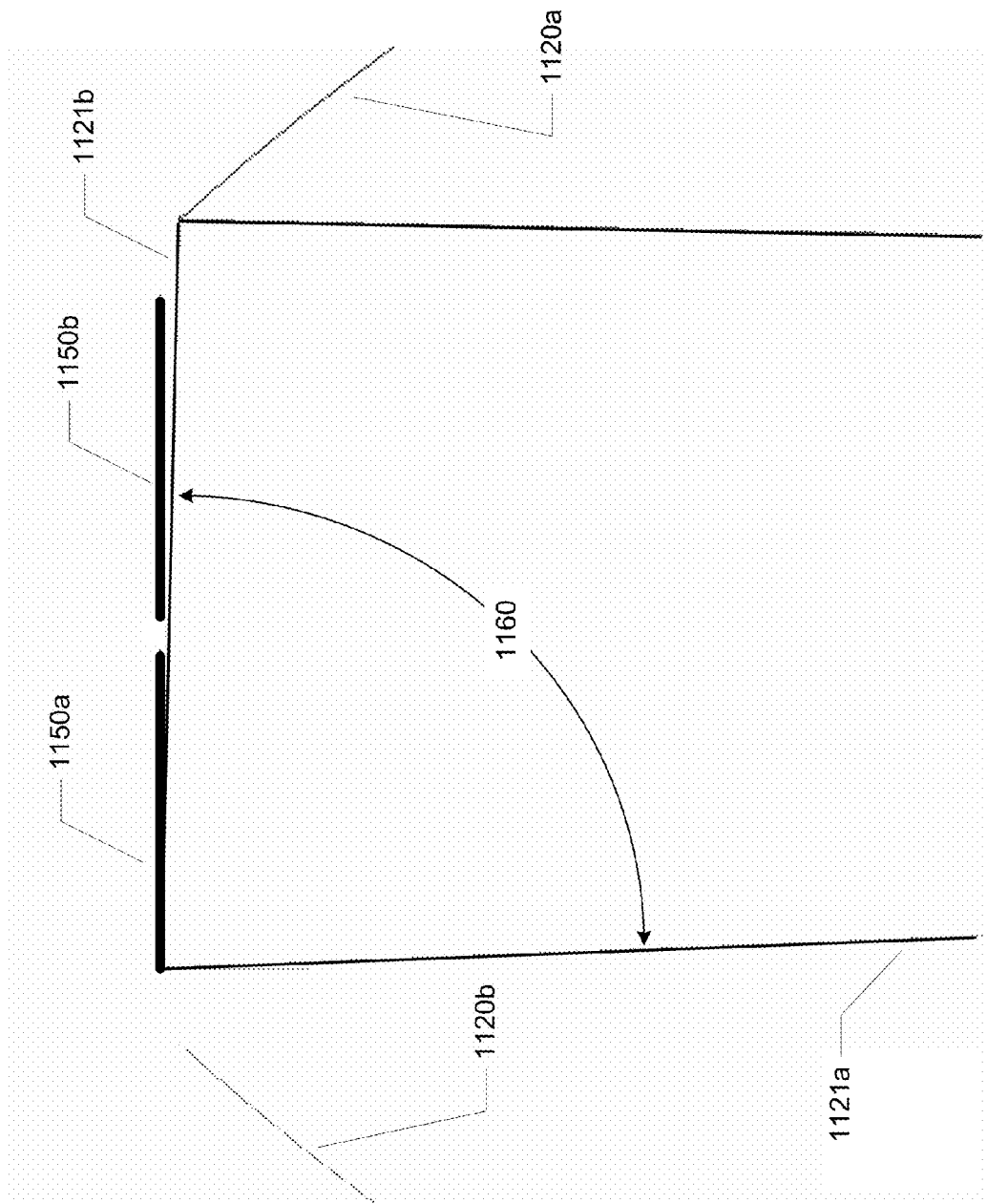
FIG. 11B is a magnified view of FIG. 11A illustrating marginal rays for a 2 mm macro-reflector in accordance with an embodiment of the present invention.

With reference to FIG. 11B it can be seen that marginal rays 1121*a-b* (representing the first ray captured by reflector 1120*a* and the last ray captured by reflector 1120*a*, respectively) exiting LEDs 1150*a* and 1150*b* and reflecting off reflector 1120*a* define an angular extent 1160 of approximately between 65 to 89 degrees and preferably 82 to 87 degrees, thereby exemplifying (using a simplistic 2-dimensional analysis) that the 2 mm macro-reflector 1120*a-b* controls more than 82% of the photons that leave the LED array in accordance with an embodiment of the present invention. In fact, 3-dimensional computer analysis suggests such a deep trough reflector design (when end caps (e.g., end caps 207*a-b*) are in place) controls over 96% of the photons that leave the LED array.

Figure 12:
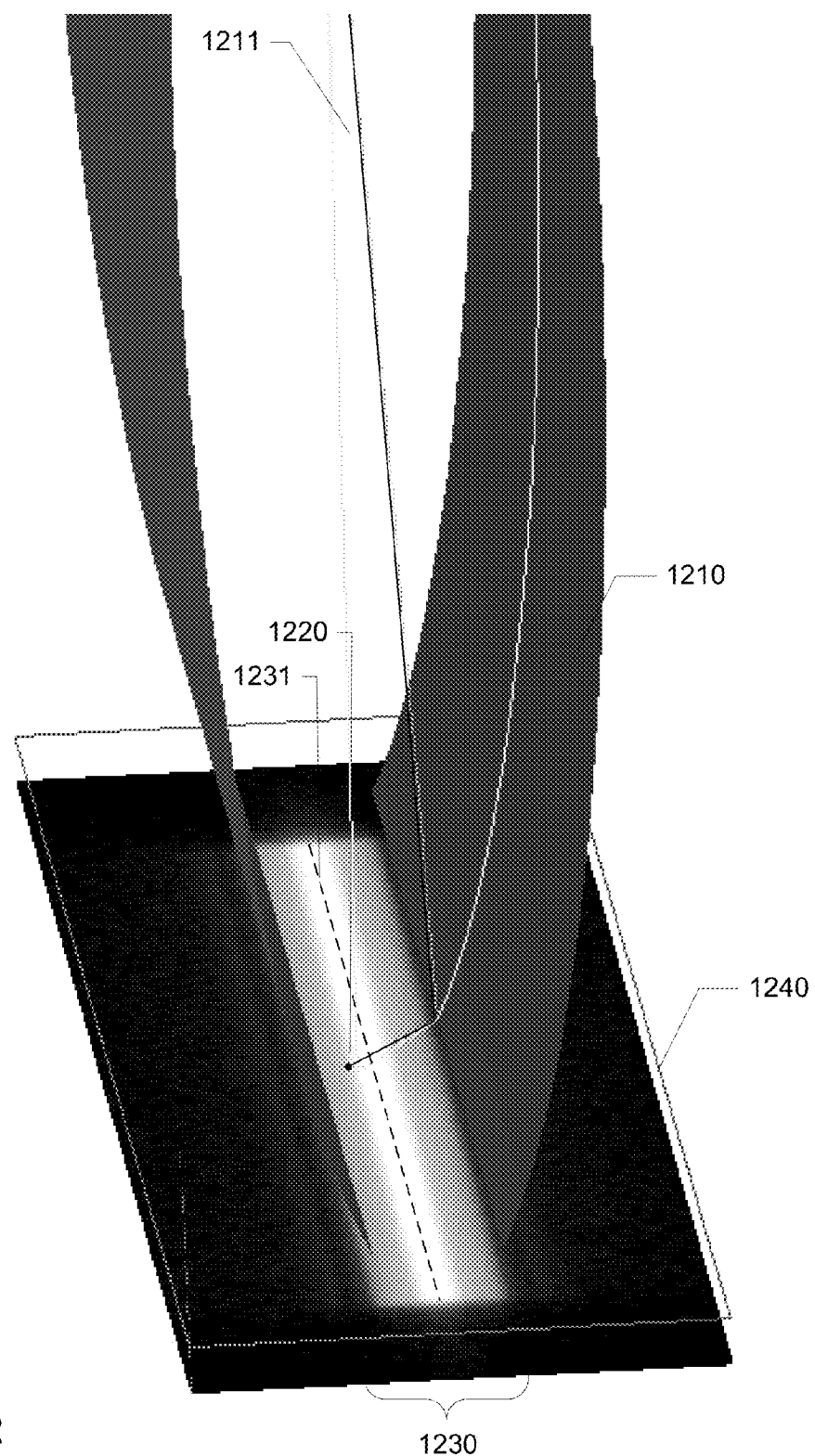
FIG. 12 shows a macro-reflector optimized for a 2 mm focal plane in which each side of the reflector has a focal point that is offset from the centerline of the focused beam on the work piece in accordance with an embodiment of the present invention.

FIG. 12 shows a portion of macro-reflector 1210 optimized for a 2 mm focal plane 1240 in which each side of the reflector has a focal point 1220 that is offset from a centerline 1231 of a focused beam 1230 (having a total pattern width of approximately 7 mm and a high irradiance center portion of approximately 0.65 cm) on a work piece (not shown) in accordance with an embodiment of the present invention. As depicted in the drawing, in such a configuration, reflected light rays from the right-hand side reflector move from the left of the centerline 1231 inward toward the center and reflected light rays from the left-hand side reflector move from the right of the centerline 1231 inward toward the center. In this manner, the two sets of reflected light rays overlap to create the high irradiance beam 1230. Computer modeling indicates about a 10% higher irradiance level than if the two sets of reflected light rays did not overlap. Notably, in one embodiment, at longer focal planes distances (e.g., ~53 mm), there is no significant loss (less than 5%) of irradiance at planes+/−3 mm from the focal point.

Figure 13:
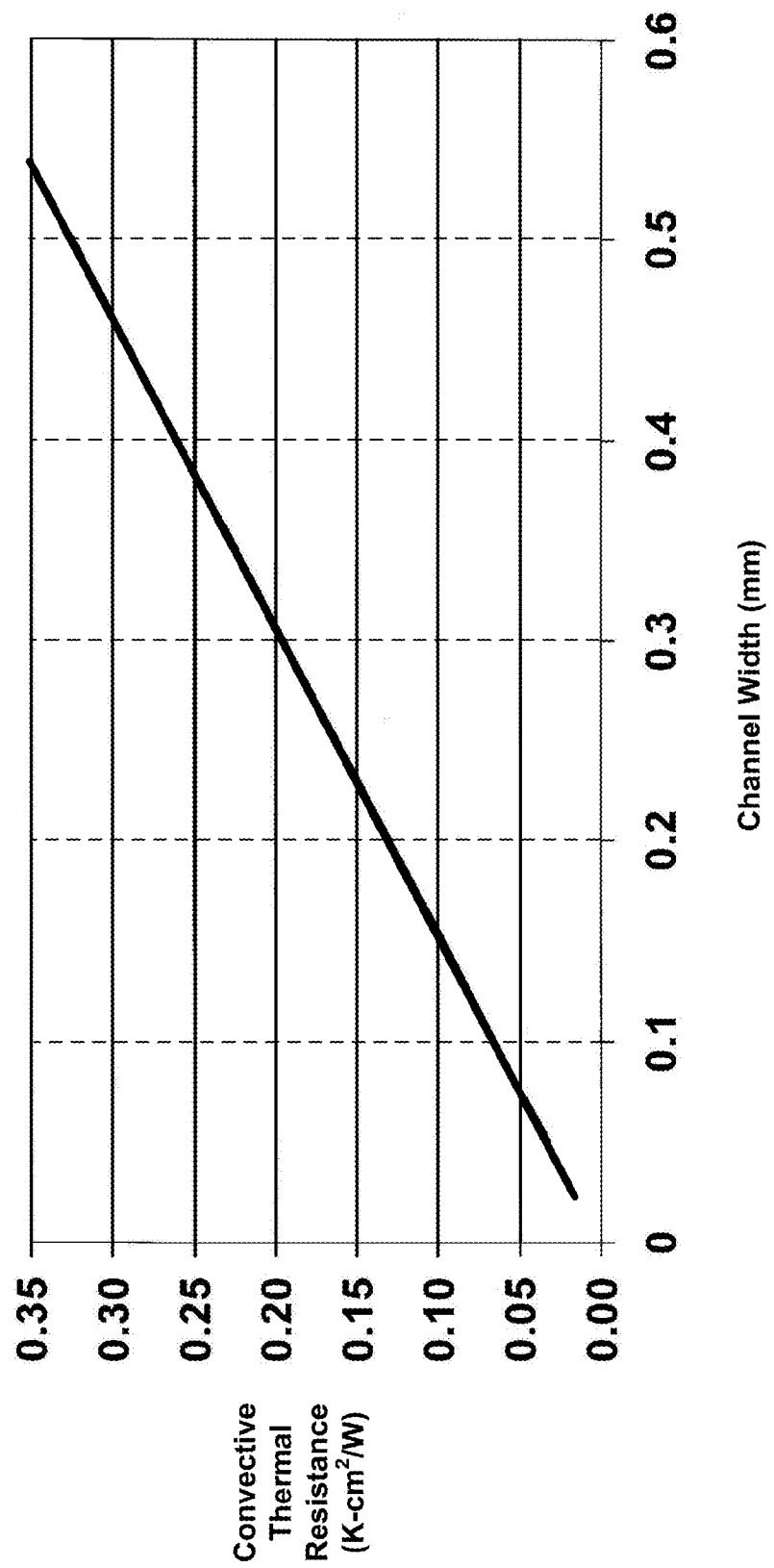
FIG. 13 is a graph illustrating estimated convective thermal resistance for various channel widths.

FIG. 13 is a graph illustrating estimated convective thermal resistance for various channel widths. This figure graphically depicts the linear decrease in thermal resistance with decreasing width of individual micro-channels. Of note is the fact that embodiments of the present invention usually use channels having widths of less than 0.1 mm, and often 0.05 mm, 0.025 mm or less. This is contrasted with the width of channels used in prior art UV LED lamp devices, such as those manufactured by Phoeseon (USA) and Integration Technology (UK), which are believed to use macro-channels on the order of 0.5 mm or larger. Meanwhile, such prior art UV LED lamp devices also suffer from high contact resistances at the point at which the LED array is attached to a separate cooler. They also suffer from the high bulk thermal resistance of the substrate that the LED array is attached to.

As can be seen from the graph, all else being equal, the order of magnitude decrease in thermal resistance from a 0.55 mm channel to a 0.025 mm channel would in and of itself result in an order of magnitude decrease in LED junction temperature. However, all else is not equal. As currently understood by the inventors, the prior art has only one thermally-related factor working in its favor. This factor being the use of a low brightness, low fill-factor (LED packing density) array, which spreads out the heat sources and results in a low thermal density, which requires a correspondingly lower heat transfer coefficient for the same junction temperature.

Working against prior art UV LED curing systems, however, is the fact that they typically employ a series/parallel LED arrangement which results in the need for a thermally resistive dielectric layer between the chip bond pad and the substrate. It should be noted that even if a high thermal conductivity (expensive) dielectric, such as DLC, was used, there still is additional contact resistance at both interfaces, which often exceeds the bulk thermal resistance of the dielectric. Secondly, Phoseon uses a silicon substrate which has less than half the thermal conductivity of copper. To our knowledge, Phoseon also then bonds this silicon substrate to a copper heat exchanger creating even more thermal resistance. In fact, all of these thermal resistances add up to a point where even if a micro-channel cooler were to be used in such an environment, the benefits of the micro-channel cooler's lower thermal resistance would be seriously compromised. As for Integration Technology (whose LED arrays are currently produced by Enfis Group PLC, UK), their technology at least does not use a silicon substrate, perhaps an AlN substrate (about half the thermal conductivity of copper) or they might use a thick (e.g., approximately 1 mm) copper substrate. A DLC dielectric layer could have a very small, but quantifiable benefit as DLC has high bulk thermal conductivity, but the layer is so thin and the contact resistances are so great so as to overwhelm the benefits gained by the very high bulk thermal conductivity of DLC. Hence, prior art UV LED systems suffer a seriously high thermal resistance compared to embodiments of the present invention in which no bond pad, trace and dielectric thermal resistance degradation issues are created owing to the fact that no bond pad, trace and dielectric is used between the LED(s) (e.g., LED 531) and substrate (e.g., common anode substrate 317) nor required due to the purely parallel LED electrical arrangement. Additionally, embodiments of the present invention minimize bulk thermal resistance loss through the copper substrate due to the minimal (usually about 125 um (range 5-5,000 um)) thickness between the bottom surface of the LEDs and the heat transfer passages (micro-channels) no extra interfacial resistances from bond pad layers. The higher voltage of electrically-seriesed LEDs can lead to some AC/DC conversion efficiencies and cable resistance reductions (for a given cable diameter).

Figure 14:
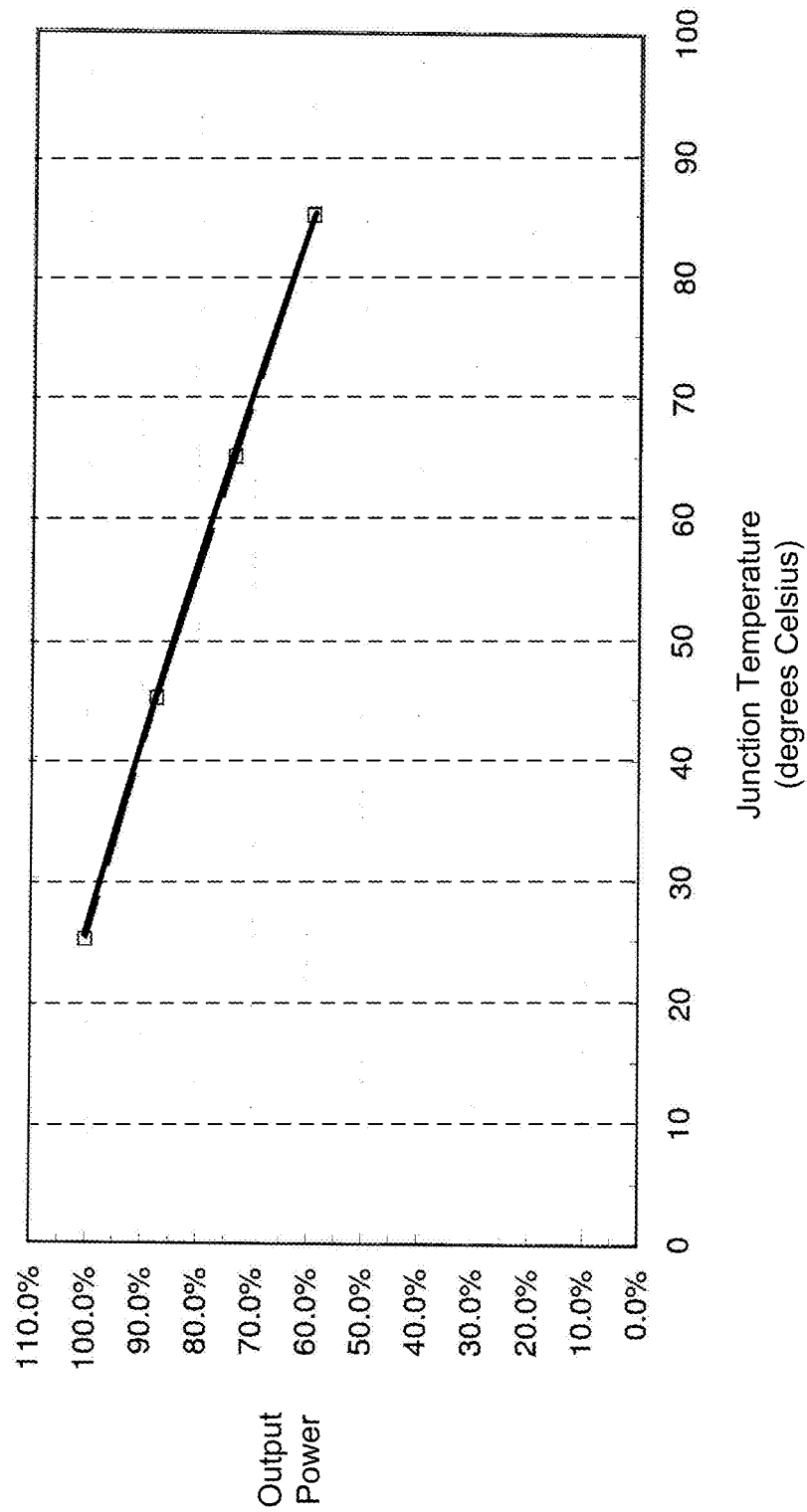
FIG. 14 is a graph illustrating output power for various junction temperatures.

FIG. 14 is a graph illustrating output power for various junction temperatures. This figure shows the severe drop off in UV LED efficiency with increasing junction temperature. A drop of inefficiency of 40% is noted with a junction temperature increase from 20 to 88 degrees C. UV LEDs are much more sensitive to heat than some longer wavelength blue and green LEDs. Hence, it is desirable to use superior thermal management in order to keep the junction temperatures low to achieve both long life and maintain a reasonable efficiency.

In accordance with embodiments of the present invention, LED junction temperatures of approximately 40-45 degrees C. are obtained, even when operating at current densities of over 2.5 A/mm$^2$, and sometimes over 3 A/mm$^2$. This may be contrasted with the UV LED lamp heads of Phoseon and Integration Technology that probably operate at current densities of less than 1.5 A/mm$^2$, with LEDs spaced much further apart (low fill-factor/low packing density), which of course leads to lower peak irradiance and lower total energy delivered to the work piece.

Figure 15:
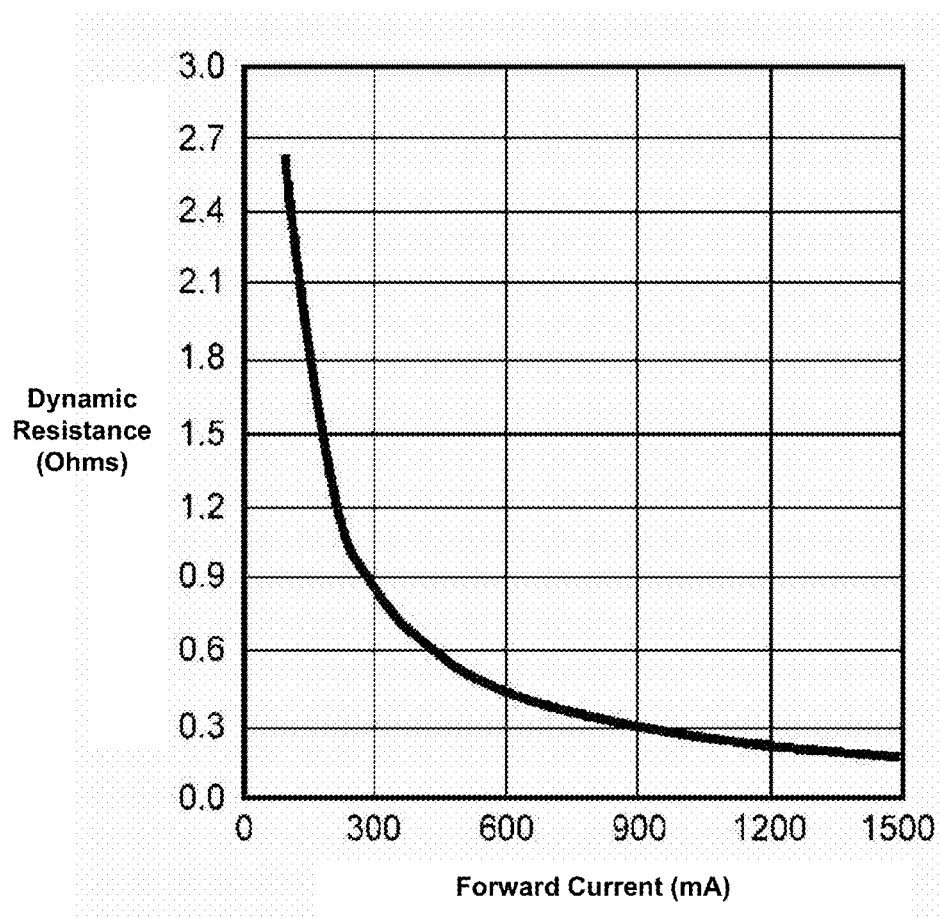
FIG. 15 is a graph illustrating a dynamic resistance vs. forward current curve.

FIG. 15 is a graph illustrating a dynamic resistance vs. forward current curve for a typical LED on a typical heat sink. It is to be noted how the dynamic resistance approaches an asymptote as the current approaches 1500 mA. This is illustrative of several factors, including the deleterious impact of a temperature difference between any two LEDs in an electrically-paralleled LED array. Since a negative temperature coefficient of electrical resistance is inherent to LEDs, the graph shows that just a small change in (dynamic) resistance can have a large affect on current. Therefore, it is desirable to create a substantially isothermal substrate upon which the LEDs may be mounted. For example, the LEDs may be mounted on a substrate that has low thermal resistance (as well as mounted with low thermal resistance direct soldering technique), high thermal conductivity, high heat transfer coefficient (10,000-35,000 W/m$^2$K), and high thermal diffusivity (thermal conductivity divided by heat capacity) in order to create a nearly isothermal condition between substantially all of the paralleled LED junctions.

A micro-channel cooler with a short thermal diffusion length (e.g., approximately 125 microns) between the LED(s) and the coolant channels (heat transfer channels) ideally meets these conditions. Thermal diffusivity is a measure of the rate at which a temperature disturbance at one point in a body travels to another point. By way of analogy, by rapidly diffusing a temperature rise that exists in one LED and rapidly transferring this energy to its surroundings, keeps all of the LEDs essentially isothermal. In reality, "essentially", is a relative term, as the upstream LEDs (near where the coolant enters the lamp body, as well as nearest where the coolant enters the heat transfer channels) may be at some small to infinitesimally small lower temperature as a result of the design of the micro-channel cooler employed. In one embodiment, heat transfer channels of the micro-channel cooler are designed so that the passages are in thermal parallel (i.e., there is essentially no temperature difference between the LEDs as the coolant flows under the (e.g., 2 rows of) LEDs in parallel not series. As such, there is less likely to be a temperature difference.

However, to the extent that there is a difference in Vf and output power within a bin of LEDs, such differences can be dealt with via a unique element of embodiments of the present invention in that the whole upstream bank (row) of LEDs, as well as each segment of the upstream row, can be individually addressed. Therefore, LEDs with a pretested higher/lower Vf (impedance) and/or higher/lower output power can be strategically placed near the higher/lower temperature coolant exit/entrance areas (whether they be primary coolant inlets/outlets 360 and 316 or internal micro-channels). Also, LEDs with varying operating characteristics, including, but not limited to Vf, wavelength, optical power and the like can be employed.

According to one embodiment, LED driver PCB 310 does not work on dynamic resistance, nor voltage, but current. The current-mode operation measures current and through (e.g., tiny 0.005 Ohm) resistors amplifies, measures and feeds that current information back into the control loop. The current ripple is designed to be a maximum of (e.g., 10%) full load, or 0.3 A if operated at 3 A per LED. This maximum ripple is worst case, as it does not include the output capacitors which will further reduce the ripple.

Dynamic resistance is simply Vf/If. For example, if Vf is 4.5V at 3 A, it is 1.5 Ohms per LED. Since resistances divide in parallel, one can divide 1.5 Ohms by (e.g., 17 LEDs) to get (e.g., 88 mOhms) dynamic resistance at 51 A for the whole driver. In one embodiment, and as described further below, each segment has its own driver IC(s), each driver segment can drive accurate currents even in short, meaning we can short the output, driving at 51 A and the voltage across the short will be zero. The driver does not differentiate among output voltages, it just maintains the current at which it is set. If opened, the output will go to the input voltage of (e.g., 12V). If shorted, it will go to somewhere very close to zero volts. The LEDs are somewhere in-between the range of about (e.g., 4-4.5V). K factor is the change in Vf divided by the change in junction temperature of an LED. K factors may be considered in connection with designing UV LED lamp head modules. Smaller K factors indicate a lower thermal resistance package.

With respect to individual LEDs, the exceptionally low thermal resistance in the range of approximately 0.05 K-cm$^2$/W to 0.01 K-cm$^2$/W and preferably approximately 0.020 K-cm$^2$/W or less helps; however, binning is still helpful. An individual LED with a lower natural dynamic resistance will draw more current/heat than its neighbors, if it heats more, then its resistance decreases and it runs away—meaning that the cycle continues until the LED burns itself out (opening). Low thermal resistance keeps all of the LEDs thermally monolithic (isothermal), which keeps the dynamic resistance delta low and dramatically reduces the chance of run-away. With a low-enough thermal resistance (e.g., in the range of approximately 0.05 K-cm$^2$/W to 0.005 K-cm$^2$/W), one could consider each of the parallel and closely binned groups of LEDs as one. The tighter the Vf binning (i.e., 0.01, 0.001, 0.0001V), the less likely it is for any given LED in a bin to run at a high enough output power (owing to its disproportionate current draw) to shorten its lifetime relative to other LEDs in the same bin.

The asymptotic nature of dynamic resistance is the same as the asymptote of Vf. The harder the LED bank is driven, it requires exponentially less change in voltage to affect the drive current. In LEDs driven with a voltage-mode driver, when Vf decreases because of temperature there would be an exponential change in current and a runaway could ensue if the voltage was not pulled back. However, because in various embodiments of the present invention, LED driver PCBs 310 are constant current-mode drivers, voltage (and therefore resistance) does not matter.

Figure 16:
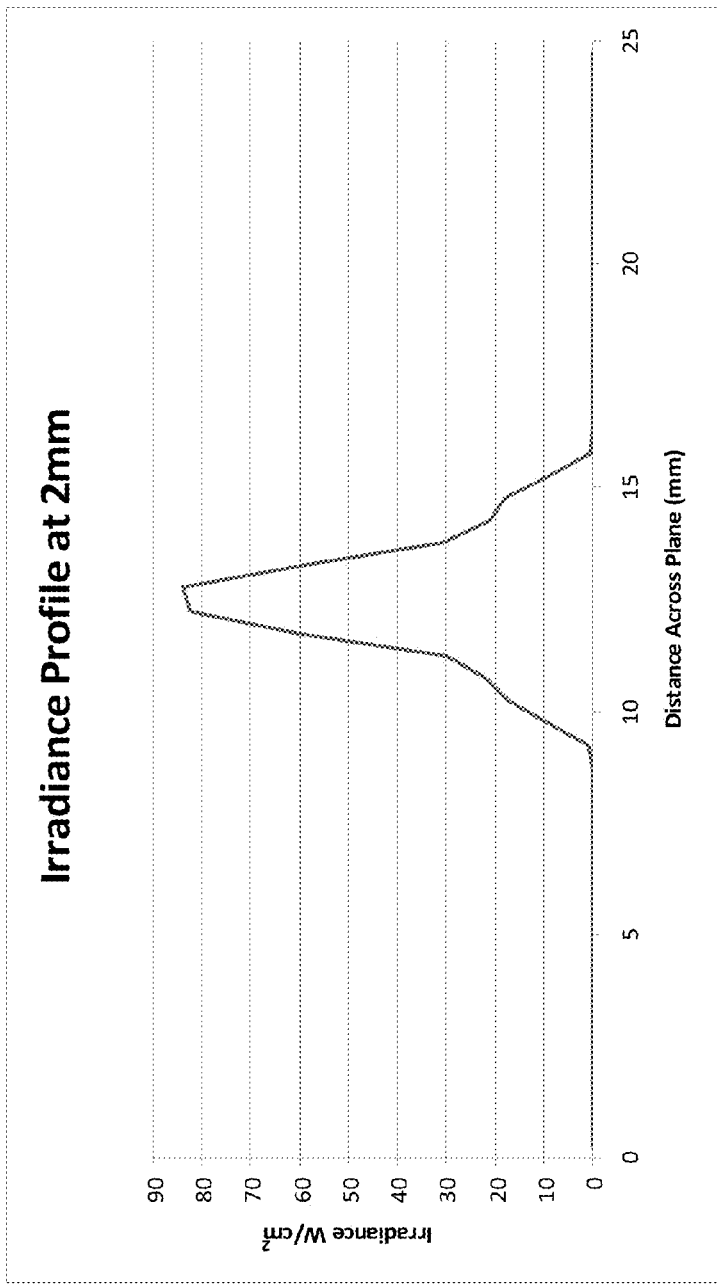
FIG. 16 is a graph illustrating an irradiance profile for a UV LED lamp head with a reflector optimized for a 2 mm focal plane in accordance with an embodiment of the present invention.

FIG. 16 is a graph illustrating an irradiance profile for a UV LED lamp head with a reflector optimized for a 2 mm focal plane in accordance with an embodiment of the present invention. According to the present example, maximum (peak) irradiance of approximately 84.8 W/cm$^2$ is achieved with an output beam pattern width of approximately 0.65 cm and producing an average irradiance across the width of the output beam pattern of approximately 31.6 W/cm$^2$ and total output power of approximately 20.5 W per cm of output beam pattern length. This example was generated with a computer model assuming the use of SemiLEDs' ~1.07×1.07 mm LEDs, with each LED producing 300 mW output at 350 mA. It is to be noted that embodiments of the present invention could run each LED at higher current (e.g., approximately 2.5 A) at approximately 0.75 W to 1.25 W.

Figure 17:
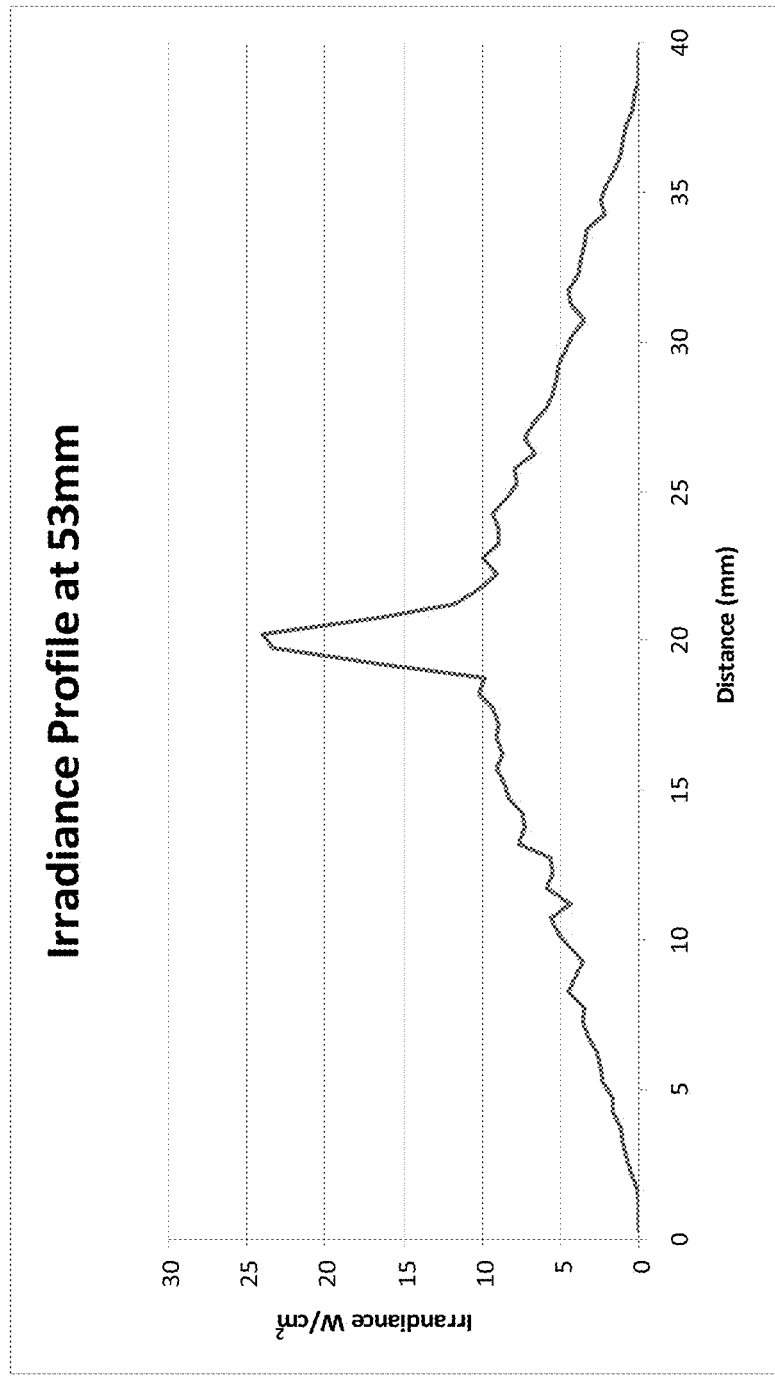
FIG. 17 is a graph illustrating an irradiance profile for a UV LED lamp head with a reflector optimized for a 53 mm focal plane in accordance with an embodiment of the present invention.

FIG. 17 is a graph illustrating an irradiance profile for a UV LED lamp head with a reflector optimized for a 53 mm focal plane in accordance with an embodiment of the present invention. According to the present example, maximum (peak) irradiance of approximately 24 W/cm$^2$ is achieved with an output beam pattern width of approximately 3.65 cm and producing an average irradiance across the width of the output beam pattern of approximately 5.9 W/cm$^2$ and total output power of approximately 21.7 W per cm of output beam pattern length. This example was generated with a computer model assuming the use of SemiLEDs' ~1.07×1.07 mm LEDs, with each LED producing 300 mW output at 350 mA. It is to be noted that embodiments of the present invention could run each LED at higher current (e.g., approximately 2.5 A) at approximately 0.75 W to 1.25 W.

According to one embodiment, in which LED drivers are integrated within the UV LED lamp head module, off the shelf AC/DC power supplies designed for high volume "server farms" may be used. Exemplary front end supplies are available from Lineage Power USA model CAR2512FP series 2500 W power supplies. Preferable supplies are Power-One LPS100 12V 1100 W single fan server supplies that are highly efficient platinum rated front-end AC/DC power supplies that have power factor correction, may be in electrical parallel, and have a GUI i2C interface, the Lineage power supplies are available with a subsystem that incorporates four of these units off-the-shelf (OTS). In 2011 these Lineage units will be similar but with conduction cooling (without fans).

According to embodiments of the present invention, in addition to cooling the integrated drivers, the coolant water may also be advantageously employed to cool these power supplies simply by running the coolant line through a heat sink in communication with the elements (or the base plate) of the supply that need cooling. It is optimal to derate these Lineage supplies as they are more efficient at a percentage of their maximum power. By way of a non-limiting example, running each PCB with ~15 drivers at ~40 amps and ~4-5 volts one would use about 60% of the ~10000 W available. It is optimal to design for ~50 A or greater and ~5.5 V to have some headroom now and into the future when the preferably ~16 LEDs that are around ~1000-1200 um square on each of all four sides (though they could be of any size and shape such as rectangular, or larger size such as ~2000 um or ~4000 um or larger per side) are desired to be operated at a current of ~3 A per LED or ~48 per group solely by way of a non-limiting example. In one embodiment, the cathode bus bars 313*a-b* on each PCB 310*a-b* near the backside of the lamp body 305 could run nearly the length of the preferably ~300 mm long board (not shown) as well as solder pads running nearly the length of the PCB. In one embodiment, the cathode cross plate 375 represents a tie bar affixed across cathode bus bars 313*a-b* which provides an effective attach point for the preferably single main cathode wire 205 going from the UV LED lamp head module 200 to the AC/DC power supplies preferably in somewhat similar fashion to the preferable single main large AWG range ~1-10 and preferably ~2 AWG core anode wire going from the preferably constant current (CC) DC PCB boards of the UV LED lamp head module 200 to the supplies that are preferably connected to the AC mains to give a highly efficient power source to the LEDs with low ripple preferably less than 10% to maximize LED lifetime. On the PCB there may be some shared components of the aforementioned non limiting example of ~15 CC drivers such that there would not be a definitive requirement for ~15 separate components that may not have to have their cathodes isolated. It should again be noted that 1-n cathode and anode cables may feed the lamp with electrical power from 1-n power supplies or mains. It may be preferable to use four Lineage USA 2500 W power supplies per lamp and run them at derated power for efficiency. They are available with a common back end for ~4 power supplies. With or without the back end four separate anodes and cathode wires/cables per lamp may be considered so as to allow the use of smaller diameter cables (methode/cableco, USA) and or large cables and less resistive losses.

In view of the foregoing, it can be seen that embodiments of the present invention are predicated on closely spaced array(s) of LEDs, also known as high fill-factor arrays, so that maximum brightness can be obtained. This is to say that the optical power per unit area per solid angle is maximized, as brightness may be roughly defined as power per unit area per solid angle. This high brightness also correlates nearly linearly with heat flux/thermal demand as the waste heat from the electrical to optical power conversion becomes more dense as the array density increases. Embodiments of the present invention preferably utilize a fill-factor array of LEDs of equal or greater than 90%, but has a range of 30-100%. The application of a high fill-factor array in accordance with embodiments of the present invention lead to an extremely high and dense heat load on the order of 1000 W/cm$^2$ or more, range 100-10,000 W/cm$^2$. This high thermal flux is an artifact of the high brightness, i.e. the LEDs are in very close (1-1000 um) proximity to each other, operated at currents of 2-3 or more amps per square mm, (range 0.1 to 100 A), which results in extremely high heat flux demands, and of course concomitantly requires extremely low thermal resistance cooling technology that combines both a very high degree of cooling (e.g., convective cooling and/or conductive cooling (e.g., thin and high conductivity layers between the LED and flowing gas or liquid)) to achieve junction temperatures that are preferably as low as 40 C or less for long life and efficient operation at extremely high output power.

While embodiments of the invention have been illustrated and described, it will be clear that the invention is not limited to these embodiments only. Numerous modifications, changes, variations, substitutions, and equivalents will be apparent to those skilled in the art, without departing from the spirit and scope of the invention, as described in the claims.

What is claimed is:

1. A lamp head module comprising:
an optical macro-reflector including a window having an outer surface;
an array of light emitting diodes (LEDs) positioned within the optical reflector, the array having a high fill factor and a high aspect ratio operable to provide a high irradiance output beam pattern having a peak irradiance of greater than 25 W/cm$^2$ at a work piece surface at least 1 mm away from the outer surface of the window of the optical reflector, wherein the peak irradiance does not require operation of the array at a pulsed emission duty cycle; and
a micro-channel cooler operable to maintain a substantially isothermal state among p-n junctions of the light emitting devices at a temperature of less than or equal to 80° Celsius, the micro-channel cooler assembly also providing a substrate for the array, wherein a thermally efficient connection is formed between the array and the substrate by mounting the array to the micro-channel cooler wherein deep and long coolant flow channels in fluid communication with the micro-channel cooler serve to balance flow of coolant through the microchannel cooler.

2. The lamp head module of claim 1, wherein the array is directly mounted to the micro-channel cooler.

3. The lamp head module of claim 1, wherein the micro-channel cooler maintains a substantially isothermal state among the p-n junctions at a temperature of substantially less than or equal to 45° Celsius.

4. The lamp head module of claim 1, wherein the LEDs are electrically paralleled.

5. The lamp head module of claim 4, wherein at least one of the LEDs is an ultraviolet emitting LED.

6. The lamp head module of claim 5, wherein an aspect ratio of a width to a length of the array is substantially between approximately 1:2 to 1:100.

7. The lamp head module of claim 6, wherein the aspect ratio is approximately 1:68.

8. The lamp head module of claim 5, wherein the peak irradiance is greater than or equal to 100 W/cm$^2$ and the work piece surface is at least 2 mm away from the outer surface of the window of the optical reflector.

9. The lamp head module of claim 1, wherein a plurality of the LEDs are connected in series.

10. The lamp head module of claim 1, wherein microchannels of the micro-channel cooler that are closest to a bottom surface of the array are in thermal parallel across a shortest dimension of the array.

11. The lamp head module of claim 10, wherein coolant flow through the microchannels is substantially balanced.

12. The lamp head module of claim 1, further comprising a flex-circuit, bonded to the micro-channel cooler, the flex-circuit operable to individually address the LEDs or groups of the LEDs.

13. The lamp head module of claim 1, wherein the micro-channel cooler is clamped between one or more cathode connectors and one or more anode bus bodies to facilitate factory replaceability.

14. The lamp head module of claim 1, further comprising:
a flex-circuit, including a patterned cathode layer, to independently address a plurality of groups of one or more LEDs of the array;
a thermally conductive lamp body having opposing thin outer walls and having formed therein deep and long coolant flow channels in fluid communication with the micro-channel cooler; and wherein the deep and long coolant flow channels serve to balance flow of coolant through the micro-channel cooler.

15. The lamp head module of claim 1, further comprising: integrated LED drivers;
a thermally conductive body; and
wherein the integrated LED drivers comprise a plurality of metal core printed circuit boards (MCPCBs) mounted to opposing sides of the thermally conductive body and wherein the plurality of MCPCBs are conduction cooled through the thermally conductive body.

16. The lamp head module of claim 1, wherein the optical macro-reflector is field replaceable.

17. The lamp head module of claim 1, wherein the optical macro-reflector comprises a right-hand half and a left-hand half each of which represent a portion of an ellipse, each ellipse having two focuses, wherein the two focuses of the right-hand half have corresponding focal points that are offset to the left of a centerline of an intended output beam and the two focuses of the left-hand half have corresponding focal points that are offset to the right of the centerline.

18. The lamp head module of claim 1, wherein a plurality of the light emitting diodes are connected in a series/parallel arrangement.

19. The lamp head module of claim 1, wherein the optical macro-reflector comprises two non-rotationally symmetric, non-transparent halves.

20. A lamp head module comprising:
a high aspect ratio monolithically bonded foil micro-channel cooler substrate layer having a greater length than width wherein deep and long coolant flow channels in fluid communication with the micro-channel cooler serve to balance flow of coolant through the microchannel cooler;
a high aspect ratio light emitting diode array layer having a greater length than width mounted to the micro-channel cooler substrate layer, the light emitting diode array layer having a high fill-factor and comprising a p-n junction layer, wherein the high aspect ratio monolithically bonded foil micro-channel cooler substrate layer has formed therein a plurality of microchannels and those of the plurality of microchannels that are closest to a bottom surface of the high aspect ratio light emitting diode array layer are in thermal parallel across the width of the high aspect ratio light emitting diode array layer;
a flex-circuit layer, including a patterned cathode circuit material layer and a thin dielectric layer, mounted to the micro-channel cooler substrate layer, the cathode circuit material layer separated from the micro-channel cooler substrate layer by the thin dielectric layer, wherein the cathode circuit material layer and the thin dielectric layer combine in thickness to be less than 3× a thickness of the light emitting diode array layer; and
an optical reflector layer to direct photons emitted by said light emitting diode array layer, the optical reflector layer being at least 25× a thickness of the light emitting diode array layer, wherein the thicknesses are measured in a direction substantially perpendicular to the p-n junction layer.

21. The lamp head module of claim 20, wherein the light emitting diode array layer emits incoherent light.

22. The lamp head module of claim 20, wherein the light emitting diode array layer is connected to the cathode circuit material layer via at least one wire, the at least one wire terminating in a connection to the cathode circuit material layer at a point lying between the cathode circuit material layer and a bottom surface of the optical reflector layer.

23. The lamp head module of claim 22, further comprising a spacer layer between the optical reflector layer and the cathode circuit material layer, the spacer layer having a thickness of at least a diameter of the at least one wire.

24. The lamp head module of claim 20, wherein the optical reflector layer comprises a macro-reflector having an entrance aperture and an exit aperture, the entrance aperture being at least as wide as a sum of a width of the light emitting diode array layer plus 2× the diameter of the at least one wire but no more than 3× the sum.

25. The lamp head module of claim 20, wherein the optical reflector layer has a center section that is wider than either the entrance aperture or the exit aperture.

26. The lamp head module of claim 20, wherein the optical reflector layer comprises a macro-reflector having an entrance aperture and an exit aperture, the entrance aperture being at least as wide as a sum of a width of the light emitting device array layer plus 2× the diameter of the at least one wire but no more than 5× the sum.

27. The lamp head module of claim 20, wherein the macro-reflector comprises a right-hand half and a left-hand half each of which represent a portion of an ellipse, each ellipse having two focuses, wherein the two focuses of the right-hand half have corresponding focal points that are offset to the left of a centerline of an intended output beam and the two focuses of the left-hand half have corresponding focal points that are offset to the right of the centerline.

28. The lamp head module of claim 20, wherein:
the optical reflector layer is separated from the micro-channel cooler substrate layer by the flex-circuit layer; and
the flex-circuit layer is less than approximately 3× the thickness of the light emitting diode array layer.

29. The lamp head module of claim 20, further comprising a wire layer and wherein the optical reflector layer is positioned with respect to the light emitting diode array layer such that a bottom surface of the optical reflector layer is between approximately a thickness of the wire layer and 1.5× the thickness of the wire layer above a top surface of the light emitting diode array layer.

30. The lamp head module of claim 20, wherein the light emitting diode array layer is connected to the cathode circuit material layer via at least one electrical conductor, the at least one electrical conductor terminating in a connection to the cathode circuit material layer at a point lying between the cathode circuit material layer and a bottom surface of the optical reflector layer.

31. The lamp head module of claim 30, further comprising a spacer layer between the optical reflector layer and the cathode circuit material layer, the spacer layer having a thickness of at least a thickness of the at least one electrical conductor.

32. The lamp head module of claim 20, wherein the optical reflector layer comprises a macro-reflector having an entrance aperture and an exit aperture, the entrance aperture being at least as wide as a sum of a width of the light emitting device array layer plus 2× the thickness of the at least one electrical conductor but no more than 3× the sum.

33. The lamp head module of claim 20, wherein the optical reflector layer comprises a macro-reflector having an entrance aperture and an exit aperture, the entrance aperture being at least as wide as a sum of a width of the light emitting diode array layer plus 2× the thickness of the at least one electrical conductor but no more than 5× the sum.

34. The lamp head module of claim 20, wherein the macro-reflector comprises a right-hand half and a left-hand half each of which represent a portion of an ellipse, each ellipse having two focuses, wherein the two focuses of the right-hand half have corresponding focal points that are offset to the left of a centerline of an intended output beam and the two focuses of the left-hand half have corresponding focal points that are offset to the right of the centerline.

35. The lamp head module of claim 20, further comprising an electrical conductor layer and wherein the optical reflector layer is positioned with respect to the light emitting diode array layer such that a bottom surface of the optical reflector layer is between approximately a thickness of the electrical conductor layer and 1.5× the thickness of the electrical conductor layer above a top surface of the light emitting diode array layer.

36. A lamp head module comprising:
a package including:
  a high aspect ratio array of light emitting diode (LEDs), the high aspect ratio array having a greater length than width;
  a flex circuit having a segmented cathode layer to which bond pads of the high aspect ratio array are electrically coupled; and
  a high aspect ratio monolithically bonded foil micro-channel cooler having a length that is greater than a width and providing a substrate surface to which the high aspect ratio array is mounted; and
a lamp body having formed therein an input coolant fluid channel and an output coolant fluid channel, wherein coolant fluid flows from the input coolant fluid channel through the micro-channel cooler and to the output coolant fluid channel to remove waste heat from the high aspect ratio array, wherein a length and a width of the input coolant fluid channel and the output coolant fluid channel is substantially similar to the length and the width of the high aspect ratio monolithically bonded foil micro-channel cooler, respectively, and a depth of the input coolant fluid channel and the output coolant fluid channel is at least one third the length of the high aspect ratio monolithically bonded foil micro-channel cooler and wherein the input and output coolant flow channels balance the flow of coolant through the microchannel cooler.

37. An ultraviolet (UV) light emitting diode (LED) curing system comprising:
a plurality of end-to-end serially connected UV LED lamp head modules each including:
  an optical macro-reflector including a window having an outer surface;
  a LED array positioned within the optical reflector, the array having a high fill factor and a high aspect ratio operable to provide a substantially uniform high irradiance output beam pattern having a peak irradiance of greater than 25 W/cm$^2$ at a work piece surface at least 1 mm away from the outer surface of the window of the optical reflector, wherein the peak irradiance does not require operation of the LED array at a pulsed emission duty cycle; and
  a micro-channel cooler assembly operable to maintain a substantially isothermal state among p-n junctions of LED in the LED array at a temperature of less than or equal to 80° Celsius, the microchannel cooler assembly also providing a substrate for the LED array, wherein a thermally efficient electrical connection is formed between the LED array and the substrate by mounting the LED array to the micro-channel cooler assembly wherein deep and long coolant flow channels in fluid communication with the micro-channel cooler serve to balance flow of coolant through the microchannel cooler.

38. A lamp head module comprising:
an array of light emitting diodes (LEDs) having a high fill factor and a high aspect ratio operable to provide a substantially uniform high irradiance output beam along a long-axis of the array, wherein the LEDs include one or more ultraviolet emitting LEDs;
a high-aspect ratio micro-channel cooler assembly, including a micro-channel cooler portion and outer capping layer portions, operable to maintain a substantially isothermal state among p-n junctions of the LEDS, the high-aspect ratio micro-channel cooler assembly also providing a substrate for the array, wherein a thermally efficient electrical connection is formed between the array and the substrate by mounting the array to the high-aspect ratio micro-channel cooler assembly;
wherein a thickness of a heat spreader layer of the micro-channel cooler portion is less than approximately 200 microns;
wherein a width of the micro-channel cooler portion is approximately 1.1 to 1.7 times a width of the array in a shortest dimension of the array and wherein deep and long coolant flow channels in fluid communication with the micro-channel cooler serve to balance flow of coolant through the microchannel cooler.

39. The lamp head module of claim 38, wherein the array is directly mounted to a top surface of the micro-channel cooler portion.

40. The lamp head module of claim 39, wherein a vapor phase oven is used to reflow solder thereby mounting the array to the top surface of the micro-channel cooler portion.

41. The lamp head module of claim 40, wherein the solder is lead-free.

42. The lamp head module of claim 41, wherein a tacky flux is used to tack the LEDs in place prior to placing the high-aspect ratio micro-channel cooler assembly in the vapor phase oven.

43. The lamp head module of claim 38, wherein the thickness of the heat spreader layer is less than or equal to approximately 125 microns.

44. The lamp head module of claim 38, wherein the width of the micro-channel cooler portion is approximately 1.2 times the width of the array.

45. The lamp head module of claim 38, wherein:
the array includes at least one LED in the shortest dimension of the array;
the micro-channel cooler portion includes a plurality of internal channels running in the shortest dimension of the array and substantially directly under a bottom surface of the array; and
each of the LEDs are cooled in thermal parallel.

46. A lamp head module comprising:
a package including:
  a high aspect ratio array of light emitting diodes, wherein the high aspect ratio array has a greater length than width;
  a flex circuit having a segmented cathode layer to which bond pads of the high aspect ratio array are electrically coupled; and
  a high aspect ratio monolithically bonded foil micro-channel cooler having a length that is greater than a width and providing a substrate surface to which the high aspect ratio array is mounted;
a lamp body having formed therein an input coolant fluid channel and an output coolant fluid channel, wherein coolant fluid flows from the input coolant fluid channel through the micro-channel cooler and to the output coolant fluid channel to remove waste heat from the high aspect ratio array, wherein a length and a width of the input coolant fluid channel and the output coolant fluid channel is substantially similar to the length and the width of the high aspect ratio monolithically bonded foil micro-channel cooler, respectively, and a depth of the input coolant fluid channel and the output coolant fluid channel is at least one third the length of the high aspect ratio monolithically bonded foil micro-channel cooler and wherein the input and output coolant flow channels balance the flow of coolant through the microchannel cooler; and wherein the package is affixed to the lamp body.

47. The lamp head module of claim 46, wherein the high aspect ratio array is directly mounted to the substrate surface.

* * * * *